United States Patent
Kawakami et al.

(10) Patent No.: US 9,780,005 B2
(45) Date of Patent: Oct. 3, 2017

(54) METHOD FOR EVALUATING QUALITY OF OXIDE SEMICONDUCTOR THIN FILM AND LAMINATED BODY HAVING PROTECTIVE FILM ON SURFACE OF OXIDE SEMICONDUCTOR THIN FILM, AND METHOD FOR MANAGING QUALITY OF OXIDE SEMICONDUCTOR THIN FILM

(71) Applicant: Kobe Steel, Ltd., Kobe-shi (JP)

(72) Inventors: Nobuyuki Kawakami, Kobe (JP);
Kazushi Hayashi, Kobe (JP);
Toshihiro Kugimiya, Kobe (JP);
Mototaka Ochi, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 15/315,287

(22) PCT Filed: Jul. 6, 2015

(86) PCT No.: PCT/JP2015/069387
§ 371 (c)(1),
(2) Date: Nov. 30, 2016

(87) PCT Pub. No.: WO2016/009868
PCT Pub. Date: Jan. 21, 2016

(65) Prior Publication Data
US 2017/0194218 A1  Jul. 6, 2017

(30) Foreign Application Priority Data
Jul. 16, 2014  (JP) .................................. 2014-146337

(51) Int. Cl.
H01L 21/00  (2006.01)
H01L 21/66  (2006.01)
(Continued)

(52) U.S. Cl.
CPC .............. *H01L 22/12* (2013.01); *H01L 22/14* (2013.01); *H01L 27/1465* (2013.01); *H01L 27/14649* (2013.01); *H01L 29/41733* (2013.01)

(58) Field of Classification Search
None
See application file for complete search history.

(56) References Cited

U.S. PATENT DOCUMENTS

2010/0066968 A1\* 3/2010 Yoon ..................... G02F 1/1309
349/149
2010/0276685 A1  11/2010 Itagaki et al.
(Continued)

FOREIGN PATENT DOCUMENTS

JP      2012-33857 A    2/2012

OTHER PUBLICATIONS

A. Hino, et al., "Effect of H and OH desorption and diffusion on electronic structure in amorphous In—Ga—Zn—O metal-oxide-semiconductor diodes with various gate insulators," Journal of Applied Physics, vol. 112, 2012, 7 pages.
(Continued)

*Primary Examiner* — Angel Roman
(74) *Attorney, Agent, or Firm* — Oblon, McClelland, Maier & Neustadt, L.L.P.

(57) ABSTRACT

Provided is a method for reliably and simply evaluating the quality of an oxide semiconductor thin film and a laminated body having a protective film on the surface of this oxide semiconductor thin film. Also provided is a method for reliably and simply managing the quality of an oxide semiconductor thin film. This method, which is for evaluating the quality of an oxide semiconductor thin film and a laminated body having a protective film on the surface of this oxide semiconductor thin film, has: a first step, wherein an oxide semiconductor thin film is formed on a substrate, after which
(Continued)

the electron state of the oxide semiconductor thin film is measured by a contact method or a noncontact method, thereby evaluating defects arising from in-film defects in the oxide semiconductor thin film; and a second step, wherein the oxide semiconductor thin film is processed on the basis of a condition determined on the basis of that evaluation, after which a protective film is formed on the surface of the oxide semiconductor thin film, and then the electron state of the oxide semiconductor thin film is measured by a contact method or a noncontact method, thereby evaluating defects arising from defects at the interface between the oxide semiconductor thin film and the protective film.

14 Claims, 27 Drawing Sheets

(51) Int. Cl.
*H01L 27/146* (2006.01)
*H01L 29/417* (2006.01)

(56) References Cited

U.S. PATENT DOCUMENTS

| | | | |
|---|---|---|---|
| 2011/0090502 A1* | 4/2011 | Bai | G09G 3/006 356/364 |
| 2012/0203473 A1 | 8/2012 | Hayashi et al. | |
| 2013/0153778 A1 | 6/2013 | Sakoda et al. | |
| 2015/0355095 A1 | 12/2015 | Hayashi et al. | |
| 2015/0371906 A1 | 12/2015 | Kishi et al. | |
| 2016/0223462 A1 | 8/2016 | Hayashi et al. | |

OTHER PUBLICATIONS

K. Nomura, et al., "Room-temperature fabrication of transparent flexible thin-film transistors using amorphous oxide semiconductors," Nature, vol. 432, Nov. 25, 2004, pp. 488-492.

K. Nomura, et al., "Bias stability for a-In—Ga—Zn—O-TFTs: Origin of threshold voltage instability and the role of thermal annealing and passivation," Proceedings of IDW, 2011, 4 pages.

International Search Report and Written Opinion dated Sep. 8, 2015 in PCT/JP2015/069387 filed Jul. 6, 2015.

* cited by examiner

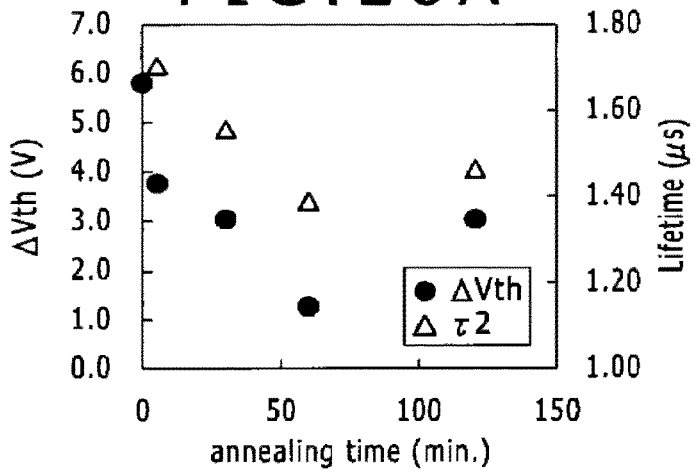
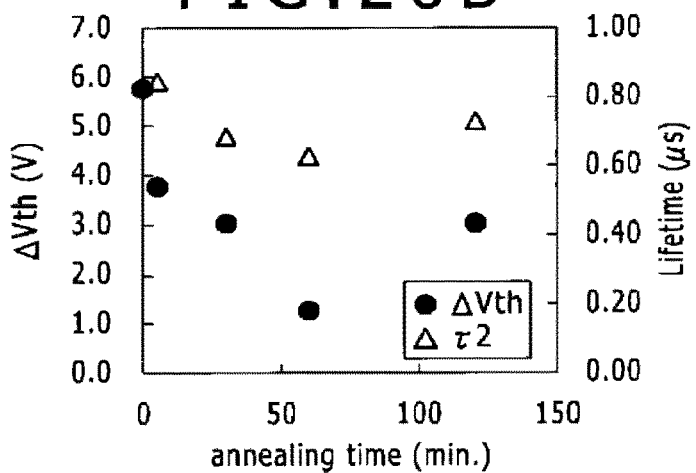
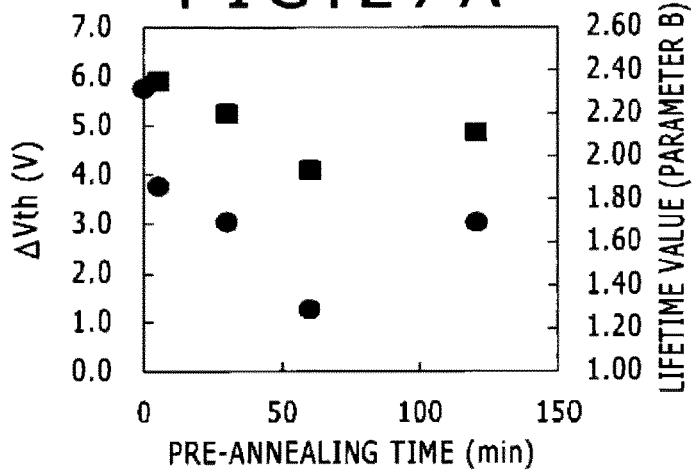

METHOD FOR EVALUATING QUALITY OF OXIDE SEMICONDUCTOR THIN FILM AND LAMINATED BODY HAVING PROTECTIVE FILM ON SURFACE OF OXIDE SEMICONDUCTOR THIN FILM, AND METHOD FOR MANAGING QUALITY OF OXIDE SEMICONDUCTOR THIN FILM

TECHNICAL FIELD

The present invention relates to a method for evaluating quality of a laminate including an oxide for a semiconductor layer (hereinafter, referred to as "oxide semiconductor thin film") suitable for a thin film transistor (TFT) used in a display such as a liquid crystal display or an organic EL display and a protective film on a surface of the oxide semiconductor thin film, and relates to a quality control method of the oxide semiconductor thin film. In detail, the invention relates to a technique for measuring a failure caused by an in-film defect in the oxide semiconductor thin film or a failure caused by an interfacial defect between the oxide semiconductor thin film and a protective film provided on a surface of the oxide semiconductor thin film by a contact method or a noncontact method, and evaluating quality of a laminate including the oxide semiconductor thin film, and relates to a quality control method of the oxide semiconductor thin film.

BACKGROUND ART

An amorphous oxide semiconductor thin film has a high carrier mobility and a large optical bandgap, and can be formed at low temperature. The amorphous oxide semiconductor thin film is therefore expected to be applied to a next-generation display requiring large size, high resolution, and high-speed drive, and to a low-heat-resistant resin substrate used in a transparent display or a flexible display.

Among such oxide semiconductor thin films, an amorphous oxide semiconductor thin film including indium (In), gallium (Ga), zinc (Zn), and oxygen (O) (hereinafter, also referred to as "In—Ga—Zn—O" or "IGZO") is particularly preferred to be used because of its extremely high carrier mobility.

It is however known that an electron state of the oxide semiconductor thin film is varied due to a film formation step and subsequent heat treatment, affecting quality of TFT. For example, carrier concentration that dominates TFT characteristics is greatly varied due to lattice defects formed during the film formation step and hydrogen in the film, allowing the TFT characteristics to be easily varied. In a manufacturing process of a display or the like, therefore, in light of improving productivity, it is important that properties of an oxide semiconductor thin film are evaluated, and results of the evaluation are fed back to adjust a manufacturing condition for quality control of TFT.

The inventors have disclosed a method for evaluating mobility of an oxide semiconductor thin film by a noncontact method without providing an electrode in PTL 1, in which mobility of the oxide semiconductor thin film is qualitatively or quantitatively evaluated by a microwave photoconductive decay method (hereinafter, also referred to as "μ-PCD method").

For the TFT including the oxide semiconductor thin film, it is important to control not only mobility as a basic transistor characteristic but also product defects such as unevenness in luminance, washed-out color, and bad display. To achieve this, it is also required to have good resistance (hereinafter, also referred to as "stress resistance") against stress such as light irradiation or voltage application as a cause of such product defects. The stress resistance means that even if a semiconductor device such as a transistor receives stress, for example, even if the semiconductor device is continuously irradiated with light or continuously receives a gate voltage, the semiconductor device maintains good properties.

In one type of stress resistance, threshold voltage ($V_{th}$) does not shift in a drain current-gate voltage characteristic (hereinafter, also referred to as "I-V characteristic"), i.e., the amount of change in $V_{th}$ (hereinafter, also referred to as "$\Delta V_{th}$") between before and after stress application is small. For example, in an organic EL display, a positive voltage (hereinafter, also referred to as "positive bias") is continuously applied to a gate electrode of a drive TFT during light emission of the organic EL display. Hence, $V_{th}$ is varied and thus a switching characteristic is disadvantageously varied. In a liquid crystal television, TFT is irradiated with light from a backlight. Hence, if such light irradiation is continued in addition to application of a negative voltage (hereinafter, also referred to as "negative bias"), $V_{th}$ is varied and thus a switching characteristic is disadvantageously varied.

In addition, a good initial repetition characteristic is necessary as stress resistance associated with the positive bias. The initial repetition characteristic means a difference between $V_{th}$ calculated from an I-V characteristic obtained at first measurement and $V_{th}$ calculated from an I-V characteristic obtained after multiple times of measurement when the I-V characteristic is measured multiple times after TFT is manufactured. The initial repetition characteristic is better as the difference in $V_{th}$ is smaller.

With the stress resistance associated with the positive bias, it is also necessary that $V_{th}$ of TFT is controlled within an appropriate range. If $V_{th}$ has a minus value, current flows when the gate voltage is not applied, leading to an increase in power consumption. On the other hand, if $V_{th}$ has an extremely large positive value, TFT operation requires a large voltage.

Since such a variation in switching characteristic reduces reliability of the display itself, stress resistance is desired to be improved.

In addition, a process condition causing a large difference in TFT characteristics is reported. For example, NPTL 1 discloses that when an oxide semiconductor thin film is annealed, an electron state in the annealed oxide semiconductor thin film is varied depending on types of a gate insulating film used in TFT, which resultantly greatly affects TFT characteristics. In NPTL 2, it is reported in detail that the TFT characteristics are greatly affected by a type of a protective film formed on a surface of the oxide semiconductor thin film.

CITATION LIST

Patent Literature

PTL 1: Japanese Unexamined Patent Application Publication No. 2012-33857

Non-Patent Literature

NPTL 1: Journal of Applied Physics Vol. 112, 114515 (2012)
NPTL 2: Proceedings of IDW, 587 (2011)

SUMMARY OF INVENTION

Technical Problem

In development of a material for TFT, it is necessary to modify a composition, the content, and the like of the oxide semiconductor depending on required characteristics, and to optimize a film formation condition such as deposition temperature or atmosphere and a processing condition of a subsequent step (hereinafter, may be collectively referred to as "manufacturing condition"). Although the stress resistance of the oxide semiconductor thin film must be evaluated to investigate an optimum combination, the stress resistance has been evaluated after TFT is actually manufactured. Hence, much time and large cost have been required to find out a manufacturing condition, which affects the stress resistance, of the oxide semiconductor thin film. It is therefore desired to provide a technique for accurately and simply evaluating the tress resistance.

The invention has been made in light of the above-described circumstance. An object of the invention is to provide a method for accurately and simply evaluate quality of a laminate including an oxide semiconductor thin film and a protective film on a surface of the oxide semiconductor thin film, and evaluate a quality control method of the oxide semiconductor thin film.

Solution to Problem

The invention is summarized by a quality evaluation method of a laminate including an oxide semiconductor thin film and a protective film on a surface of the oxide semiconductor thin film, the method including a first step of evaluating a failure caused by an in-film defect in the oxide semiconductor thin film by measuring an electronic state of the oxide semiconductor thin film by a contact method or a noncontact method after the oxide semiconductor thin film is formed on a substrate, and a second step of evaluating a failure caused by an interfacial defect between the oxide semiconductor thin film and the protective film by measuring the electronic state of the oxide semiconductor thin film by a contact method or a noncontact method after the protective film is formed on a surface of the oxide semiconductor thin film processed at a condition determined based on the evaluation.

The electronic state of the oxide semiconductor thin film is also preferably measured based on electrical resistivity of the oxide semiconductor thin film.

It is preferred that the failure caused by the in-film defect is evaluated in the first step, thereby when a thin-film transistor receives a negative bias while being irradiated with light, a difference in threshold voltage $\Delta V_{th}$ between before and after application of the negative bias is indirectly evaluated.

It is also preferred that one of the following (1) to (3) is evaluated by evaluating the failure caused by the interfacial defect in the second step, (1) threshold voltage $V_{th}$ of a thin film transistor, (2) a difference in threshold voltage $\Delta V_{th}$ between before and after application of a positive bias to the thin film transistor, and (3) a difference between a threshold voltage at first measurement and a threshold voltage after multiple times of measurement when the threshold voltage of the thin film transistor is measured multiple times.

In another preferred embodiment of the invention, when the failure caused by the in-film defect is measured by the contact method in the first step, a first electrode and a second electrode are provided on the surface of the oxide semiconductor thin film, and the failure is evaluated based on a measured current value or a measured voltage.

It is also preferred that when the failure caused by the interfacial defect is measured by the contact method in the second step, a first electrode and a second electrode are provided so as to be in contact with two sides of the protective film, and the failure is evaluated based on a measured current value or a measured voltage.

It is also preferred that when the electrical resistivity of the oxide semiconductor thin film is measured by the contact method, a measuring terminal having at least two electrodes is brought into contact with the oxide semiconductor thin film to measure a current value.

In another preferred embodiment of the invention, when the electronic state of the oxide semiconductor thin film is measured by the noncontact method, the electronic state of the oxide semiconductor thin film is measured based on a reflectance measuring step of irradiating the oxide semiconductor thin film with excitation light and a microwave, measuring the maximum of a reflected wave of the microwave from a portion subjected to the irradiation, the maximum being varied by the irradiation of the excitation light, and then stopping irradiation of the excitation light, and measuring temporal change in reflectance of the reflected wave of the microwave from the portion subjected to the irradiation after stopping the irradiation of the excitation light, and a parameter calculation step of calculating a parameter corresponding to slow decay, the slow decay being observed after stopping the irradiation of the excitation light, from the temporal change in reflectance.

It is also preferred that, in the parameter calculation step, a parameter corresponding to slow decay observed at 0.1 to 10 μs after stopping the irradiation of the excitation light is calculated from the change in reflectance to evaluate the electronic state of the oxide semiconductor thin film.

The invention includes a quality control method of an oxide semiconductor thin film, the method being summarized in that a reflectance measurement step of irradiating the oxide semiconductor thin film with excitation light and a microwave, measuring the maximum of a reflected wave of the microwave from a portion subjected to the irradiation, the maximum being varied by irradiation of the excitation light, and then stopping the irradiation of the excitation light, and measuring temporal change in reflectance of the reflected wave of the microwave from the portion subjected to the irradiation after stopping the irradiation of the excitation light, and a parameter calculation step of calculating a parameter corresponding to slow decay, which is observed after stopping the irradiation of the excitation light, from the temporal change in reflectance, respectively, are applied to each of two appropriate steps of a manufacturing process of a laminate including an oxide semiconductor thin film and a protective film on a surface of the oxide semiconductor thin film, and the parameters corresponding to slow decay of the parameter calculation step are calculated as a parameter PX1 and a parameter PX2, and an electronic state of the oxide semiconductor thin film is evaluated based on a difference ΔP between the parameters (PX1–PX2, where PX2 is a parameter of a manufacturing step later than PX1).

It is also preferred that the parameters corresponding to the maximum of the reflected wave of the reflectance measurement step are calculated as a parameter QX1 and a parameter QX2, and the electronic state of the oxide semiconductor thin film is evaluated based on a difference ΔQ between QX1 and QX2 (QX1−QX2) and the difference ΔP between the parameters PX1 and PX2 (PX1−PX2).

It is also preferred that the parameter corresponding to the maximum of the reflected wave of the reflectance measurement step is represented as parameter Q in ordinate of a graph, and the parameter corresponding to slow decay of the parameter calculation step is represented as parameter P in abscissa of the graph, and the parameters (QX1, PX1) and the parameters (QX2, PX2) are plotted on the graph and thus the electronic state of the oxide semiconductor thin film is evaluated.

It is also preferred that the oxide semiconductor thin film is provided on a surface of an insulating film, and it is also preferred that the oxide semiconductor thin film is subjected to heat treatment.

Advantageous Effects of Invention

According to the invention, the electronic state of the oxide semiconductor thin film is directly or indirectly measured, thereby the failure caused by the in-film defect in the oxide semiconductor thin film or the interfacial defect can be evaluated. Quality of a laminate including an oxide semiconductor thin film and a protective film on a surface of the oxide semiconductor thin film can be accurately and simply evaluated. According to the invention, quality of the oxide semiconductor thin film can be properly controlled.

BRIEF DESCRIPTION OF DRAWINGS

FIG. 26A is a graph illustrating a relationship between pre-annealing time and $\Delta V_{th}$ (● in the drawing) and a relationship between pre-annealing time and $\tau_2$ (Δ in the drawing) in Example 1-8, where $\tau_2$ is obtained by evaluation 2.

FIG. 26B is a graph illustrating a relationship between pre-annealing time and $\Delta V_{th}$ (● in the drawing) and a relationship between pre-annealing time and $\tau_2$ (Δ in the drawing) in Example 1-8, where the $\tau_2$ is obtained by evaluation 3.

FIG. 27A is a graph illustrating results of Example 1-9, showing a relationship between pre-annealing time and $\Delta V_{th}$ (● in the drawing) and a relationship between pre-annealing time and a parameter B (■ in the drawing).

DESCRIPTION OF EMBODIMENTS

Unevenness in luminance of a display with TFT is known to be caused by shift of a threshold voltage at application of a positive bias. Washed-out color or bad display of the display is also known to be caused by shift of a threshold voltage due to negative-bias application and light irradiation.

Figure 1:
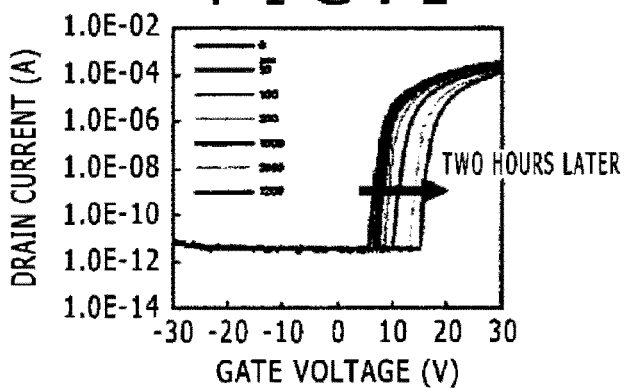
FIG. 1 is a graph illustrating an example of shift of threshold voltage with respect to light irradiation and negative-bias application.
Figure 2:
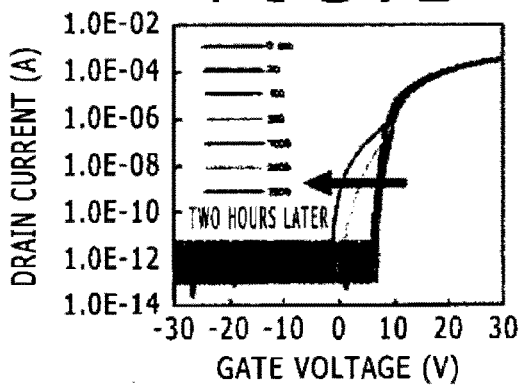
FIG. 2 is a graph illustrating an example of shift of the threshold voltage with respect to positive-bias application.

For example, when a liquid crystal display receives a negative bias while being irradiated with light, the threshold voltage becomes unstable, and $V_{th}$ varies with the lapse of time as illustrated in FIG. 1, leading to a variation in switching characteristic. For an organic EL display, although a positive bias is applied to a gate electrode so that TFT is turned on to allow the display to emit light, a defect is formed by continuous application of a gate voltage. If an electric charge is trapped by the defect, $V_{th}$ varies with the lapse of time as illustrated in FIG. 2, leading to a variation in switching characteristic.

The inventors have made investigations to solve the above-described problem affecting TFT quality, and finally have found the following. First, (1) the variation in threshold voltage due to light irradiation and a negative bias (hereinafter, also referred to as "negative-bias stress") is caused by a variation in electronic state based on defects (hereinafter, also referred to as "in-film defects") in the oxide semiconductor thin film, the defects being contained by a certain amount in the film mainly after formation of the oxide semiconductor thin film or after subsequent annealing in a manufacturing process of a thin film transistor. If the in-film defects exist, washed-out color or bad display is induced by the negative-bias stress. In addition, (2) the variation in threshold voltage due to a positive bias is mainly caused by a gate insulating film or a defect (hereinafter, also referred to as "interfacial defect") due to an interface state existing at an interface between the oxide semiconductor thin film after formation of a protective film and the protective film. The inventors have further found that if the interfacial defect exists, unevenness in luminance is induced by positive-bias stress.

The inventors have further found that if the in-film defect exists, an electronic state is varied because the defect has a property of emitting electrons as carriers into the semiconductor film. In addition, if the interfacial defect exists, band bending occurs in the oxide semiconductor thin film. This results in a variation in electronic state of the oxide semiconductor thin film formed in each manufacturing step. In addition, the variation in the electronic state can be measured through electrical resistivity of the oxide semiconductor thin film. Specifically, it has been found that the increase in $\Delta V_{th}$, which occurs after light irradiation and negative-bias application or after positive-bias application (which hereinafter may be collectively referred to as "bias stress"), has a good relationship with electrical resistivity of the oxide semiconductor thin film before bias stress.

It is therefore not necessary to measure $\Delta V_{th}$ by performing a stress test, in which TFT is actually manufactured and receives bias stress, to evaluate a level of $\Delta V_{th}$ given after bias stress application. In other word, it has been found that the level of $\Delta V_{th}$ can be simply evaluated only by measuring the electronic state of the oxide semiconductor thin film, particularly electrical resistivity, in each manufacturing step. It has been also found that $\Delta V_{th}$ associated with positive-bias application tightly correlates with an initial repetition characteristic and an absolute value of a threshold voltage. Hence, measurement of the electronic state of the oxide semiconductor thin film, particularly electrical resistivity, makes it possible to evaluate (A) the difference in threshold voltage $\Delta V_{th}$ as an index of stress resistance associated with the negative-bias stress. In addition, it is found to be possible to evaluate (B) all of the following (1) to (3) as indicia of stress resistance associated with the positive-bias stress.
(1) Threshold voltage $V_{th}$ of a thin film transistor.
(2) A difference in threshold voltage $\Delta V_{th}$ between before and after applying bias stress to the thin film transistor.
(3) In multiple times of measurement of the threshold voltage of the thin film transistor, a difference between a threshold voltage at the first measurement and a threshold voltage after multiple times of measurement.

In other words, the stress resistance of the oxide semiconductor thin film is affected by the in-film defects and the interfacial defects. The invention is therefore characterized in that the oxide semiconductor thin film having good stress resistance is found to be produced by measuring and evaluating the in-film defects and the interfacial defects. The in-film defects and the interfacial defects usually exist in a mixed manner, and it is generally difficult to measure the two types of defects together and evaluate superiority or inferiority of each type of defects. This is because since thickness of the oxide semiconductor thin film is about 500 nm at a maximum, when electrical resistivity is directly measured in a contact manner after formation of the protective film, or when the electronic state of the oxide semiconductor thin film, particularly electrical resistivity, is indirectly measured in a noncontact manner, the measured value is affected by the in-film defects. For example, protective films are formed with different flow rates of silane on the respective oxide semiconductor thin films having different amounts of in-film defects, the number of interfacial defects is also different due to the in-film defects. Hence, stress resistance based on the interfacial defects is difficult to be accurately evaluated. Hence, conditions of the in-film defects must be the same as a prerequisite to accurately evaluate the interfacial defects. To achieve this, manufacturing conditions before formation of the oxide semiconductor thin films are preferably the same. The conditions of the in-film defects are adjusted to be the same, thereby only the interfacial defects can be correctly evaluated from measured values of the electrical resistivity of the oxide semiconductor thin films on which protective films are formed at different manufacturing conditions.

According to the invention, the in-film defects and the interfacial defects can be measured and evaluated through a first step and a second step as described below. In the invention, "measurement" means that the electronic state of the oxide semiconductor thin film is indirectly or directly measured by a noncontact method or a contact method. In addition, "evaluation" means a level of a failure caused by the in-film defect or the interfacial defect, or a level of quality due to such a failure on the basis of measurement results. According to the evaluation of the invention, a manufacturing condition to decrease the defects in the oxide semiconductor thin film can be predicted, or the defects caused by a modification of the manufacturing condition can be estimated.

In the first step, failures caused by the in-film defects in the oxide semiconductor thin film formed on a substrate are evaluated based on measurement results. Exclusive evaluation of the in-film defects in the first step makes it possible to predict and determine an optimum manufacturing condition to decrease the in-film defects based on the evaluation result. In the second step, protective films are formed on surfaces of oxide semiconductor thin films having the same in-film defect condition, the oxide semiconductor thin films being newly formed on substrates based on the optimum manufacturing condition determined in the first step. The failures caused by the interfacial defects are evaluated based on measurement results from such samples. Exclusive evaluation of the interfacial defects in the second step makes it possible to predict and determine an optimum manufacturing condition necessary to decrease the interfacial defects based on the evaluation results.

Specifically, in the invention, the electronic state of the oxide semiconductor thin film is measured, and thus a relationship between the in-film defects and the manufacturing condition can be grasped to predict and determine the manufacturing condition to decrease the in-film defects in the first step. Hence, the oxide semiconductor thin films, in which conditions of the in-film defects are controlled to be the same, can be formed through the first step. Protective films are formed at different conditions on the surfaces of the oxide semiconductor thin films having the same in-film defects, thereby differences in evaluation based on the measurement results in the second step can be estimated to be due to the interfacial defects. Hence, through the first step and the second step, a relationship between the interfacial defects and a manufacturing condition is grasped, and the manufacturing condition to decrease the interfacial defects can be predicted and determined. Using the manufacturing condition determined through the first step and the second step makes it possible to manufacture the oxide semiconductor thin film, in which both the in-film defects and the interfacial defects are decreased. Using such an oxide semiconductor thin film makes it possible to manufacture an oxide semiconductor thin film having good stress resistance and a laminate including a protective film on the surface of the oxide semiconductor thin film. The laminate is preferred to have a TFT structure, and therefore may include a substrate, an electrode layer such as a gate electrode, and an insulating layer such as a gate insulating layer in addition to the oxide semiconductor thin film and the protective film, and may be processed into an interconnection structure necessary for TFT.

The electronic state may be measured by either of the contact method and the noncontact method in the first step or the second step. The electronic state can be measured based on the electrical resistivity of the oxide semiconductor thin film. The electrical resistivity may be measured directly or indirectly. The electrical resistivity includes sheet resistance ($\Omega \cdot cm/\square$) and specific resistance ($\Omega \cdot cm$). Specific resistance corresponds to sheet resistance multiplied by thickness.

Each step is now described.

First Step

In the first step, an oxide semiconductor thin film is formed on a substrate, and then the electronic state of the oxide semiconductor thin film is measured by a contact method or a noncontact method.

Oxide Semiconductor Thin Film

The oxide semiconductor thin film may be directly formed on the substrate, or may be formed on an appropriate insulating film such as a gate insulating film that is previously formed on the substrate. A necessary electrode or the like may be formed on the surface of the oxide semiconductor thin film depending on measuring methods.

An amorphous oxide semiconductor thin film containing at least one element selected from the group consisting of In, Ga, Zn, and Sn is preferably used as the oxide semiconductor thin film. Such elements may be contained singly or in combination. Specifically, the oxide includes, for example, In oxide, In—Sn oxide, In—Zn oxide, In—Sn—Zn oxide, In—Ga oxide, Zn—Ga oxide, In—Ga—Zn oxide, and Zn oxide.

Thickness of the oxide semiconductor thin film is, but not limited to, preferably 10 nm or more, more preferably 30 nm or more, and preferably 500 nm or less, more preferably 200 nm or less, further preferably 100 nm or less.

First Step: Contact Method

There is now described a method of measuring the electronic state of the oxide semiconductor thin film by a contact method in the first step.

In the contact method, the electronic state is measured while a resistance measuring terminal is in contact with the oxide semiconductor thin film. The electronic state of the oxide semiconductor thin film can be directly measured as electrical resistivity by the contact method. For example, the electrical resistivity may be measured after forming electrodes on the oxide semiconductor thin film as in the four terminal method or the four probe method, or may be measured using a measuring terminal having electrodes as in the double ring electrode method.

When the measuring electrodes are provided on the oxide semiconductor thin film, a voltage should be applied to the electrodes to measure a current value. For example, ohmic electrodes are formed on the oxide semiconductor thin film, and thus electrical resistivity between such two electrode points are simply measured. Specifically, a voltage of, for example, 1 V should be applied to measure a value of a current flowing between the electrodes.

In the four terminal method, two pairs of ohmic electrodes are formed to measure the electrical resistivity. In the method, a current is applied between at least one pair of electrodes formed on the oxide semiconductor thin film, so that a voltage between at least another pair of electrodes can be measured.

For example, the measuring method standardized by JIS H602 may be applied as the method of measuring the electrical resistivity by the four probe method.

The contact method, in which no electrode is formed on the oxide semiconductor thin film, includes a measuring method such as a double ring electrode method. In this measuring method, a measuring probe is directly brought into contact with the surface of the oxide semiconductor thin film, and a current can be applied between the electrodes of the probe to determine electrical resistivity. Hence, the double ring electrode method is preferably simple and inexpensive compared with the four terminal method or the four probe method that is necessary to have electrodes.

First Step: Noncontact Method

There is now described a method of measuring the electronic state of the oxide semiconductor thin film by a noncontact method in the first step.

In the noncontact method, the electronic state is measured while a resistance measuring terminal is not in contact with the oxide semiconductor thin film. The noncontact method allows the electrical resistivity to be indirectly measured in a nondestructive and noncontact manner. The noncontact method exemplarily includes the μ-PCD method. For the μ-PCD method, the electrical resistivity cannot be directly measured unlike the contact method. However, as described later, since a measured value by the μ-PCD method is in a correlation with the electrical resistivity, the electrical resistivity can be indirectly evaluated.

The measuring method using the μ-PCD method includes a reflectance measuring step of irradiating the oxide semiconductor thin film with excitation light and a microwave, measuring the maximum of a reflected wave of the microwave from the oxide semiconductor thin film, the maximum being varied by the excitation light irradiation, and then stopping the excitation light irradiation, and measuring temporal change in reflectance of the reflected wave of the microwave from the oxide semiconductor thin film after stopping the excitation light irradiation, and a parameter calculation step of calculating a parameter corresponding to slow decay, which is observed after stopping the excitation light irradiation, from the temporal change in reflectance.

The correlation of the measured value by the μ-PCD method with the electrical resistivity is as follows. In the reflectance measuring step and the parameter calculation step of the measuring method using the μ-PCD method, slow decay of the parameter calculation step, specifically a degree of decay of the microwave, which is observed at about 1 μs after stopping irradiation of excitation light, (hereinafter, also referred to as "slow microwave decay waveform") is greatly affected by a defect level below the conduction band of the oxide semiconductor thin film, i.e., affected by the electronic state. As a result of investigation of the inventors, analysis of a signal in such a region below the conduction band reveals that light irradiation of the oxide semiconductor thin film tightly correlates with stress resistance after a stress application test of a negative bias.

Use of the μ-PCD method in the first step is extremely useful because the failure caused by the in-film defect can be accurately and simply measured and evaluated in a noncontact manner from change in reflectance.

In this description, the above-described "parameter corresponding to slow decay observed at about 1 μs after stopping the excitation light irradiation" (hereinafter, also referred to as "B value") includes, for example, time from a maximum to $1/e^2$ of the maximum of microwave reflection intensity; a slope obtained by logarithmic conversion of a decay curve of reflected-wave intensity ranging from $1/e$ to $1/e^2$ of the maximum of the microwave reflection intensity, or an absolute value of a reciprocal of the slope; a slope of the decay curve of reflected-wave intensity at about 1 to 2 μs after stopping the excitation light irradiation, or an absolute value of a reciprocal of the slope; the reflected-wave intensity of the microwave observed at about his after stopping the excitation light irradiation, and in the case of representing decay of the reflected-wave of the microwave by the sum of two exponential functions, a value of larger one between slopes obtained through logarithmic conversion, or an absolute value of a reciprocal of the slope. For example, the parameter includes a slope represented by a power-low relational expression of Formula (1) in Example 3-2 as described later. The above-described "in the case of representing decay of the reflected-wave of the microwave by the sum of two exponential functions, slopes obtained by logarithmic conversion" means $\tau_1$ in Formula (1) below and $\tau_2$ in Formula (2) below, for example.

Numerical Formula 1

$$n_1 \exp(-t/\tau_1) + n_2 \exp(-t/\tau_2) \quad (1)$$

Numerical Formula 2

$$n_1 \exp(-t/\tau_1) + n_2 \exp(-t/\tau_2)^\beta \quad (2)$$

Among such parameters, preferred is the slope obtained by logarithmic conversion of a decay curve of reflected microwave intensity in a particular range, or the absolute value of a reciprocal of the slope. Particularly preferred is the slope obtained by logarithmic conversion of the decay curve of reflected-wave intensity ranging from $1/e$ to $1/e^2$ of the maximum, or the absolute value of the reciprocal of the slope, and the slope of the decay curve of reflected-wave intensity at about 1 μs to about 2 μs, or the absolute value of the reciprocal of the slope.

In the description of the parameter, "about 1 μs" is not intended to be strictly limited to 1 μs, but is intended to include a range of microwave reflectance in a range of slow decay of reflectance after stopping excitation light irradiation, i.e., in a range of a gentle slope of decay of reflectance. The time is therefore difficult to be uniquely defined, but, for example, the time is preferably 0.1 μs or more, more preferably 0.5 μs or more, and further preferably 1 μs or more, and is preferably 10 μs or less, more preferably 2 μs or less, further preferably 1.5 μs or less, and most preferably 1 μs or less.

Figure 3:
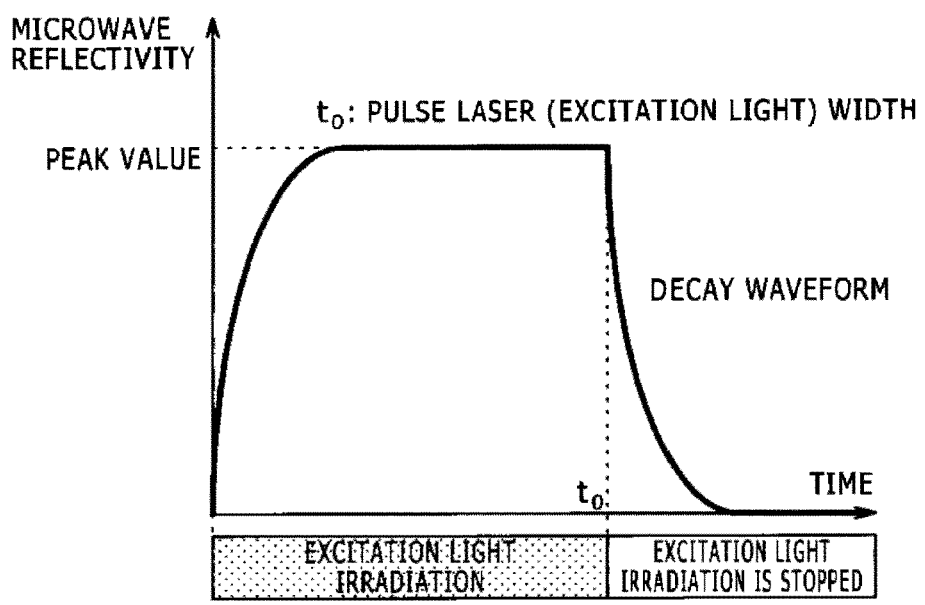
FIG. 3 is a diagram illustrating an exemplary microwave decay waveform.

The above-described "slow decay" is described in detail with FIG. 3. FIG. 3 is a diagram illustrating an aspect of a variation in excess carrier density in the μ-PCD method. The abscissa of FIG. 3 corresponds to reflectance of a microwave. When a sample of the oxide semiconductor thin film is irradiated with excitation light, the light is absorbed by the oxide semiconductor thin film and excites carriers, leading to generation of excess carriers. At this time, as excess carrier density increases, excess carrier annihilation rate increases, and when carrier injection rate becomes equal to carrier annihilation rate, the excess carrier density has a certain peak value. When the excess carrier generation rate becomes equal to the excess carrier annihilation rate, the excess carrier density is saturated and maintains a certain value. As well known, when irradiation of the excitation light is stopped in such a state, the excess carriers decrease through recombination and annihilation of the excess carriers, and finally each return to a value before irradiation of the excitation light.

As illustrated in FIG. 3, the reflectance of the reflected wave of the microwave from the oxide semiconductor thin film temporarily shows the maximum, but rapidly decays simultaneously with stopping irradiation of the excitation light. After that, decay with a certain slope is observed. The slope roughly corresponds to the above-described "parameter corresponding to slow decay observed after stopping the excitation light irradiation", and may be referred to as B value or parameter P in the invention. The maximum of the reflectance of the reflected wave may be referred to as parameter Q.

Specifically, the slope includes, for example, a slope of reflected-wave intensity to time in the above-described range, and a slope of a value obtained by logarithmic conversion of reflected-wave intensity to a value obtained by logarithmic conversion of the time in the above-described range. The B value in Formula (7) is used in Example 2-1 as described later. As described before, the slope includes a slope given when decay of reflectance becomes slow after stopping excitation light irradiation.

Figure 13:
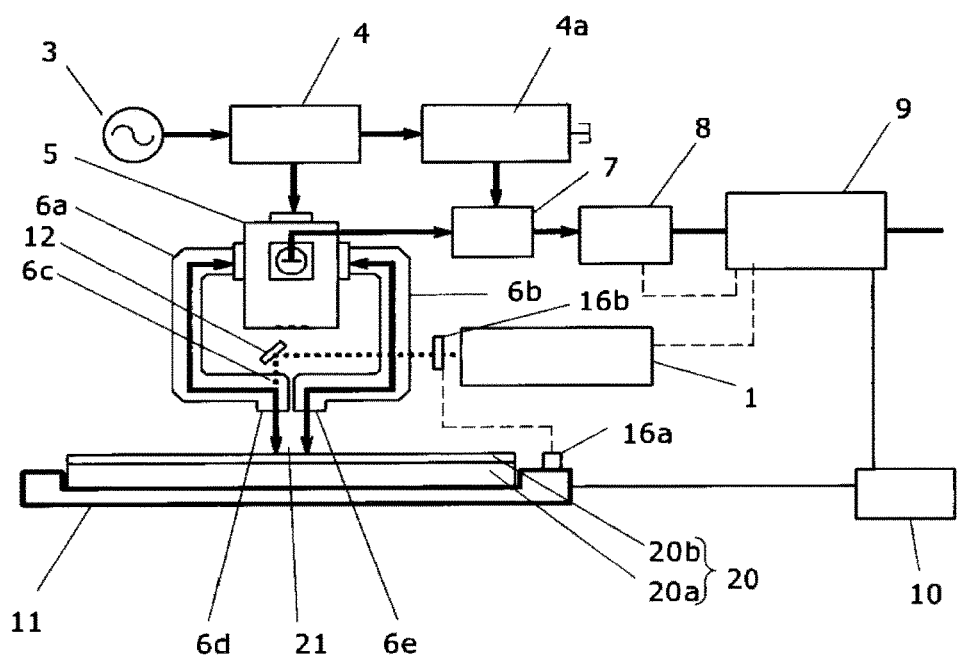
FIG. 13 is an explanatory schematic diagram illustrating an exemplary evaluation apparatus used in the invention.
Figure 14:
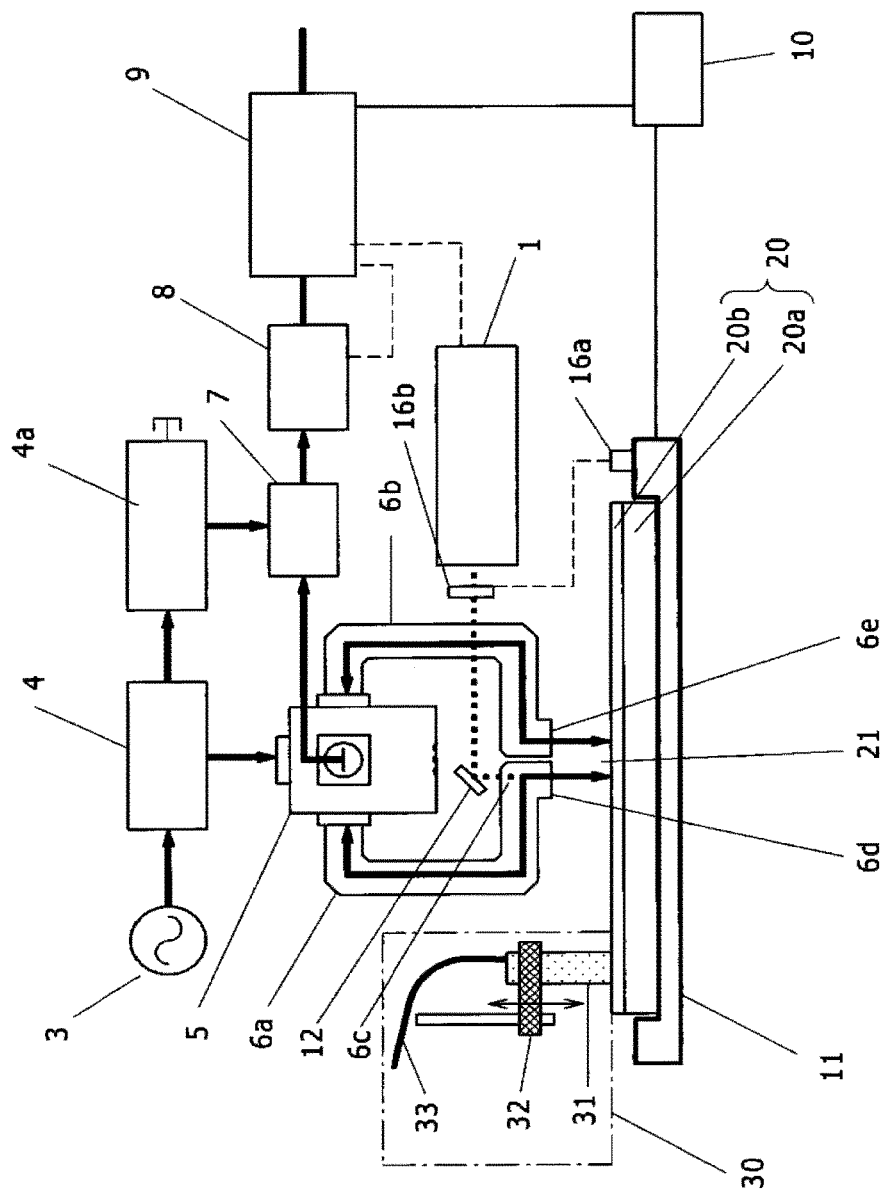
FIG. 14 is an explanatory schematic diagram illustrating an exemplary evaluation apparatus having a measuring means by a contact method and a measuring means by a noncontact method.

An evaluation method by the noncontact method is now described in detail. An apparatus used in the invention must be allowed to irradiate an oxide semiconductor thin film with excitation light and a microwave, and detect intensity of a reflected wave of the microwave from the oxide semiconductor thin film, the intensity being varied by irradiation of the excitation light. Such an apparatus includes, for example, an apparatus as illustrated in FIGS. 13 and 14 as described in detail later, and a lifetime measuring apparatus as shown in FIG. 1 of PTL 1. Since the lifetime measuring apparatus is described in detail in PTL 1, such literature should be seen. However, the apparatus used in the invention is not limited thereto.

In the μ-PCD method, the oxide semiconductor thin film formed on the substrate is irradiated with excitation light and a microwave.

In the invention, a variation in excess carrier density is analyzed, thereby the carrier concentration of the oxide semiconductor thin film can be determined, and quality can be evaluated based on the electronic state, in turn electrical resistivity, i.e., sheet resistance or specific resistance. This is probably due to the following reason.

The microwave applied to the oxide semiconductor thin film is reflected by plasma oscillation caused by carriers existing in the oxide semiconductor thin film. In this case, reflectance depends on carrier density in the oxide semiconductor thin film. The oxide semiconductor thin film in a steady state however does not have the number of carriers that allows practical observation of microwave reflection. However if the oxide semiconductor thin film is irradiated with the excitation light, excess carriers are generated in the film, and the reflectance of the microwave is increased by plasma oscillation of the excess carriers. On the other hand, as the number of the excess carriers decreases along with stop of the excitation light irradiation, the reflectance of the microwave also decreases.

Carriers are typically generated in a silicon semiconductor or the like due to shallow donor levels below a conduction band in an energy band. In such a case, an energy level is about several tens of milli-electron volts below the conduction band, and thus most carriers are being activated near room temperature. As generally known, carriers in the oxide semiconductor thin film in a steady state are also caused by shallow donor levels existing below a conduction band in an energy band. In the oxide semiconductor, however, the levels of the carriers are each relatively deep, about 0.1 to 0.2 eV. Hence, the excess carriers generated by the excitation light irradiation may be recombined in a form of excited holes and electrons, or may be temporarily captured by the donor level and then re-emitted. The ratio of such capture and reemission depends on the amount of the shallow donor level existing below the conduction band in the energy band. Hence, the annihilation process observed after stopping the excitation light is traced for the excess carriers caused by the excitation light irradiation, thereby influence of the amount of the donor level can be analyzed. While the specific resistance of the oxide semiconductor thin film is represented by the product of charge, free electron, and mobility, the mobility of the oxide semiconductor thin film does not significantly vary as long as a composition of metal elements as components of the oxide semiconductor thin film is constant. For example, the mobility of IGZO is about 10 $cm^2/VS$. Hence, change in reflectance of the microwave, i.e., change in excess carrier density, observed by the μ-PCD method roughly correlates with each of the carrier concentration and the electrical resistivity.

Amorphous semiconductor materials such as an oxide semiconductor include a material having continuous levels between a conduction band and a donor level, for example, amorphous silicon and IGZO. In such a case, an annihilation process of carriers observed in the μ-PCD method can be understood as superimposition of individual carrier transition behaviors between the respective levels. As a result, the decay process is observed over a somewhat long time span compared with transition between two levels. The time dependence of such decay has a power-law relationship with time.

Hence, after the reflectance measuring step, the parameter corresponding to the slow decay observed in a time span over a range roughly from 0.1 to 10 μs is calculated, thereby the carrier density of the oxide semiconductor thin film can be determined. As a result, the electrical resistivity such as sheet resistance or specific resistance can be indirectly measured and evaluated.

There has been described a method of measuring the failure caused by the in-film defect in the oxide semiconductor thin film by a noncontact method using the μ-PCD method in the first step. When the electrical resistivity of the oxide semiconductor thin film is measured by a noncontact method using the μ-PCD method in the second step as described later, the electrical resistivity can be measured and evaluated for the same reason as above.

In the invention, a manufacturing condition for decreasing the in-film defects can be predicted and set from the evaluation results of the first step. For example, a formation condition of the oxide semiconductor thin film may be adjusted based on the evaluation of the first step to form the oxide semiconductor thin film having decreased in-film defects on a substrate, or a thermal history condition may be adjusted based on the evaluation of the first step to decrease the in-film defects provided for the measurement in the first step. Thus, the oxide semiconductor thin film having a good electronic state can be manufactured based on the evaluation results of the first step. A specific means for decreasing the in-film defects based on the first step is described in detail later.

Second Step

In the second step, the protective film is formed on the surface of the oxide semiconductor thin film, in which the in-film defects are decreased, and then the failure caused by the interfacial defects in the oxide semiconductor thin film is measured by a contact method or a noncontact method.

In the second step, the protective film is formed on the oxide semiconductor thin film, and as in the first step, the oxide semiconductor thin film may be directly formed on the substrate, or may be formed on an appropriate insulating film previously formed on the substrate. The protective film may be directly formed on the oxide semiconductor thin film. The protective film (hereinafter, also referred to as "passivation insulating film") includes both a protective film for directly protecting the surface of the oxide semiconductor thin film (hereinafter, also referred to as "etch stop layer" or "ESL"), and a protective film for further protecting the surface of that protective film (hereinafter, also referred to as "passivation film"). The protective film is preferred to be an insulating film such as a $SiO_2$ film.

Second Step: Contact Method

There is now described a method of measuring the electronic state by a contact method in the second step. In the contact method, the electronic state should be measured by the four terminal method, the four probe method, or the double ring electrode method as described in the first step. In such a case, an electrode necessary for electrical resistivity measurement should be formed. For measurement of electrical resistivity by the four probe method, however, if the surface of the oxide semiconductor thin film is covered with the protective film or the like, the electrical resistivity cannot be measured. Hence, the protective film is removed only from portions, in each of which a probe is to be in contact with the surface of the oxide semiconductor thin film, so that probes can come into contact with the surface of the oxide semiconductor thin film. This allows electrical resistivity to be measured by the four probe method. For the double ring electrode method, the protective film is also removed only from portions, in each of which a measuring probe is to be in contact with the surface of the oxide semiconductor thin film, thereby the electrical resistivity can be measured.

Second Step: Noncontact Method

There is now described a method of measuring the electronic state by a noncontact method in the second step. In the noncontact measuring method, as with the first step, electrical resistivity is preferred to be indirectly measured in a noncontact manner by the μ-PCD method. A case where electrical resistivity of the oxide semiconductor thin film is measured by the μ-PCD method is described below.

The second step is characterized in that a slow microwave decay waveform as part of microwave decay, which is observed at about 1 μs after stopping the excitation light irradiation, tightly correlates with stress resistance or the like of the oxide semiconductor thin film subjected to a positive-bias stress application test, and the stress resistance is found to be extremely useful as an index to correctly and simply measure and evaluate the electrical resistivity in a noncontact manner. The method of measuring the electrical resistivity of the oxide semiconductor thin film by the μ-PCD method in the second step is the same as the measuring method of the first step. Although the protective film is provided in the second step, the μ-PCD method allows measurement without removing the protective film, and is therefore a measuring means simpler than the contact method. In the second step, therefore, the μ-PCD method measures change in reflectance of the reflected wave of the microwave from the oxide semiconductor thin film after stopping the excitation light irradiation, and evaluates the failure caused by the interfacial defect from the change in reflectance of the reflected wave.

An oxide semiconductor thin film is produced by applying a different manufacturing condition to the oxide semiconductor thin film determined in the first step, and is used to evaluate a plurality of interfacial defects. This makes it possible to predict and set a manufacturing condition of the protective film, the manufacturing condition allowing the interfacial defects to be decreased, from the evaluation results. For example, a manufacturing condition of the protective film or a thermal history condition after formation of the protective film may be adjusted based on the evaluation of the second step. Alternatively, a manufacturing condition such as an oxygen supply condition during formation of the oxide semiconductor thin film may be adjusted based on the evaluation of the second step. Even if an oxide semiconductor thin film, in which the interfacial defects are sufficiently decreased, is not included in the measured oxide semiconductor thin films, an optimum condition can be found from results of the manufacturing condition and the interfacial defects by plotting a plurality of evaluation results on a graph, and the interfacial defects can be optimized by forming and evaluating the protective film again based on the optimum condition.

According to the second step of the invention, stress resistance due to the interfacial defects can be simply evaluated in a short time and at low cost in a stage of developing a material for the oxide semiconductor thin film.

The measuring method of the second step has been described hereinbefore. According to the first and second steps, the electronic state of the oxide semiconductor thin film can be directly or indirectly measured, and the failure caused by the in-film defect or the interfacial defect in the oxide semiconductor thin film can be evaluated. Hence, according to the invention, the laminate including the oxide semiconductor thin film and the protective film on the surface of the oxide semiconductor thin film can be accurately and simply evaluated. In addition, the manufacturing condition is appropriately adjusted based on the evaluation results of the first and second steps, a laminate suitable for TFT can be manufactured while the good electronic state of the oxide semiconductor selected in the first step is maintained.

Using the evaluation method of the invention makes it possible to perform in-line evaluation of electrical properties of the oxide semiconductor thin film in a short time in a manufacturing process of a liquid crystal display or the like. Furthermore, since the µ-PCD method allows the electronic state to be measured in a noncontact manner, when the evaluation method using the µ-PCD method of the invention is applied to one of the manufacturing steps, productivity such as a production yield can be improved, and quality control of the laminate can be more properly performed.

Prediction Method of Manufacturing Condition

There is described a means for decreasing the in-film defects based on the evaluation of the first step.

The manufacturing condition is controlled based on the results of measurement and evaluation in the first step, thereby the in-film defects can be decreased, and the electrical resistivity can be optimized. The inventors have investigated a relationship between a formation condition of the oxide semiconductor thin film and the in-film defects. As a result, the inventors have found the following.

Figure 15:
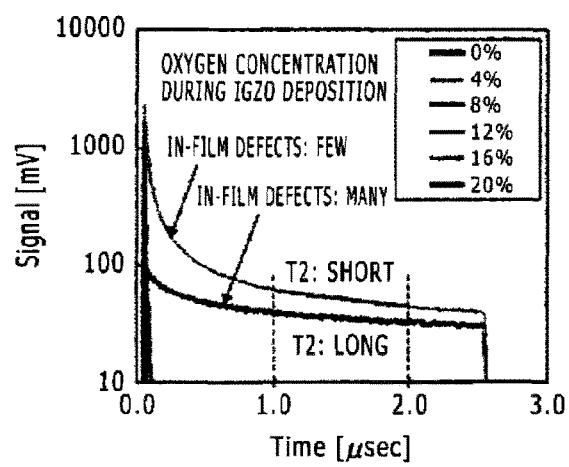
FIG. 15 is a graph illustrating a relationship between oxygen concentration during formation of an oxide semiconductor thin film and measurement results by the μ-PCD method.

A relationship between oxygen concentration and the in-film defects during formation of the oxide semiconductor thin film has been investigated by the µ-PCD method. As illustrated in FIG. 15, a lifetime value varies depending on the oxygen concentration. The lifetime is described with $\tau_2$ as an index below. When the film contains no oxygen, since film resistance is low, the lifetime $\tau_2$ is long. It is found that when the oxygen concentration is low, the lifetime value tends to be short, i.e., a slope of $\tau_2$ tends to be steep, and as the slope of $\tau_2$ increases, the in-film defects decrease. When the oxygen concentration is high, the lifetime value is extremely short. In such a case, $\tau_2$ does not appear. Hence, oxide semiconductor thin films are formed with different oxygen concentrations and the in-film defects are evaluated from the slope of $\tau_2$, thereby the optimum oxygen concentration can be determined, which makes it possible to form the oxide semiconductor thin film in which the in-film defects are decreased.

Figure 16A:
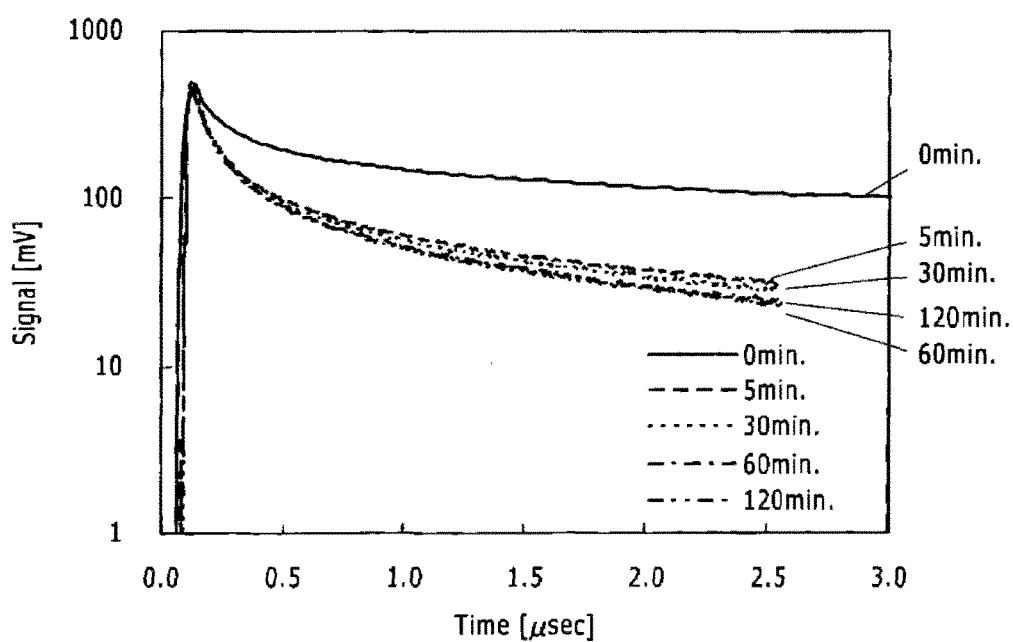
FIG. 16A is a graph illustrating measurement results by the μ-PCD method with respect to pre-annealing time after formation of the oxide semiconductor thin film.

A relationship between thermal history and the in-film defects after formation of the oxide semiconductor thin film has been investigated by the µ-PCD method. As illustrated in FIG. 16A, lifetime is measured by the µ-PCD method after pre-annealing, which is performed at 350° in the air while heating time is varied from 0 to 120 min after formation of the oxide semiconductor thin film. As a result, the slope of $\tau_2$ is varied depending on heating time.

Figure 16B:
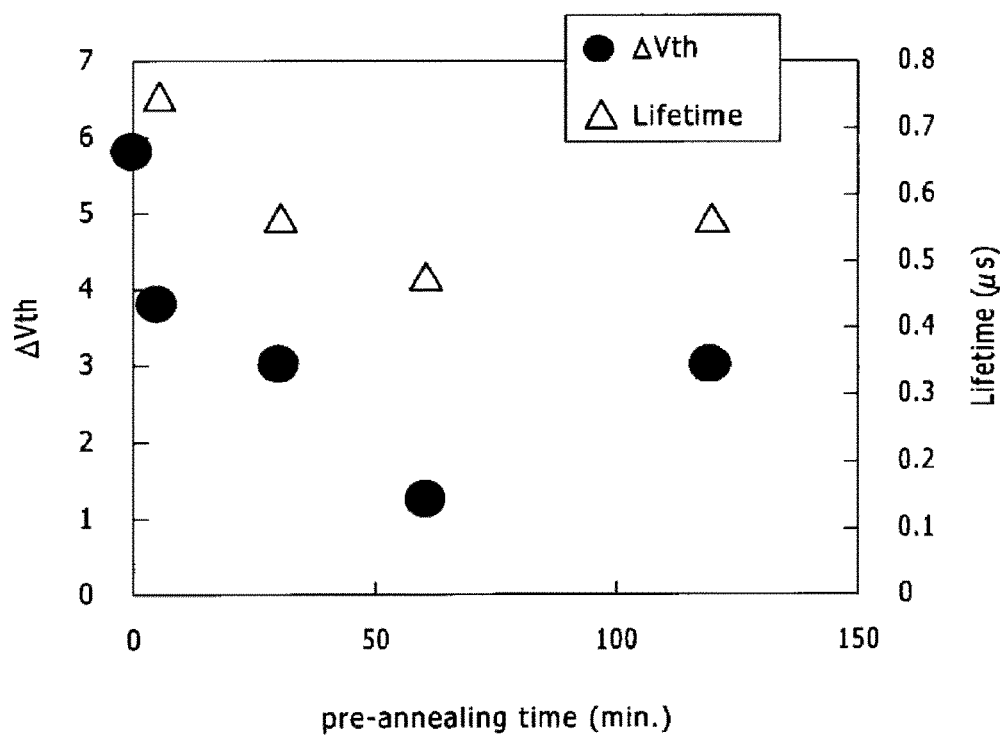
FIG. 16B is a graph illustrating a relationship between pre-annealing time and $\Delta V_{th}$ or lifetime.

As illustrated in FIG. 16B, when a relationship between pre-annealing time and $\Delta V_{th}$ or lifetime, the lifetime value $\tau_2$, which varies depending on the pre-annealing time, is roughly in proportion to $\Delta V_{th}$.

As shown in Example 3-2 as described later, the in-film defects tend to decrease with an increase in pre-annealing temperature.

Hence, the manufacturing condition such as a formation condition of the oxide semiconductor thin film and a pre-annealing condition after the film formation is appropriately adjusted, thereby the in-film defects can be decreased. The above-described oxygen concentration, pre-annealing temperature, and pre-annealing time each vary depending on a composition of the oxide semiconductor thin film, the number of the in-film defects, thermal history temperature, or the like. Hence, the in-film defects are evaluated for a plurality of oxide semiconductor thin films, making it possible to select a condition, which allows the in-film defects to be decreased, from the evaluation results. Even if the measured oxide semiconductor thin films do not include an oxide semiconductor thin film in which the in-film defects are sufficiently decreased, the plurality of evaluation results are plotted on a graph and thus an optimum condition can be found from the tendency of the results. For example, the in-film defects can be decreased by controlling the pre-annealing temperature after formation of the oxide semiconductor thin film to be about 300 to 350° C. and controlling the pre-annealing time in such a temperature range to be 50 to 70 min, preferably about 60 min.

As with the in-film defects, defects are formed in the interface of the oxide semiconductor thin film depending on the manufacturing condition, and thereby the electronic state is varied. The slope of $\tau_2$ is varied due to the interfacial defects, and stress resistance is also affected thereby. As with the first step, the manufacturing condition such as a formation condition of the protective film and a post-annealing condition after formation of the protective film is controlled based on the evaluation of the second step, thereby the interfacial defects can be decreased.

A manufacturing condition, which decreases the in-film defects based on the measurement results of the first step and decreases the interfacial defects based on the measurement results of the second step, is preferred to be performed by the following procedure.

First, the electronic states of the oxide semiconductor thin films with different manufacturing conditions are measured, and the failure caused by the in-film defect is evaluated. As illustrated in FIG. 15, since slow decay measured by the µ-PCD method varies depending on the oxygen concentration during formation of the oxide semiconductor thin film, the failure caused by the in-film defect can be evaluated from $\tau_2$.

Figure 17A:
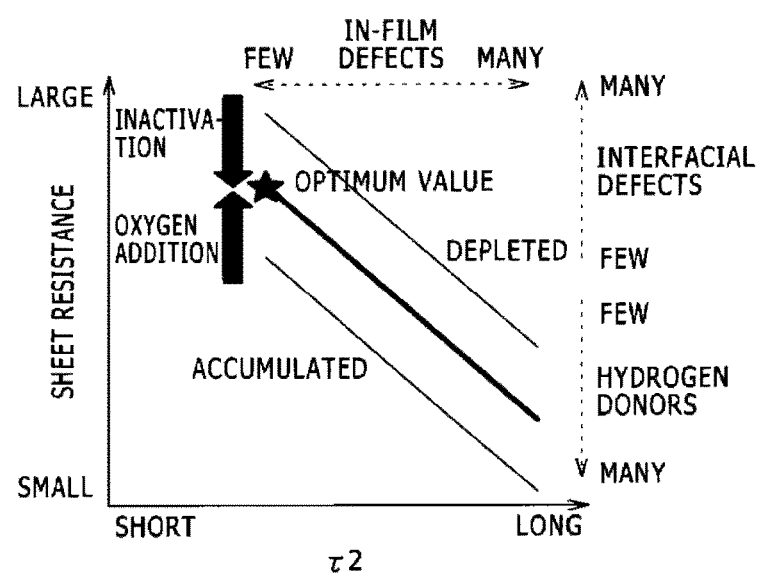
FIG. 17A is an explanatory schematic diagram illustrating a relation of each of a lifetime value, electrical resistivity, an in-film defect, an interfacial defect, and hydrogen donor in an oxide semiconductor thin film with a failure caused by an in-film defect in the oxide semiconductor thin film and a failure caused by an interfacial defect.

For example, it is found that when sheet resistance of each of the oxide semiconductor thin films with different manufacturing conditions is measured, and when a relationship between the measured value of sheet resistance and the lifetime value is plotted with $\tau_2$ as abscissa against sheet resistance as ordinate as illustrated in FIG. 17A, as the electrical resistivity is smaller, the in-film defect tends to increase. Hence, it is necessary that a plurality of oxide semiconductor thin films with different manufacturing conditions are manufactured, and the electronic state of each oxide semiconductor thin film is evaluated by a contact method or a noncontact method, and a difference between the measured resistance value and the optimum resistance value is adjusted. Specifically, the manufacturing condition of the oxide semiconductor thin film is determined such that $\tau_2$ is short, and the electrical resistivity has a proper value. In the adjustment method, the manufacturing condition, including the formation condition of the oxide semiconductor thin film such as oxygen concentration and the pre-annealing condition after formation of the oxide semiconductor thin film, should be appropriately modified. Since the oxide semiconductor thin film optimized based on the evaluation results is decreased in in-film defects, when such results are plotted in FIG. 17A, the value of $\tau_2$ shifts toward the left of abscissa and the electrical resistivity increases compared with the oxide semiconductor thin film that has not been optimized.

However, even if the failures caused by the in-film defects in the oxide semiconductor thin film are optimized in the first step, the electronic state of the oxide semiconductor thin film, on which the protective film has been provided, varies depending on the interfacial defects or hydrogen donors. Hence, the second step must be performed such that the electronic state of the oxide semiconductor thin film is measured after the protective film is formed, and the electronic state of the oxide semiconductor thin film, on which the protective film has been provided, is also optimized based on evaluation results of the failure caused by the interfacial defect. As illustrated in FIG. 17A, plotting the relationship between the measured value of sheet resistance and the lifetime value on a graph reveals that when the electrical resistivity measured at $\tau_2$ optimized in the step 1 is high, many interfacial defects tend to exist, and when the electrical resistivity is low, the number of hydrogen donors increases in the interface between the oxide semiconductor thin film and the protective film. Hence, it is necessary that a plurality of protective films with different manufacturing conditions are formed on the oxide semiconductor thin films each being optimized in the first step, and the electronic state of the oxide semiconductor thin film is evaluated by a contact method or a noncontact method and adjusted. For example, as shown by thick arrows in FIG. 17A, a difference between a measured resistance value and the optimum resistance value is necessary to be adjusted. In the adjustment method, the manufacturing condition such as the formation condition of the protective film such as atmosphere and a post-annealing condition after formation of the protective film should be appropriately modified. For example, since a depletion region in the surface of the oxide semiconductor thin film tends to expand with an increase in interfacial defects, the depletion region can be adjusted by controlling the post-annealing condition. In addition, since an accumulation region of the oxide semiconductor thin film tends to expand with an increase in hydrogen donors, the accumulation region can be adjusted by controlling the oxygen amount during formation of the protective film. The condition that affects the quality of the oxide semiconductor thin film is thus controlled in two stages, thereby the oxide semiconductor thin film, in which the failures caused by the in-film defect and the interfacial defect are optimized, is produced.

Figure 17B:
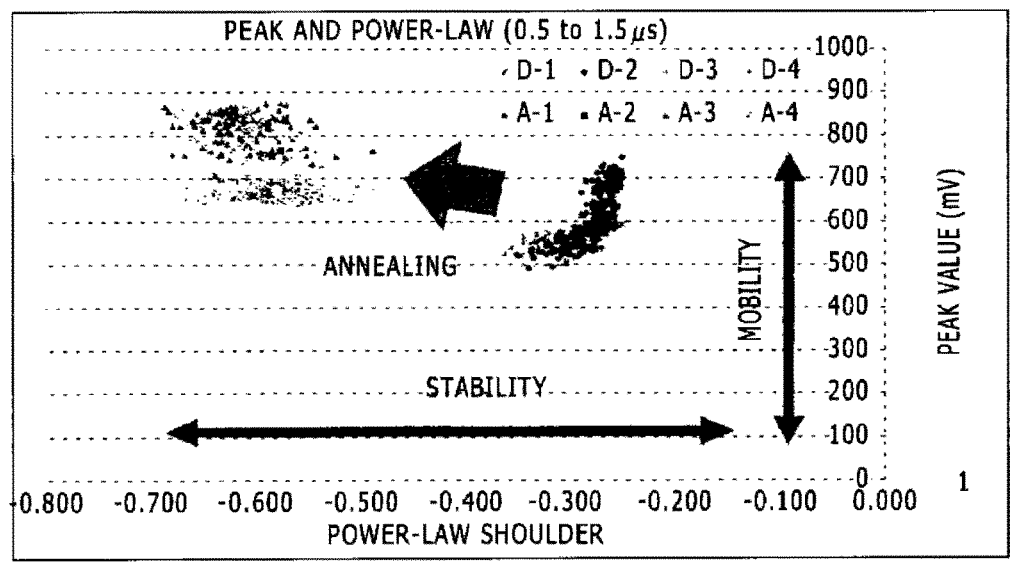
FIG. 17B is an explanatory schematic diagram illustrating a relationship between mobility and stress resistance based on evaluation of the oxide semiconductor thin film.
Figure 28:
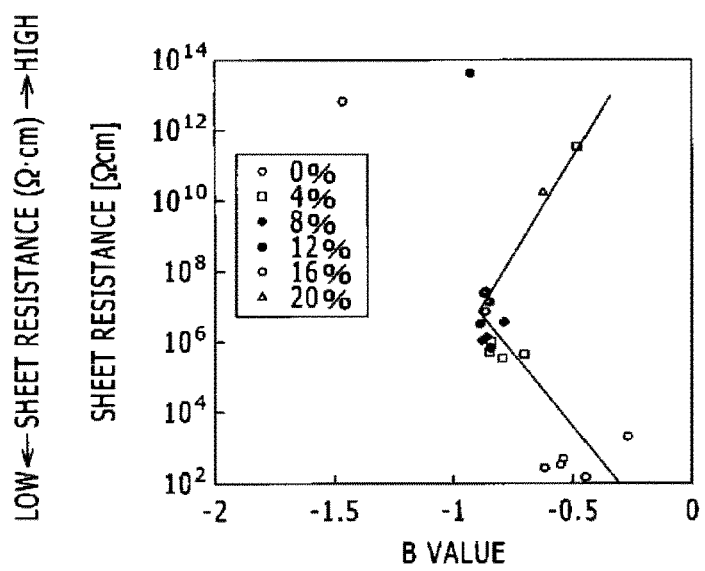
FIG. 28 is a graph illustrating a relationship between a B value in Formula (1) and sheet resistance in Example 2-1.

When a peak value of lifetime obtained by measuring the lifetime of the oxide semiconductor thin film by the μ-PCD method and "absolute value of power-law shoulder" corresponding to the slow decay are plotted, for example, FIG. 17B is given. In FIG. 17B, mobility of the oxide semiconductor thin film can be predicted from a position on the Y axis, and stress resistance of the oxide semiconductor thin film can be predicted from a position on the X axis. As the sheet resistance increases, donor-like centers below the conduction band tend to decrease. As the absolute value of power-law shoulder increases, shallow levels that generate space charge tend to decrease. Hence, a higher mobility or a larger absolute value of power-law shoulder is more preferred. As described above, the sheet resistance of the oxide semiconductor thin film can be increased by controlling the manufacturing condition such as heat treatment. The mobility can also be improved by controlling the manufacturing condition. For a relationship between the sheet resistance and the power-law shoulder value, however, as illustrated in FIG. 28 of Example 2-1 as described later, the absolute value of the power-law shoulder represented by the B value in the drawing tends to decrease above a certain value of the sheet resistance. For example, in FIG. 17B, the absolute value of the power-law shoulder is shifted to the left along the X axis while the peak value is shifted upward along the Y axis through adjusting the annealing condition, so that the oxide semiconductor thin film is optimized. Hence, it is desired that the manufacturing condition such as the added amount of oxygen during film formation and pre-annealing time is properly adjusted from the plotted measured values to optimize the oxide semiconductor thin film such that the peak value is high, and the absolute value of the power-law shoulder is maximized.

In this way, the condition for optimizing the failures caused by the in-film defects can be determined in the first step, and the manufacturing condition of the oxide semiconductor thin film is accordingly controlled, thereby an oxide semiconductor thin film having few failures caused by the in-film defects is produced. In addition, the condition for optimizing the failures caused by an interfacial defects can be determined in the second step, and the manufacturing condition of the protective film is accordingly controlled, thereby a laminate of the oxide semiconductor thin film and the protective film having few failures caused by the interfacial defects is produced. Hence, the formation condition of the oxide semiconductor thin film, the formation condition of the protective film, or the manufacturing condition such as the pre-annealing condition and the post-annealing condition for manufacturing a thin-film transistor is appropriately adjusted, thereby a thin-film transistor having good stress resistance can be manufactured.

Quality Control Method

Furthermore, the invention includes a method, in which the above-described evaluation method is applied to one step of a semiconductor manufacturing process to perform quality control of the oxide semiconductor thin film. The evaluation method should be applied to one step, which affects the in-film defect or the interfacial defect, of the semiconductor manufacturing process so that the evaluation results of the electronic state of the oxide semiconductor thin film are fed back. The manufacturing condition is adjusted based on such feedback, thereby the in-film defects or the interfacial defects can be decreased. As a result, proper quality control of the oxide semiconductor thin film can be performed.

The above-described "one step" refers to an appropriate step in the semiconductor manufacturing process. According to the investigation results of the inventors, it is found that manufacturing steps that affect the stress resistance caused by the in-film defect include (i) a formation step of a gate insulating film, (ii) a formation step of an oxide semiconductor thin film, and (iii) a heat treatment (hereinafter, also referred to as "pre-annealing") step after formation of the oxide semiconductor thin film. It is further found that manufacturing steps that affect the stress resistance caused by the interfacial defect include (iv) a formation step of a protective film that may be formed on the surface of the oxide semiconductor thin film, and (v) a heat treatment (hereinafter, also referred to as "post-annealing") step after formation of the protective film. For example, the evaluation method is applied to such steps, thereby the electronic state of the oxide semiconductor thin film concerning the in-film defect or the interfacial defect can be accurately controlled.

In the quality control method, for example, the oxide semiconductor thin film may be formed on the substrate after the gate insulating film has been formed or directly without the gate insulating film, and immediately after that, the evaluation method of the first step is performed. Alternatively, the oxide semiconductor thin film formed on the substrate or the gate insulating film may be subjected to pre-annealing with, for example, oxygen or water vapor before performing the evaluation method. Alternatively, the evaluation method may be performed before formation of the passivation insulating film. The protective film may be formed on the oxide semiconductor thin film produced through one of the above-described procedures. The protective film also includes the passivation film for further protecting that protective film. Alternatively, the evaluation method of the invention can be applied to a case where the post-annealing is performed after forming the protective film.

Even if the formation condition of the oxide semiconductor thin film is thus adjusted based on the evaluation of the first step to decrease the in-film defects, the in-film defects or the interfacial defects may vary depending on the subsequent manufacturing condition and thus the electronic state of the oxide semiconductor thin film may be varied. To maintain a good electronic state of the oxide semiconductor thin film, therefore, the manufacturing condition such as the film formation condition or the heat treatment condition is preferred to be set such that the electronic state of the oxide semiconductor thin film is not affected, or a varied electronic state can be improved.

The evaluation method may be performed at one point in one appropriate step of the manufacturing process of the laminate having a TFT structure suitable for a display, or may be performed at points in two or more steps. When the evaluation method of the invention is applied to the two or more steps, the electronic state of the oxide semiconductor thin film can be evaluated more minutely. The manufacturing condition is adjusted based on such an evaluation, thereby quality control of the oxide semiconductor thin film can be performed, and a laminate that maintains a good electronic state is produced. Preferably, electrical properties of the laminate can be estimated, and quality control of the laminate can also be performed.

A method of applying the evaluation method of the invention to two appropriate steps of the manufacturing process is now described in detail.

When the evaluation method is applied to the two appropriate steps of the manufacturing process of the laminate, the manufacturing condition is desirably adjusted to reduce deviation between the parameters of the oxide semiconductor thin films measured in the two steps. At this time, as deviation from the parameter as a standard is smaller, the oxide semiconductor thin film is evaluated to maintain a better electronic state.

Although the oxide semiconductor thin film to be an evaluation standard is not specifically limited, an oxide semiconductor thin film having a good electronic state is preferred to be used. The oxide semiconductor thin film having few defects, which is determined based on the evaluation method, is more preferred to be selected. The parameter of the oxide semiconductor thin film to be the evaluation standard should be compared as a reference value to a parameter of an oxide semiconductor thin film produced by performing appropriate processing. At this time, oxide semiconductor thin films are produced by performing processing steps with different manufacturing conditions such as temperature or atmosphere on the prepared oxide semiconductor thin films to be the evaluation standards. Electronic states of the produced oxide semiconductor thin films are measured and evaluated, and an optimum condition can be found from the tendency of results of such measurement and evaluation.

A value measured by a contact method or a noncontact method can be used as the parameter. Since the electronic state can be measured in a noncontact manner by the μ-PCD method, productivity such as a production yield can be preferred to be improved, and quality control can be preferred to be performed more properly.

Figure 38:
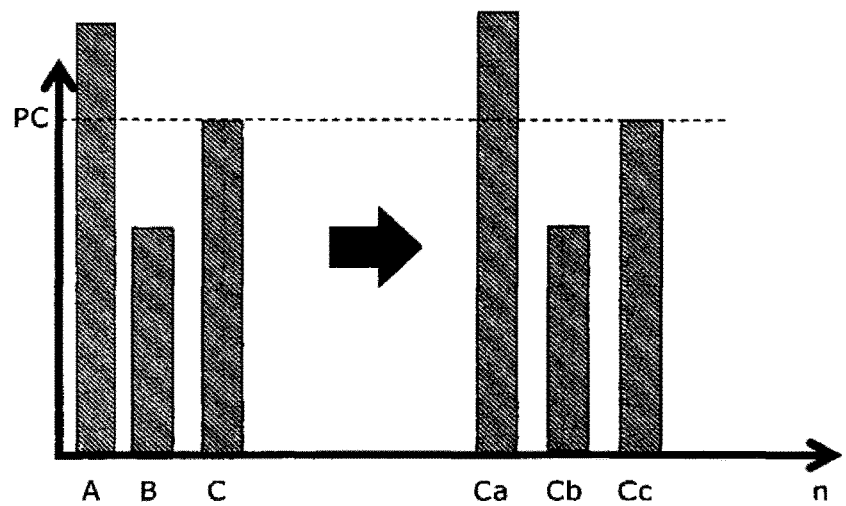
FIG. 38 is an explanatory schematic diagram of a quality evaluation method of an oxide semiconductor thin film.

For example, as illustrated in FIG. 38, an oxide semiconductor thin film C having a good electronic state to be the standard is determined by the evaluation method from a plurality of oxide semiconductor thin films A to C, and a parameter PC of the oxide semiconductor thin film C is defined as a reference value. The oxide semiconductor thin film C is subjected to appropriate processing steps with different manufacturing conditions a to c, and thus a plurality of samples Ca to Cc are prepared, and parameters PCa to PCc are measured and calculated. Differences (Pc–PCa to PCc) between the parameter PC and the parameters PCa to PCc are evaluated. In the illustrated case, the parameter PCc has substantially no deviation from the parameter PC, and thus the oxide semiconductor thin film of the sample Cc can be evaluated to maintain a good electronic state after appropriate processing. On the other hand, the samples Ca and Cb each have a large deviation from the parameter PC, which suggests that the electronic state of the oxide semiconductor thin film is varied by the manufacturing condition a or b in the appropriate processing. The illustrated case therefore shows that using the manufacturing condition c allows the good electronic state to be maintained.

There is now described a method as a typical example, in which a parameter is derived based on the μ-PCD method being a noncontact method, the electronic state of the oxide semiconductor thin film is evaluated based on the parameter, and the manufacturing condition is predicted based on the evaluation.

When the μ-PCD method is used, (1) a parameter P corresponding to slow decay of the parameter calculation step corresponding to the reflectance measuring step or (2) a parameter Q corresponding to the maximum of the reflected wave of the reflectance measuring step and a parameter P corresponding to slow decay of the parameter calculation step corresponding to the reflectance measuring step can be used as the above-described parameter.

In another evaluation point, in-plane uniformity of the oxide semiconductor thin film is also desirably used as an evaluation object from a point of allowing good TFT performance to be exhibited when TFT is incorporated in a product such as a display.

First, (1) a case of using the parameter P is described. As described above, the parameter P in the parameter calculation step varies depending on the electronic state of the oxide semiconductor thin film. Hence, the electronic state of the oxide semiconductor thin film can be evaluated based on the difference ΔP between the parameter PX1 as the reference value and the parameter PX2 as a comparison object (PX1– PX2). For example, a larger value of ΔP represents a larger deviation from a good electronic state of the oxide semiconductor thin film, or more defects. Hence, the manufacturing condition is adjusted such that ΔP is reduced, which makes it possible to manufacture a transistor structure including an oxide semiconductor thin film having a good bias stress characteristic corresponding to the in-film defects or the interfacial defects. Each of ΔP and ΔQ as described later is preferred to be evaluated with its absolute value.

Any parameter of the oxide semiconductor thin film subjected to an appropriate step can be used as the parameter PX1 to be a reference value. For example, a parameter corresponding to slow decay of the parameter calculation step can be used, the slow decay being measured from (a1) an oxide semiconductor thin film determined based on the evaluation of the first step or (a2) an oxide semiconductor thin film of a sample prepared by performing one or more appropriate step on that oxide semiconductor thin film. The oxide semiconductor thin film determined based on the evaluation of the first step (a1) may have an insulating layer such as the gate insulating film between the substrate and the oxide semiconductor thin film. The sample produced by performing one or more appropriate step (a2) may be one of (a2-1) a sample subjected to pre-annealing after formation of the oxide semiconductor thin film, (a2-2) a sample having a protective film, and (a2-3) a sample subjected to post-annealing after formation of the protective film. All of the steps are not necessary to be performed, and at least one step should be performed.

A parameter of an oxide semiconductor thin film, which corresponds to the oxide semiconductor thin film of the reference value subjected to the at least one step, can be used as the parameter PX2 as a comparison object. For example, the at least one step exemplarily includes the steps (a2-1) to (a2-3), or an appropriate step after post-annealing.

In the invention, the oxide semiconductor thin films between two successive steps are not necessary to be exclusively compared, but the oxide semiconductor thin films between two appropriate steps can be compared. For example, the oxide semiconductor thin film of (a1) may be compared to the oxide semiconductor thin film subjected to the steps (a2-1) and (a2-2). Alternatively, the oxide semiconductor thin film of (a2-1) may be compared to the oxide semiconductor thin film of (a2-2). When parameters are measured in two or more steps, the comparison should be performed while a parameter identification number is assigned for each step. For example, the parameters are designated by PX1, PX2, PX3, . . . PXn (n is a number corresponding to step number) in correspondence to the number of steps, and $\Delta P$ should be compared in any appropriate combination such as PX1–PX2, PX2–PX3, and PX1–PXn.

When the oxide semiconductor thin films are compared between different steps, a plurality of comparison results of the oxide semiconductor thin films are desirably used to evaluate influence of a processing condition on the electronic state of the oxide semiconductor thin film. More comparison results allow more minute prediction of the manufacturing condition. For example, it is acceptable that a plurality of oxide semiconductor thin films to be standards as described above, which are processed at the same condition, are prepared, and are then compared to oxide semiconductor thin films produced through steps with different processing conditions, and a desirable manufacturing condition is investigated from the comparison results. It is also acceptable that a plurality of oxide semiconductor thin films, which are processed at different conditions, are prepared as standards, and are then compared to oxide semiconductors produced through steps with the same processing condition, and a desirable manufacturing condition is investigated from the comparison results.

Subsequently, a case of using the parameter P and the parameter Q is described. The inventors have found that a variation in electronic state of the oxide semiconductor thin film between two appropriate steps is grasped based on the parameter P and the parameter Q, thereby properties of the transistor structure including the oxide semiconductor thin film can be more minutely grasped. As disclosed in PTL 1 by the inventors, a relationship between mobility and the maximum of reflectance of the oxide semiconductor thin film exists, in which the mobility tends to increase directly with the magnitude of the maximum of reflectance. Hence, the mobility can be evaluated based on the difference $\Delta Q$ (QX1–QX2) between the parameter QX1 as a reference value and the parameter QX2 as a comparison object. For example, as a value of $\Delta Q$ increases, a deviation from the mobility of the good oxide semiconductor thin film may increase. Hence, the manufacturing condition is adjusted such that proper $\Delta Q$ is obtained in relation to mobility, thereby the transistor structure including the oxide semiconductor thin film having a good mobility can be manufactured. In the invention, the manufacturing condition is adjusted in consideration of both the parameter Q and the parameter P, making it possible to perform quality control of the oxide semiconductor thin film with regard to the mobility and the bias stress characteristic.

The parameter Q and the parameter P are values of the oxide semiconductor thin film in the same step. Specifically, when the oxide semiconductor thin film is measured by the μ-PCD method, the maximum of the reflected wave of the reflectance measuring step corresponds to the parameter Q, and the parameter corresponding to slow decay of the parameter calculation step, the parameter being derived after measuring the maximum, corresponds to the parameter P.

Parameters of the oxide semiconductor thin films after the appropriate steps (a1) and (a2) can be used as the parameter QX1 and the parameter PX1 as the reference values. Parameters of the oxide semiconductor thin films produced by performing one or more appropriate processing step on such oxide semiconductor thin films can be used as the parameter QX2 and the parameter PX2 as the comparison objects.

In the invention, the parameter Q and the parameter P may be plotted on a graph for the evaluation. For example, a graph is made with the parameter Q corresponding to the maximum of the reflected wave of the reflectance measurement step on ordinate and the parameter P corresponding to slow decay of the parameter calculation step on abscissa, and parameters of a plurality of oxide semiconductor thin films processed with different manufacturing conditions are plotted, thereby the mobility and the stress resistance can be easily evaluated. The parameters may be plotted on the same graph or different graphs depending on steps or processing conditions. Although the number of steps, the number of processing conditions, and the number of parameters as the evaluation object are not specifically limited, a larger number of evaluation objects leads to easier tracing of the electronic state of the oxide semiconductor thin film. A larger number of parameters leads to easier prediction of the manufacturing condition for correction of the variation in electronic state of the oxide semiconductor thin film.

Parameters of the oxide semiconductor thin film can be compared between appropriate steps to perform quality control of the oxide semiconductor thin film. For example, FIGS. 42A to 42E of Example 1-12 as described later show that the parameter Q and the parameter P are measured for each step for a plurality of oxide semiconductor thin films manufactured with different added amounts of oxygen during film formation and different temperatures during pre-annealing.

Although $\Delta Q$ and $\beta$ are calculated for evaluation from parameters of two successive steps in Example 1-12, $\Delta Q$ (QXm–QXn: m and n are each a number corresponding to step number, where n is a step number later than m) and $\Delta P$ (PXm–PXn: m and n are each a number corresponding to step number, where n is a step number later than m) may be calculated for evaluation from parameters of two appropriate steps. For example, evaluation can be performed based on $\Delta Q$ (QX1–QX5) and $\Delta P$ (PX1–PX5) calculated from the pre-annealing step: QX1 and PX1 and the post-annealing step: QX5 and PX5, and an optimum manufacturing condition can be predicted based on such evaluation.

Evaluation Element

The evaluation element refers to a sample used in one of the above-described evaluation methods. The evaluation element suitable for the first step includes the oxide semiconductor thin film provided on a substrate, and has a configuration corresponding to "one of steps" typified by one of the above-described steps (i) to (iii). The evaluation element suitable for the second step includes the oxide semiconductor thin film provided on a substrate and the protective film on that oxide semiconductor thin film, and has a configuration corresponding to a step typified by the above-described step (iv) or (v).

The evaluation element suitable for the first step includes, for example, (a) an evaluation element including the oxide semiconductor thin film directly formed on the surface of the substrate, and (b) an evaluation element including the oxide semiconductor thin film directly formed on the surface of the gate insulating film.

Figure 9:
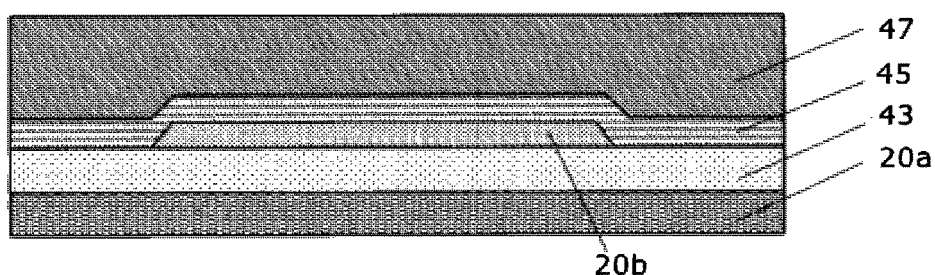
FIG. 9 is a schematic diagram illustrating another exemplary configuration of the evaluation element used in the invention.
Figure 10:
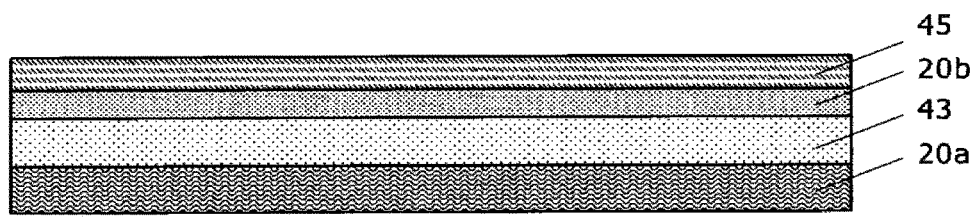
FIG. 10 is a schematic diagram illustrating another exemplary configuration of the evaluation element used in the invention.

The evaluation element suitable for the second step includes, for example, (c) an evaluation element in which the oxide semiconductor thin film is directly formed on the surface of the substrate, and the protective film including, for example, the etch stop layer shown in FIG. 10 and the passivation film shown in FIG. 9 is formed on the surface of the oxide semiconductor thin film, and (d) an evaluation element in which the oxide semiconductor thin film is directly formed on the surface of the gate insulating film, and the protective film including, for example, the etch stop layer shown in FIG. 10 and the passivation film shown in FIG. 9 is formed on the surface of the oxide semiconductor thin film.

The evaluation elements are each importantly configured such that the oxide semiconductor thin film is directly provided on the surface of the substrate or the gate insulating film as described in (a) to (d). Specifically, a metal electrode, for example, the gate electrode, does not exist directly below the oxide semiconductor thin film. This is because if the gate electrode or the like exists directly below the oxide semiconductor thin film, since the gate electrode has a large number of electrons as free carriers, $10^{18}$ cm$^{-3}$ or more, influence of the gate electrode on the reflectance of the microwave becomes dominant.

Any evaluation element may adopt a configuration required for measurement, including, for example, an electrode, as necessary.

Figure 5:
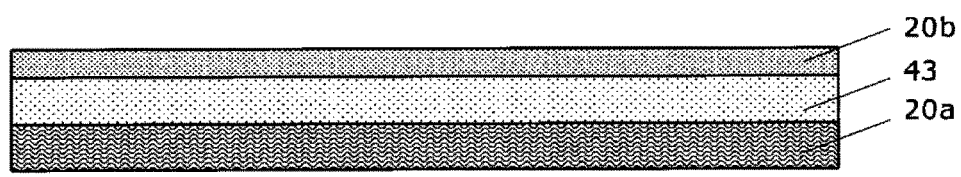
FIG. 5 is a schematic diagram illustrating an exemplary configuration of an evaluation element used in the invention.
Figure 6:
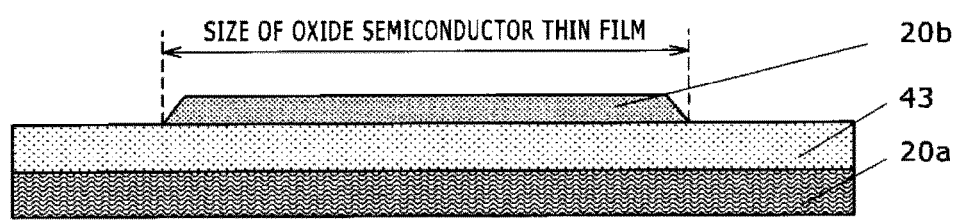
FIG. 6 is a schematic diagram illustrating another exemplary configuration of the evaluation element used in the invention.
Figure 7:
FIG. 7 is a schematic diagram illustrating another exemplary configuration of the evaluation element used in the invention.

An exemplary configuration of the evaluation element suitable for the first step of the invention is shown in FIGS. 5 to 7. As shown in such drawings, no metal electrode is provided directly below the oxide semiconductor thin film.

Among such drawings, for example, FIG. 5 shows that a gate insulating film 43 and an oxide semiconductor thin film 20b are formed in this order on a substrate 20a such as a glass substrate. The oxide semiconductor thin film is not patterned.

In FIG. 6, the gate insulating film 43 and the oxide semiconductor thin film 20b are formed in this order on the substrate 20a, and then the oxide semiconductor thin film is patterned.

In FIG. 7, the oxide semiconductor thin film 20b is formed on the substrate 20a.

An exemplary configuration of the evaluation element suitable for the second step of the invention is shown in FIGS. 8 to 11. As shown in the drawings, no metal electrode is provided directly below the oxide semiconductor thin film.

Figure 8:
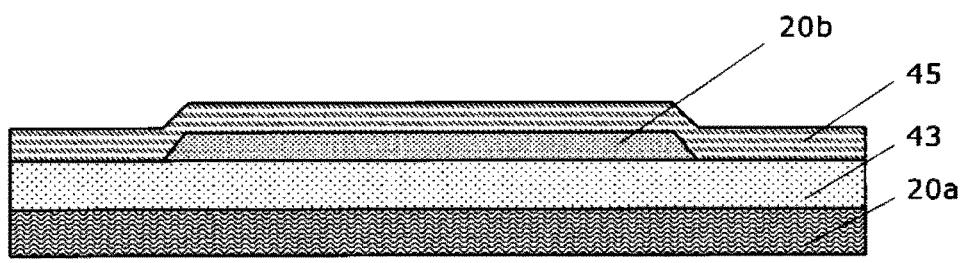
FIG. 8 is a schematic diagram illustrating another exemplary configuration of the evaluation element used in the invention.

In FIG. 8, the gate insulating film 43, a patterned oxide semiconductor thin film 20b, and a patterned etch stop layer 45 as a protective film are formed in this order on the substrate 20a.

In FIG. 9, the gate insulating film 43, the patterned oxide semiconductor thin film 20b, the patterned etch stop layer 45, and a passivation film 47 are formed in this order on the substrate 20a.

In FIG. 10, the gate insulating film 43, the oxide semiconductor thin film 20b, and the etch stop layer 45 are formed in this order on the substrate 20a.

Figure 11:
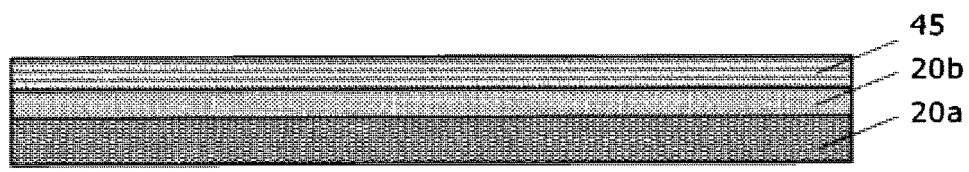
FIG. 11 is a schematic diagram illustrating another exemplary configuration of the evaluation element used in the invention.

In FIG. 11, the oxide semiconductor thin film 20b and the etch stop layer 45 are formed in this order on the substrate 20a.

An evaluation substrate, on which a plurality of evaluation elements, each of which is one of the above-described evaluation elements, are arranged, is also preferred to be used.

Figure 12:
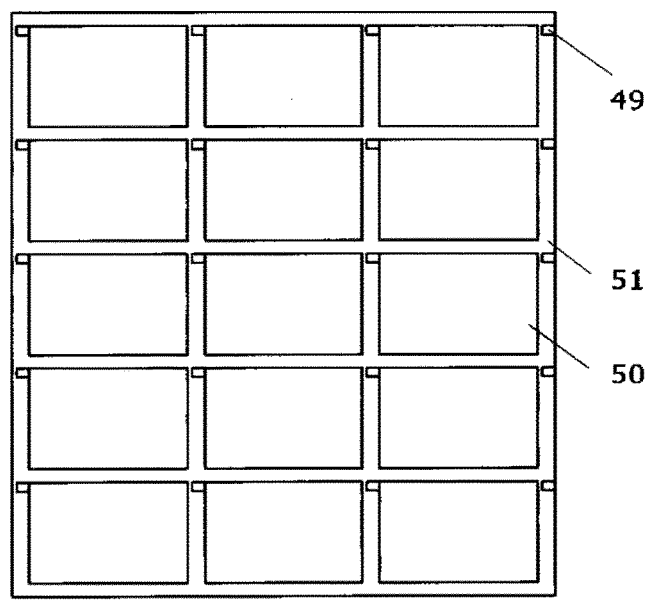
FIG. 12 is a schematic diagram of an evaluation substrate illustrating an exemplary arrangement configuration of evaluation elements used in the invention.

FIG. 12 is a schematic diagram of an evaluation substrate illustrating an exemplary arrangement configuration of the evaluation elements. As illustrated in FIG. 12, a display 50 and a plurality of evaluation elements 49 are regularly arranged on a mother glass 51 such as a glass substrate used in a mass production line. Using such an evaluation substrate makes it possible to perform quality control of the oxide semiconductor thin film, specifically measure distribution in a substrate plane, i.e., in-plane variations in electrical resistivity, and inter-substrate distribution, i.e., variations in electrical resistivity between substrates.

Evaluation Apparatus

An embodiment of the invention is now described in detail with drawings. However, the evaluation apparatus of the invention is not limited to the following configuration, and may be appropriately modified or altered.

FIG. 13 is a schematic diagram illustrating an exemplary configuration of an apparatus used for measuring the oxide semiconductor thin film by a noncontact method. The evaluation apparatus illustrated in FIG. 13 includes an excitation light irradiation means 1 that irradiates a measurement site of a sample 20 including the oxide semiconductor thin film 20b provided on the substrate 20a with excitation light to generate electron-hole pairs in the oxide semiconductor thin film, a microwave irradiation means 3 that irradiates the measurement site of the sample 20 with a microwave, a reflected-microwave intensity detection means 7 that detects intensity of a reflected microwave of the microwave from the sample 20, the intensity being varied by the excitation light irradiation, and a means for evaluating electrical resistivity of the sample 20 based on the detection data of the reflected-microwave intensity detection means. This configuration makes it possible to measure and evaluate change in reflectance and the electrical resistivity by one apparatus. In the second step, a sample, in which the protective film is provided on the oxide semiconductor thin film as illustrated in FIGS. 8 to 11, is used in place of the sample 20.

The excitation light irradiation means 1 has a light source that outputs excitation light to irradiate the sample 20, and allows electron-hole pairs to be generated in the oxide semiconductor thin film through excitation light irradiation. The excitation light irradiation means 1 preferably has a light source that outputs energy equal to or larger than the bandgap of the oxide semiconductor thin film. The light source effectively generates carriers through outputting the energy equal to or larger than the bandgap of the oxide semiconductor thin film, which preferably leads to sensitive measurement. The excitation light irradiation means 1 should include an ultraviolet laser as the light source, for example. Specifically, the ultraviolet laser includes a semiconductor laser such as a pulsed laser that emits pulsed ultraviolet light, for example, a third harmonic of a YLF laser as the excitation light, the pulsed ultraviolet light having a wavelength of 349 nm, power of 1 μJ/pulse, a pulse width of about 15 ns, and a beam diameter of about 1.5 mm.

The excitation light irradiation means 1 receives a timing signal transmitted from an evaluation means 9 (as shown by a broken line in the figure), and outputs pulsed light as the excitation light with the reception of the timing signal as a trigger. The timing signal is transmitted to a signal processor 8 at the same time. The excitation light can be output from the excitation light irradiation means 1 while output power of the excitation light is adjusted by an output adjustment power monitor 16a and an output adjustment means 16b.

The excitation light output from the excitation light irradiation means 1 is reflected by an optical-path change means (hereinafter, also referred to as mirror) 12 such as a mirror, and is condensed by an undepicted condensing means (hereinafter, also referred to as condensing lens) such as a condensing lens, and passes through a small opening 6c provided in a first waveguide 6a, and is applied to a measurement site having a diameter of, for example, about 5 to 10 μm of the sample 20 through an end (opening 6d), which is close to the sample 20, of the first waveguide 6a. In this way, the mirror 12 and the condensing lens condense the excitation light output from the excitation light irradiation means 1, and guide the excitation light to the measurement site of the sample 20. Consequently, excited carriers are generated in a small excitation light irradiation region 21 as the measurement site of the sample 20.

The microwave application means 3 outputs a microwave to be applied to the measurement site of the sample 20. Examples of the microwave application means 3 include a microwave oscillator such as a Gunn diode resonating at a frequency of 26 GHz.

A directional coupler 4 bifurcates the microwave output from the microwave application means 3. One of the bifurcated output waves (hereinafter, referred to as first microwave Op1) is transmitted to a magic T (5) side, while the other bifurcated output wave (hereinafter, referred to as second microwave Op2) is transmitted to a LO input terminal of the reflected-microwave intensity detection means 7 via a phase regulator 4a. The directional coupler 4 is a 10 dB coupler, for example.

The magic T (5) bifurcates the first microwave Op1, and outputs a difference signal Rt1 (hereinafter, also referred to as "reflected-wave difference signal") between reflected waves of the bifurcated first microwaves from the sample 20 and a sum signal of the reflected waves.

One of the microwaves Op1 bifurcated by the magic T (5) (hereinafter, also referred to as "first main microwave Op11") is guided to the measurement site including an excited portion of the sample 20 by the first waveguide 6a connected to the magic T (5), and is radiated from the opening 6d at an end of the first waveguide 6a. Consequently, the first main microwave Op11 is applied to the measurement site of the sample 20. Furthermore, the first waveguide 6a serves as an antenna (hereinafter, also referred to as "waveguide antenna") radiating the first main microwave Op11, and serves to capture the reflected wave of the first main microwave Op11, which is applied to the measurement site, by the opening 6d at the end of the first waveguide 6a, and guide back the captured reflected wave to the magic T (5).

The other of the first microwaves Op1 bifurcated by the magic T (5) (hereinafter, referred to as "first sub microwave Op12") is guided to the vicinity, but containing no excited region by the excitation light, of the measurement site of the sample 20a by a second waveguide 6b connected to the magic T (5), and is radiated from an opening 6e at an end of the second waveguide 6b. Consequently, the first sub microwave Op12 is applied to the vicinity of the measurement site of the sample 20a. Furthermore, the second waveguide 6b serves as a waveguide antenna radiating the first sub microwave Op12, and serves to capture the reflected wave of the first sub microwave Op12, which is applied to the vicinity of the measurement site, by the opening 6e at the end of the second waveguide 6b, and guide back the captured reflected wave to the magic T (5). The path length along which the first waveguide 6a guides the microwave is equal to the path length along which the second waveguide 6b guides the microwave.

A difference signal, i.e., a reflected-wave difference signal Rt1, between the two reflected waves guided to the magic T (5) by the first waveguide 6a and the second waveguide 6b, the reflected waves being caused by reflection of the bifurcated first microwaves Op11 and Op12 on the sample 20, is output by the magic T (5) and transmitted to an RF input terminal of the reflected-microwave intensity detection means 7.

The reflected-microwave intensity detection means 7 mixes the second microwave Op2 and the reflected-wave difference signal Rt1, and thus outputs a detection signal Sg1. The detection signal Sg1 indicates an example of intensity of the reflected-wave difference signal Rt1, for example, intensity of the reflected wave of the first microwave Op1 applied to the sample 20, and is sent to the signal processor 8. The intensity of the reflected-wave difference signal Rt1 is varied by excitation light application to the sample 20 held at a predetermined position by a substrate holder. In this way, the reflected-microwave intensity detection means 7 detects the intensity of the reflected-wave difference signal Rt1. A mixer or a microwave detector (hereinafter, also referred to as "detector"), which receives a microwave and outputs an electric signal, i.e., a current or a voltage, corresponding to the intensity of the microwave, may be provided as the reflected-microwave intensity detection means 7.

The intensity of the reflected-wave difference signal Rt1 detected by the reflected-microwave intensity detection means 7 is varied by excitation light application to the measurement site of the sample 20. Specifically, the intensity of the reflected-wave difference signal Rt1 is temporarily increased by the excitation light irradiation and then decays. As the measurement site has more impurities or defects, a peak value of the intensity of the reflected-wave difference signal Rt1 becomes smaller, and decay time of the intensity, i.e., carrier lifetime also becomes shorter.

The intensity of the reflected-wave difference signal Rt1 is varied by the excitation light irradiation, and slow decay is observed after stopping the excitation light irradiation after the peak value of the intensity appears. A parameter corresponding to the slow decay is an index for evaluating the electrical resistivity of the sample 20.

The signal processor 8 detects a peak value Sp of a variation in intensity of the reflected-wave difference signal Rt1 detected by the reflected-microwave intensity detection means 7, and transmits the detection result to the evaluation means 9. More specifically, the signal processor 8 receives a timing signal from the evaluation means 9, and monitors a variation in the reflected-wave difference signal Rt1 for a predetermined time with the reception of the timing signal as a trigger, and detects the maximum of a level of the reflected-wave difference signal Rt1 obtained during such monitoring as the peak value Sp of the variation in intensity of the reflected-wave difference signal Rt1. The signal processor 8, which includes a delay circuit that performs delay processing on the reflected-wave difference signal Rt1, sequentially detects signal intensity of the delay-processed signal at a predetermined sampling frequency, and detects the peak value Sp of the variation in intensity of the reflected-wave difference signal Rt1 from variations in the detected value.

A computer including CPU, a storage, and an input-output signal interface can be used as the evaluation means 9, and performs various types of processing through execution of a predetermined program by the CPU.

For example, the evaluation means 9 outputs a timing signal indicating output timing of the excitation light to the excitation light irradiation means 1 and the signal processor 8, and captures the peak value Sp of the reflected-wave difference signal Rt1 detected by the signal processor 8 and stores the peak value Sp in the storage of the evaluation means 9. The stored reflected-wave difference signal Rt1 (detection data) is used for evaluation of the electrical resistivity of the sample 20.

A stage controller 10 controls an X-Y stage 11 according to an instruction from the evaluation means 9, and thus performs positioning control of the measurement site of the sample 20.

An undepicted sample stage is provided over the X-Y stage 11. The sample stage is a plate-like conductor component including a metal such as aluminum, stainless steel, or iron, or another conductor. An undepicted substrate holder is provided over the sample stage, and the sample 20 is placed on the substrate holder. Consequently, the sample stage is disposed on a side opposite to a side on which the sample 20 is irradiated with the first microwaves Op11 and Op12, i.e., disposed on a lower side of the sample 20.

The substrate holder is a solid dielectric fixed on the upper side of the sample stage. The substrate holder is the solid dielectric inserted between the substrate and the sample stage, and includes a material that is a dielectric having a relatively large refractive index, such as glass or ceramics. This shortens the wavelength of the microwave passing through the substrate holder as a medium, so that a relatively thin and light substrate holder can be used.

In this way, according to the configuration for evaluating the electrical resistivity of the invention, photoexcited carriers are generated in the oxide semiconductor thin film by the excitation light output from the excitation light irradiation means 1, and the photoexcited carriers move by the electric field of the microwave output from the microwave application means 3. The kinetic state of the photoexcited carriers is affected by impurities, defects, and the like in the semiconductor. Hence, intensity of the reflected microwave from the sample is detected by the reflected-microwave intensity detection means 7, and a variation in excess carrier concentration is analyzed by the evaluation means 9 as described before, which makes it possible to determine the carrier concentration in the oxide semiconductor thin film and indirectly evaluate the electrical resistivity from a variation in electronic state. At this time, the evaluation means 9 may control a position of a stage including an X-Y table 11 to allow mapping measurement to determine the electrical resistivity in a predetermined range.

Furthermore, the evaluation apparatus is further provided with an electrical resistance measuring means, thereby it is possible to provide an apparatus not only performing evaluation of the electrical resistivity, but also performing in-line evaluation of the electrical properties of the oxide semiconductor thin film in a short time. In the above-described evaluation of the electrical resistivity, the electrical resistivity is evaluated based on the so-called slow decay. Through investigations, the inventors have found that the slow decay is also affected by the in-film defects in the oxide semiconductor thin film. Hence, the electrical resistivity, which is measured and evaluated based on the μ-PCD method, is also varied depending on the number of the in-film defects. The electrical resistivity of the oxide semiconductor thin film may be varied due to contamination or impurities even in the same plane, and thus the value of the electrical resistivity varies depending on measurement points. To perform proper quality control of the oxide semiconductor thin film, therefore, it is important that a measurement point by the μ-PCD method is substantially equal to a measurement point by the electrical resistivity measuring means.

If the evaluation system therefore has an electrical resistance measuring means, the two types of measurement can be easily and accurately performed at substantially the same point only by appropriately moving the X-Y stage. Hence, if the evaluation system having the electrical resistance measuring means is used in a manufacturing line for a liquid crystal display or the like, productivity is significantly improved, allowing further proper quality control of the oxide semiconductor thin film.

An apparatus configuration having the electrical resistance measuring means is described with reference to FIG. 14. FIG. 14 illustrates an apparatus including the apparatus of FIG. 13 that measures and evaluates the change in reflectance and the electrical resistivity based on the above-described μ-PCD method, and an electrical resistance measuring means 30 added to the apparatus of FIG. 13. The electrical resistance measuring means 30 may not be necessarily provided. Although the electrical resistance measuring means 30 may not be mounted at a limited position, but is desirably mounted such that the electrical resistivity can be measured by the electrical resistance measuring means 30 at substantially the same point as the microwave photoconduction measurement point on the oxide semiconductor thin film by moving the X-Y stage 11 as described above. The electrical resistance measuring means 30 preferably includes an electrical resistivity measuring head 31 and an up-and-down means 32 for the electrical resistivity measuring head 31. The electrical resistivity of the sample 20 can be measured by the electrical resistance measuring means 30.

The electrical resistivity measuring head 31 is a means for measuring the electrical resistivity by a contact method. The electrical resistivity measuring head 31 has a resistance measuring terminal corresponding to the above-described resistance measuring means. The resistance measuring terminal exemplarily includes a measuring probe such as a double ring electrode, and a head including four needle electrodes arranged on a straight line. The electrical resistivity of the oxide semiconductor thin film can be determined through resistance measurement using the double ring electrode in accordance with JIS K6911, or resistance measurement by a four probe method in accordance with JIS K7194.

The up-and-down means 32 of the electrical resistivity measuring head 31 is an up-and-down mechanism that lowers the electrical resistivity measuring head to a desired position for measurement of the electrical resistivity of the sample 20. Any known electrical resistivity measuring apparatus can be used as a means for measuring the electrical resistivity. For example, when an electrical resistance measuring apparatus such as Hiresta from Mitsubishi Chemical Analytech Co., Ltd. is used, a probe corresponding to the electrical resistivity measuring head 31 should be lowered by the up-and-down means 32 so as to come into contact with the surface of the sample 20 for measurement of electrical resistance, and then be raised so as to be released from contact with the sample 20. The measured electrical resistivity can be sent for evaluation to an undepicted evaluation means, which has, for example, a configuration similar to that of the evaluation means 9, through a measured-value transmission line 33. In addition, the electrical resistivity can be evaluated by an electrical resistance measuring apparatus such as a probe head from JANDEL.

Manufacturing Method of Thin Film Transistor

Furthermore, the evaluation method is applied to a manufacturing method of TFT, making it possible to manufacture TFT including an oxide semiconductor thin film, in which the in-film defects and the interfacial defects are decreased.

TFT includes, on a substrate, a gate insulating film, an oxide semiconductor thin film, a protective film provided on the surface of the oxide semiconductor thin film, and source and drain electrodes. The oxide semiconductor thin film of the TFT should be formed at the condition determined based on the evaluation of the first step, and the protective film should be formed at the condition determined based on the evaluation of the second step.

As described above, the electronic state of the oxide semiconductor thin film can be measured by either of the contact method and the noncontact method, and the failure caused by the in-film defect or the failure caused by the interfacial defect can be evaluated. Consequently, according to the manufacturing method of TFT, a manufacturing condition, which allows the in-film defects and the interfacial defects to be decreased, can be appropriately determined through an appropriate combination of the contact method and the noncontact method.

This application claims the benefit of priority of Japanese Patent Application JP 2014-146337 filed on Jul. 16, 2014, the entire contents of which are incorporated herein by reference.

EXAMPLES

Although the invention is now described in detail with Examples, the invention should not be limited thereto, and it will be appreciated that modifications or alterations thereof may be made within the scope without departing from the gist described before and later, all of which are included in the technical scope of the invention.

Example 1-1

In Example 1, the following experiment was conducted to evaluate a correlation between a lifetime value calculated based on the μ-PCD method and stress resistance ($\Delta V_{th}$) of each of oxide semiconductor thin films (InGaZnO and IGZO herein). In this Example and Examples as described later, a reciprocal of a slope obtained by logarithmic conversion of a decay curve of reflected-wave intensity ranging from 1/e to $1/e^2$ of the maximum of the microwave reflection intensity was calculated as the lifetime value.

(1) Preparation of Sample for Lifetime Value Measurement

IGZO was deposited as an oxide semiconductor thin film on a glass substrate (EAGLE XG from Corning) having a diameter of 100 mm and a thickness of 0.7 mm by a sputtering process at the following condition.

Sputtering apparatus: "CS-200" from ULVAC, Inc.
Sputtering target composition: $InGaZnO_4$ (In:Ga:Zn=1:1:1 (atomic ratio))
Substrate temperature: Room temperature
Thickness of oxide semiconductor thin film: 40 nm
Added amount of oxygen: $O_2/(Ar+O_2)=4\%$ (volume ratio)
Gas pressure: 1 mTorr Subsequently, various samples were prepared while a condition of pre-annealing was varied to vary $\Delta V_{th}$ of the oxide semiconductor thin film. Specifically, the pre-annealing condition was fixed except for pre-annealing time, i.e., fixed to 350° C. under atmospheric pressure in the atmosphere, and pre-annealing time was varied from 0 to 120 min as shown in Table 1, so that various samples were produced.

Each of the samples produced in this way was subjected to lifetime measurement by the μ-PCD method using an apparatus having a configuration as illustrated in FIG. 13. Specifically, the μ-PCD method was performed at the following condition, and thus change in reflectance was measured.

Laser wavelength: 349 nm ultraviolet light
Pulse width: 15 ns
Pulse energy: 1 μJ/pulse
Beam diameter: 1.5 mmϕ
Number of pulses for each measurement=64 shots
Evaluator: LTA-1820SP (from Kobelco Research Institute, Inc)

FIG. 16A shows results of the measurement based on the μ-PCD method. In FIG. 16A, "Signal (mV)" in ordinate represents reflection intensity in the μ-PCD method.

Furthermore, Table 1 shows an analysis result of the peak value as the maximum of the reflected wave of the microwave from the oxide semiconductor thin film and the lifetime value, which are obtained from FIG. 16A.

TABLE 1

| Annealing time (min.) | Peak value (mV) | Lifetime value (μs) |
|---|---|---|
| 0 | 487 | 0.541 |
| 5 | 445 | 0.153 |
| 30 | 491 | 0.131 |
| 60 | 488 | 0.126 |
| 120 | 440 | 0.131 |

Such results reveal that as the pre-annealing time increases from 0 to 60 min, defects in the oxide semiconductor thin film decrease and thus carrier traps decrease; hence, the lifetime value decreases. However, if the pre-annealing time is excessively long, 120 min, Zn comes out from the film; hence, the defects increase, and the lifetime value increases.

Figure 4:
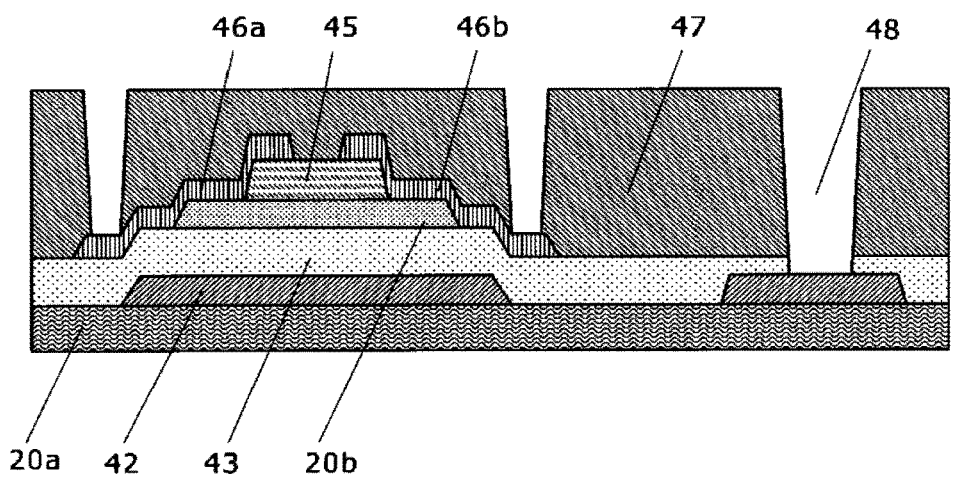
FIG. 4 is a schematic diagram illustrating a structure of an oxide semiconductor TFT used in Examples.

(2) Preparation of TFT Sample for Measuring TFT Characteristics and Stress Resistance TFT as illustrated in FIG. 4 was manufactured to check the TFT characteristics of each sample prepared in (1), and the TFT characteristics and the stress resistance of each sample were evaluated.

A Mo thin film 100 nm thick as a gate electrode and a $SiO_2$ film 200 nm thick as a gate insulating film were sequentially formed on a glass substrate (EAGLE 2000 from Corning) having a diameter of 100 mm and a thickness of 0.7 mm. The gate electrode was formed by a DC sputter process using a pure Mo sputtering target.

In the sputtering condition, substrate temperature was room temperature, and gas pressure was 2 mTorr. The gate insulating film was formed by a plasma CVD process with a carrier gas including a mixed gas of $SiH_4$ and $N_2O$, where $N_2O$ was 100 sccm, $SiH_4$ was 4 sccm, and $N_2$ was 36 sccm, deposition power of 300 W, and deposition temperature of 320° C.

Subsequently, IGZO was deposited as the oxide semiconductor thin film by a sputtering process at the same condition as that for the sample prepared in (1).

The oxide semiconductor thin film was formed in the above manner, and was then patterned by photolithography and wet etching. "ITO-07N" from Kanto Chemical Co., Ltd was used as the etchant solution.

The oxide semiconductor thin film was patterned in this way, and was then subjected to pre-annealing at the same condition as that for the sample prepared in (1).

Subsequently, pure Mo was deposited 100 nm in thickness by a DC sputtering process, and was then patterned to form source and drain electrodes. The formation method and the patterning method of the pure Mo film were the same as those for the gate electrode. Channel length and channel width of the TFT were adjusted to 10 μm and 200 μm, respectively.

The source and drain electrodes were thus formed, and then the protective film for protecting the oxide semiconductor thin film was formed. A stacked film of $SiO_2$ 200 nm thick and SiN 200 nm thick was used as the protective film. The $SiO_2$ and SiN were each deposited by a plasma CVD process using "PD-220NL" from Samco Inc. In this Example, plasma treatment was performed with $N_2O$ gas, and then the $SiO_2$ film and the SiN film were sequentially formed. The $SiO_2$ film was formed using a mixed gas of $N_2O$ and $SiH_4$. The SiN film was formed using a mixed gas of $SiH_4$, $N_2$, and $NH_3$. In each case, deposition power was 100 W and deposition temperature was 150° C.

Subsequently, a contact hole for probing for evaluation of transistor characteristics was formed in the protective film by photolithography and dry etching, and thus TFTs were produced.

For each of the TFTs produced in this way, (I) I-V characteristics as the transistor characteristics and (II) a variation $\Delta V_{th}$ in threshold voltage $V_{th}$ before and after stress application were investigated.

(I) Measurement of Transistor Characteristics: I-V Characteristics

The transistor characteristics were measured with a semiconductor parameter analyzer "4156C" from National Instruments Corporation. Detailed measurement conditions were as follows.

Source voltage: 0 V
Drain voltage: 10 V
Gate voltage: −30 to 30 V (measurement interval: 1 V)

(II) $\Delta V_{th}$ was Evaluated as Stress Resistance.

In this Example, a stress application test, in which the gate electrode is irradiated with light while receiving a negative bias, was performed to simulate stress environment during actual panel drive. A stress application condition was as follows. A light wavelength of about 400 nm, which is near a bandgap of the oxide semiconductor and tends to cause variations in transistor characteristics, was selected.

Gate voltage: −20 V
Substrate temperature: 60° C.
Light stress
Light source: White light source
Intensity of light applied to TFT in luminance: 25, 000 NIT
Light irradiation apparatus: YSM—1410 from Yang Electronics Co.
Stress application time: Two hours The threshold voltage roughly corresponds to a value of a gate voltage when a transistor shifts from an off state, i.e., a state of low drain current, to an on state, i.e., a state of high drain current. In this Example, a voltage at a drain current around 1 nA between an on current and an off current was defined as threshold voltage $V_{th}$, and the amount of change in threshold voltage $\Delta V_{th}$ before and after stress application was measured. The smaller the $\Delta V_{th}$, the better the stress resistance.

FIG. 16B illustrates a relationship between pre-annealing time and $\Delta V_{th}$ (● in the drawing) and a relationship between pre-annealing time and a lifetime value (Δ in the drawing).

FIG. 16B reveals that such relationships show similar profiles, and thus behaviors of the $\Delta V_{th}$ and the lifetime value are equivalent to each other. In other words, it has been proved that using the evaluation method based on the lifetime value of the invention allows the stress resistance of TFT to be indirectly and accurately evaluated.

Example 1-2

In this Example, the following experiment was conducted to check whether the evaluation method of the invention can evaluate stress resistance during a step of forming the oxide semiconductor thin film on the previously formed gate insulating film Specifically, various samples were prepared through varying hydrogen concentration in the gate insulating film and varying gas pressure during formation of the oxide semiconductor thin film as shown in Table 2 to vary $\Delta V_{th}$ of the oxide semiconductor thin film.

(1) Preparation of Sample for Lifetime Value Measurement

First, (i) a two-layer structure of $SiO_2$ stacked film and (ii) a three-layer structure of $SiO_2$/SiN stacked film, the structures having different in-film hydrogen amounts, were each deposited as the gate insulating film on a glass substrate (EAGLE 2000 from Corning) having a diameter of 100 mm and a thickness of 0.7 mm by a plasma CVD process. Detailed formation conditions of the gate insulating films were as follows.

(i) $SiO_2$ Stacked Film Having in-Film Hydrogen Amount of 1.2 at %

First Layer: Gate Insulating Film Side, $SiO_2$ Layer
  Carrier gas: $N_2O$=100 sccm, $SiH_4$=6 sccm, $N_2$=54 sccm
  Gas pressure: 133 Pa
  Deposition power: 100 W
  Deposition temperature: 320° C.
  Thickness: 150 nm Second Layer: Semiconductor Side, $SiO_2$ Layer
  Carrier gas: $N_2O$=100 sccm, $SiH_4$=2.2 sccm, $N_2$=19.8 sccm
  Gas pressure: 200 Pa
  Deposition power: 300 W
  Deposition temperature: 320° C.
  Thickness: 100 nm (ii) $SiO_2$/SiN Stacked Film Having in-Film Hydrogen Amount of 4.3 at %

First Layer: Gate Insulating Film Side, SiN Layer
  Carrier gas: $NH_3$=100 sccm, $SiH_4$=30.4 sccm, $N_2$=321.6 sccm
  Gas pressure: 200 Pa
  Deposition power: 100 W
  Deposition temperature: 320° C.
  Thickness: 350 nm Second Layer: Middle, SiN Layer
  Carrier gas: $NH_3$=100 sccm, $SiH_4$=22 sccm, $N_2$=677 sccm
  Gas pressure: 160 Pa Deposition power: 100 W
Deposition temperature: 320° C.
Thickness: 50 nm
Third Layer: Semiconductor Side, SiO$_2$ Layer
　Carrier gas: N$_2$O=375 sccm, SiH$_4$=8.4 sccm, N$_2$=75.6 sccm
　Gas pressure: 200 Pa
　Deposition power: 100 W
　Deposition temperature: 320° C.
　Thickness: 50 nm Subsequently, IGZO was deposited as the oxide semiconductor thin film by a sputtering process. Specifically, the oxide semiconductor thin film was formed as in the above-described (1) of Example 1-1 except that gas pressure during IGZO deposition was varied as shown in Table 2.

Subsequently, pre-annealing was performed for 60 min at 350° C. in the atmosphere, so that the following samples 1 to 3 were produced.

Sample 1: (i) Two-layer structure of SiO$_2$ stacked film having in-film hydrogen amount of 1.2 at %
　(Gas pressure during IGZO: 1 mTorr)
Sample 2: (ii) Three-layer structure of SiO$_2$/SiN stacked film having in-film hydrogen amount of 4.3 at %
　(Gas pressure during IGZO: 1 mTorr)
Sample 3: (ii) Three-layer structure of SiO$_2$/SiN stacked film having in-film hydrogen amount of 4.3 at %
　(Gas pressure during IGZO: 5 mTorr)

Figure 18:
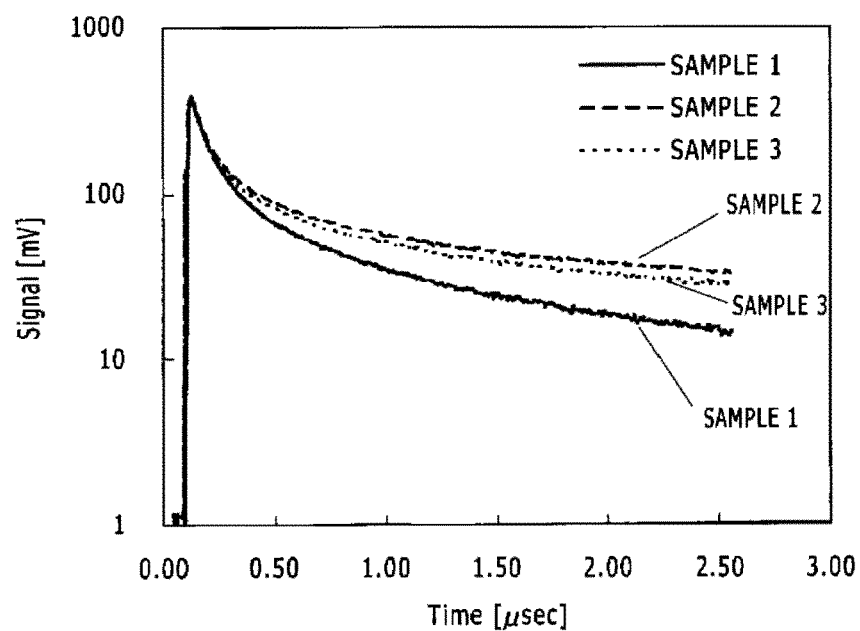
FIG. 18 is a graph illustrating measurement results of samples 1 to 3 by the μ-PCD method in Example 1-2.

Subsequently, the μ-PCD method was performed for each of the samples 1 to 3 in the same way as Example 1. FIG. 18 shows results of the measurement.

(2) Preparation of TFT Sample for Measuring Stress Resistance

The TFT as illustrated in FIG. 4 was manufactured to check the stress resistance of each of the samples 1 to 3 prepared in (1). Specifically, the TFTs were manufactured in the same way as the samples of (2) of Example 1-1 except that gate insulating conditions and gas pressure conditions during IGZO deposition corresponding to the samples 1 to 3 were performed to fabricate TFTs corresponding to the respective samples 1 to 3, and a shift amount of threshold voltage $\Delta V_{th}$ was measured. Table 2 shows results of the lifetime value and $\Delta V_{th}$ of each sample.

TABLE 2

| Sample | Hydrogen amount in gate insulating film (at %) | Gas pressure during formation of oxide semiconductor thin film (mTorr) | Lifetime value (μm) | Threshold voltage shift amount ΔVth (V) |
|---|---|---|---|---|
| 1 | 1.2 | 1 | 0.40 | 1.75 |
| 2 | 4.3 | 1 | 1.11 | 5.25 |
| 3 | 4.3 | 5 | 0.90 | 4.00 |

These results reveal that the lifetime value and $\Delta V_{th}$ show similar behaviors as with Example 1-1.

In detail, FIG. 18 reveals that there is a good correlation between the hydrogen amount in the gate insulating film and the lifetime value, and each of the samples 2 and 3, which has a larger hydrogen amount than the sample 1, has a larger lifetime value than the sample 1. Table 2 reveals that as the hydrogen amount in the gate insulating film increases, $\Delta V_{th}$ increases, and stress resistance is deteriorated. This proved that deterioration in stress resistance caused by the hydrogen amount in the gate insulating film can be evaluated well.

To compare the sample 2 to the sample 3, there is shown an example of different gas pressures during IGZO deposition but the same hydrogen amount in the gate insulating film. The lifetime value and $\Delta V_{th}$ of the sample 3 having a larger gas pressure than the sample 2 are each lower than that of the sample 2. This is because if the gas pressure during IGZO deposition increases, film density decreases and defects increase, and thus the lifetime value increases, leading to deterioration in stress resistance. It is therefore proved that when the evaluation method of the invention is used, deterioration in stress resistance caused by gas pressure during IGZO deposition can also be accurately evaluated.

Example 1-3

In this Example, the evaluation elements 1 to 3 illustrated in FIGS. 6, 8, and 9 were used to conduct the following experiment to check whether it is possible to evaluate stress resistance in each of the steps of:

after formation of the gate insulating film, forming the oxide semiconductor thin film on the gate insulating film (FIG. 6), further forming the etch stop layer on the oxide semiconductor thin film (FIG. 8), and further forming the passivation film on the etch stop layer (FIG. 9).

The evaluation element 1 in Example 1-3 is different from Example 1-2, in which the oxide semiconductor thin film is not patterned, in that the oxide semiconductor thin film is patterned.

(1) Manufacturing of Element for Measurement of Lifetime Value

The following evaluation elements 1 to 3 were manufactured on a glass substrate without forming gate electrodes.
　Evaluation element 1: Evaluation element of FIG. 6
　Evaluation element 2: Evaluation element of FIG. 8
　Evaluation element 3: Evaluation element of FIG. 9

Manufacturing conditions of the evaluation elements 1 to 3 are as follows.

(1-1) Manufacturing of Evaluation Element 1

A Mo thin film 100 nm thick as the gate electrode and a SiO$_2$ film 200 nm in thickness as the gate insulating film were sequentially formed on the same glass substrate as that in Example 1-2. The gate electrode was formed by a DC sputter process using a pure Mo sputtering target. In the sputtering condition, substrate temperature was room temperature, and gas pressure was 2 mTorr. The gate insulating film was formed by a plasma CVD process with a carrier gas including a mixed gas of SiH$_1$ and N$_2$O, where N$_2$O was 100 sccm and SiH$_1$/N$_2$ was 4/36 sccm, pressure of 200 Pa, deposition power of 300 W, and deposition temperature of 320° C.

Subsequently, the oxide semiconductor thin film was formed by a sputtering process at the same condition as in Example 1-1.

The formed oxide semiconductor thin film was patterned by photolithography and wet etching as in Example 1-1. In this Example, size of the patterned oxide semiconductor thin film, which corresponded to size of the oxide semiconductor thin film illustrated in FIG. 6, was adjusted to 15 mm square.

The oxide semiconductor thin film was thus patterned, and was then subjected to pre-annealing in the same way as in Example 1-1 except that pre-annealing time was 60 min.

(1-2) Manufacturing of Evaluation Element 2

The protective film called etch stop layer (ESL) was formed on the evaluation element 1 produced in the above manner to manufacture the evaluation element 2. A formation condition of the protective film was as follows.

Carrier gas: $N_2O$=100 sccm, $SiH_4/N_2$=4/36 sccm
 Gas pressure: 133 Pa
 Deposition power: 100 W
 Deposition temperature: 230° C.
 Thickness: 100 nm (1-3) Manufacturing of Evaluation Element 3

The protective film called passivation film (PV) was formed on the evaluation element 2 produced in the above manner. The passivation film includes a stacked film of a first layer $SiO_2$ and a second layer SiN in order from a side close to the substrate. A formation condition of the passivation film was as follows.

Figure 19:
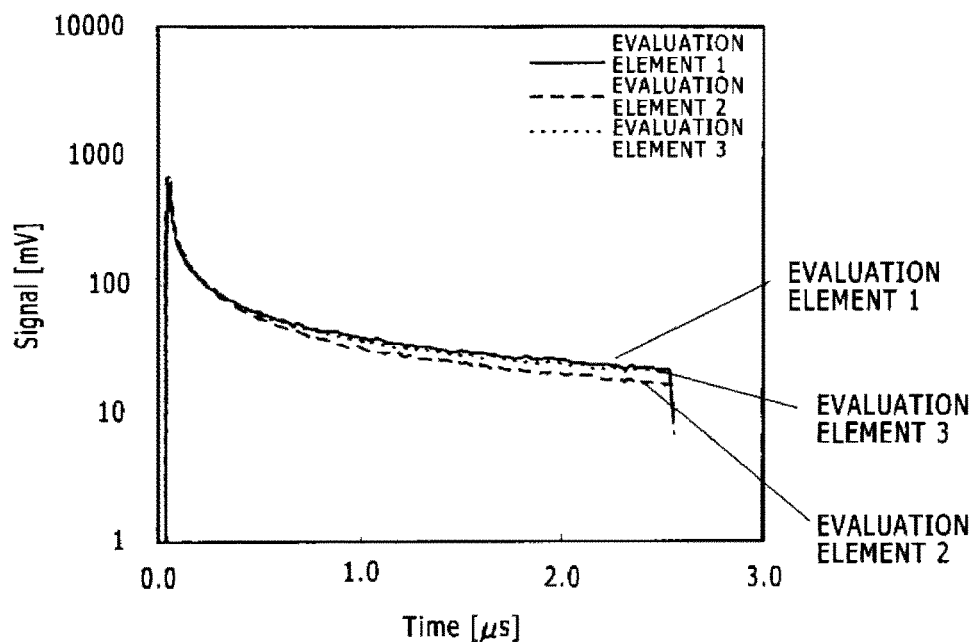
FIG. 19 is a graph illustrating measurement results of evaluation elements 1 to 3 by the μ-PCD method in Example 1-3.

First Layer
 Carrier gas: $N_2O$=100 sccm, $SiH_4/N_2$=4/36 sccm
 Gas pressure: 133 Pa
 Deposition power: 100 W
 Deposition temperature: 150° C.
 Thickness: 100 nm Second Layer
 Carrier gas: $N_2O$=100 sccm, $SiH_4$=12.5 sccm, $N_2$=297.5 sccm.
 Gas pressure: 133 Pa
 Deposition power: 100 W
 Deposition temperature: 150° C.
 Thickness: 150 nm Subsequently, the evaluation elements 1 to 3 produced in this way were subjected to lifetime measurement by the µ-PCD method as in Example 1-1. FIG. 19 shows results of the measurement.

Furthermore, Table 3 shows an analysis result of a peak value as the maximum of the reflected wave of the microwave from the oxide semiconductor thin film and a lifetime value, which are obtained from FIG. 19.

TABLE 3

|  | Peak value (mV) | Lifetime value (µs) |
| --- | --- | --- |
| Evaluation element 1 | 586 | 0.248 |
| Evaluation element 2 | 680 | 0.173 |
| Evaluation element 3 | 662 | 0.193 |

Table 3 reveals that the lifetime value of each of the evaluation elements 2 and 3 is smaller than that of the evaluation element 1. This is probably because, for the evaluation elements 2 and 3, defects formed in the surface of the oxide semiconductor thin film are repaired by the etch stop layer as an insulating film formed on the surface of the oxide semiconductor thin film.

In this way, even if the protective film such as the etch stop layer or the passivation film was formed as in the evaluation elements 2 and 3, it was possible to observe change in a waveform of microwave reflection from the oxide semiconductor thin film, the change being caused by formation of the protective film. This proves that when the evaluation method of the invention is used, not only the evaluation element 1 having no protective film but also the evaluation elements 2 and 3 each having the protective film can be used as evaluation elements for embodying the evaluation method of the invention.

Example 1-4

In this Example, following evaluation elements, which were each similar to the evaluation element 3 in Example 1-3 but having a different patterning size, were used to conduct a similar experiment.

(1) Manufacturing of Element for Measurement of Lifetime Value

Evaluation element 1: Patterning size 15 mm square: The same as the evaluation element 3 in Example 1-3.
Evaluation element 2: Not patterned.
Evaluation element 3: Patterning size 5 mm square.

The evaluation element 2 was manufactured as in the evaluation element 3 in Example 1-3 except that patterning was not performed.

The evaluation element 2 was manufactured as in the evaluation element 3 in Example 1-3 except for having a patterning size of 5 mm square. The patterning size was adjusted using masks having different pattern sizes.

Figure 20:
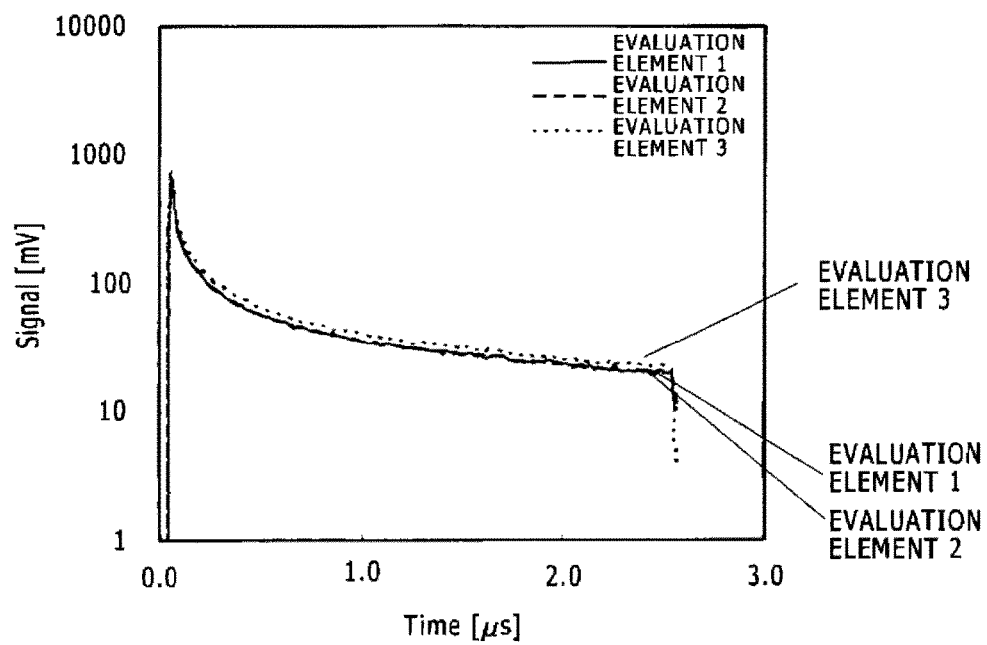
FIG. 20 is a graph illustrating measurement results of evaluation elements 1 to 3 by the μ-PCD method in Example 1-4.

Subsequently, the evaluation elements 1 to 3 were subjected to lifetime measurement by the µ-PCD method as in Example 1-1. FIG. 20 shows results of the measurement.

Furthermore, Table 4 shows an analysis result of a peak value and a lifetime value obtained from FIG. 20.

TABLE 4

|  | Peak value (mV) | Lifetime value (µs) |
| --- | --- | --- |
| Evaluation element 1 | 662 | 0.193 |
| Evaluation element 2 | 667 | 0.194 |
| Evaluation element 3 | 627 | 0.193 |

Table 4 reveals that the peak values or the lifetime values of the evaluation elements 1 to 3 are roughly at the same level. Specifically, it is proved that use of the evaluation method of the invention makes it possible to evaluate stress resistance regardless of presence of patterning or patterning size.

In particular, it is extremely useful that even if an element having a microwave waveguide size of smaller than 10 mm square, such as the evaluation element 3 having a patterning size of 5 mm square, is used, the evaluation method of the invention can also applied. This supports that when a plurality of evaluation elements are regularly arranged as illustrated in FIG. 12, quality control of the oxide semiconductor thin film, such as distribution in a glass substrate plane and distribution between glass substrates, can be accurately performed.

Example 1-5

In Example 1-5, the following experiment was conducted to evaluate a correlation between the lifetime value of the oxide semiconductor thin film and pre-annealing temperature dependence of the stress resistance $\Delta V_{th}$.

(1) Preparation of Sample for Measurement of Lifetime Value

An oxide semiconductor thin film was formed on a glass substrate as in the sample of (1) of Example 1-1 except that the added amount of oxygen was $O_2/(Ar+O_2)$=4% and 8% (volume ratio).

Subsequently, various samples were prepared while a condition of pre-annealing was varied to vary $\Delta V_{th}$ of the oxide semiconductor thin film. Specifically, pre-annealing condition was fixed except for pre-annealing temperature, i.e., fixed to 1 hr in the atmosphere, and pre-annealing temperature was varied: 250° C., 300° C., and 350° C., so that various samples were produced.

Each of the samples produced in this way was subjected to lifetime measurement by the µ-PCD method as in Example 1-1.

Figure 21A:
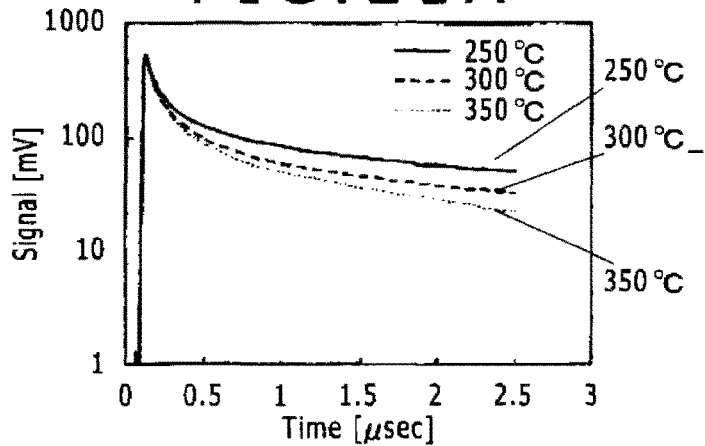
FIG. 21A is a graph illustrating measurement results by the μ-PCD method in Example 1-5 for an added amount of oxygen of 4%.
Figure 21B:
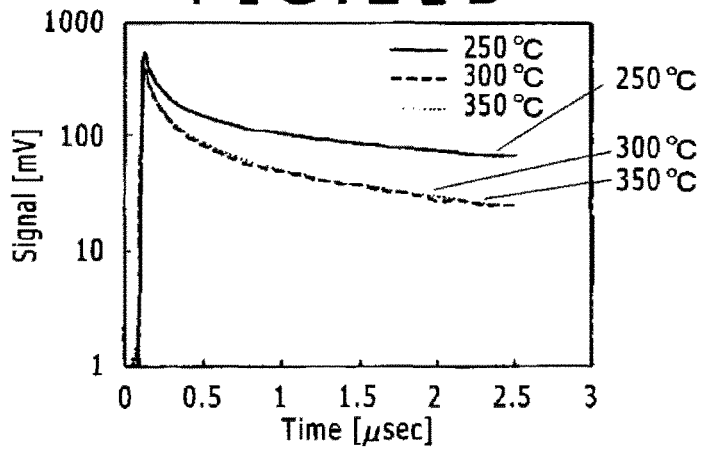
FIG. 21B is a graph illustrating measurement results by the μ-PCD method in Example 1-5 for an added amount of oxygen of 8%.

FIGS. 21A and 21B show the results of the measurement based on the μ-PCD method. FIG. 21A shows the measurement result for the added oxygen amount of 4%, and FIG. 21B shows the measurement result for the added oxygen amount of 8%. As illustrated in the drawings, as the pre-annealing temperature increases, defects in the oxide semiconductor thin film decrease and carrier traps decrease, and thus the lifetime value becomes smaller.

(2) Preparation of TFT Sample for Measuring TFT Characteristics and Stress Resistance TFT as illustrated in FIG. 4 was manufactured as in the sample of (2) of Example 1-1 except for the following condition to check the TFT characteristics of each sample prepared in (1). Each of the manufactured TFTs was investigated in (I) I-V characteristic and (II) $\Delta V_{th}$ as in Example 1-1. The TFT characteristics and the stress resistance of each TFT were evaluated.

A Mo thin film 100 nm thick as a gate electrode and a $SiO_2$ film 200 nm thick as a gate insulating film were sequentially formed on a glass substrate (EAGLE 2000 from Corning) having a diameter of 100 mm and a thickness of 0.7 mm. The gate electrode was formed by a DC sputtering process using a pure Mo sputtering target. In the sputtering condition, substrate temperature was room temperature, and gas pressure was 2 mTorr. The gate insulating film was formed by a plasma CVD process with a carrier gas including a mixed gas of $SiH_4$ and $N_2O$, where $N_2O$ was 100 sccm, $SiH_4$ was 4 sccm, and $N_2$ was 36 sccm, deposition power of 300 W, and deposition temperature of 320° C.

Subsequently, an oxide semiconductor thin film was formed by a sputtering process. IGZO (In:Ga:Zn=1:1:1 (compositional ratio, atomic ratio)) was used for the oxide thin film. The apparatus used for the sputtering was "CS-200" from ULVAC, Inc., and the sputtering condition was as follows.

Substrate temperature: Room temperature
Gas pressure: 1 mTorr
Added amount of oxygen: $O_2/(Ar+O_2)$=4%, 8% (volume ratio)
Thickness: 40 nm The oxide semiconductor thin film was formed in the above manner, and was then patterned by photolithography and wet etching. "ITO-07N" from Kanto Chemical Co., Ltd was used as the etchant solution.

The oxide semiconductor thin film was patterned in this way, and was then subjected to pre-annealing at the same temperature condition as in (1) to improve film quality. The pre-annealing was performed for 60 min in the atmosphere.

Subsequently, a $SiO_2$ film 100 nm thick was formed as an etch stop layer by a plasma CVD process, and was then patterned by photolithography and dry etching.

Subsequently, pure Mo was deposited 100 nm in thickness by a DC sputtering process, and was then patterned to form source and drain electrodes. The formation method and the patterning method of the pure Mo film were the same as those for the gate electrode. Channel length and channel width of the TFT were adjusted to 10 μm and 200 μm, respectively.

The source and drain electrodes were thus formed, and then the protective film for protecting the oxide semiconductor thin film was formed. A stacked film of $SiO_2$ 200 nm thick and SiN 200 nm thick was used as the protective film. The $SiO_2$ and SiN were each deposited by a plasma CVD process using "PD-220NL" from Samco Inc. In this Example, the $SiO_2$ film and the SiN film were sequentially formed. The $SiO_2$ film was formed using a mixed gas of $N_2O$ and $SiH_4$. The SiN film was formed using a mixed gas of $SiH_4$, $N_2$, and $NH_3$. In each case, deposition power was 100 W and deposition temperature was 150° C.

Subsequently, a contact hole for probing for evaluation of transistor characteristics was formed in the protective film by photolithography and dry etching, and thus TFTs were produced.

For each of the TFTs produced in this way, (I) transistor characteristics and (II) a variation $\Delta V_{th}$ in threshold voltage $V_{th}$ before and after stress application were investigated.

Figure 22A:
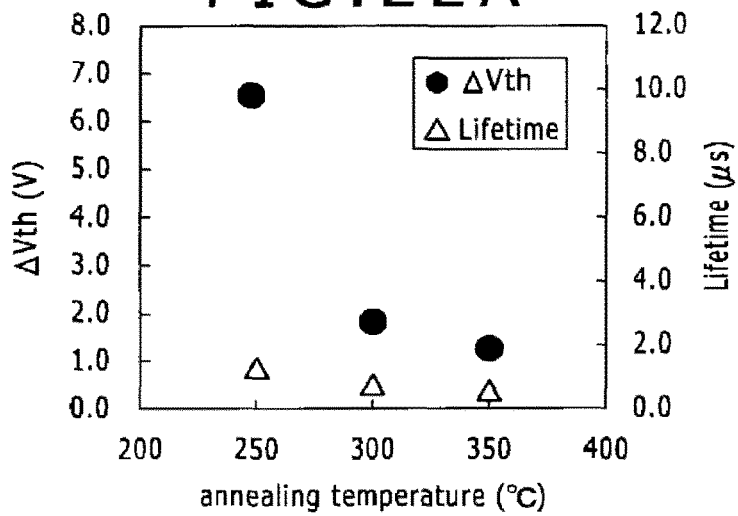
FIG. 22A is a graph illustrating a relationship between pre-annealing temperature and $\Delta V_{th}$ or lifetime in Example 1-5, showing the measurement results at an added amount of oxygen of 4%.
Figure 22B:
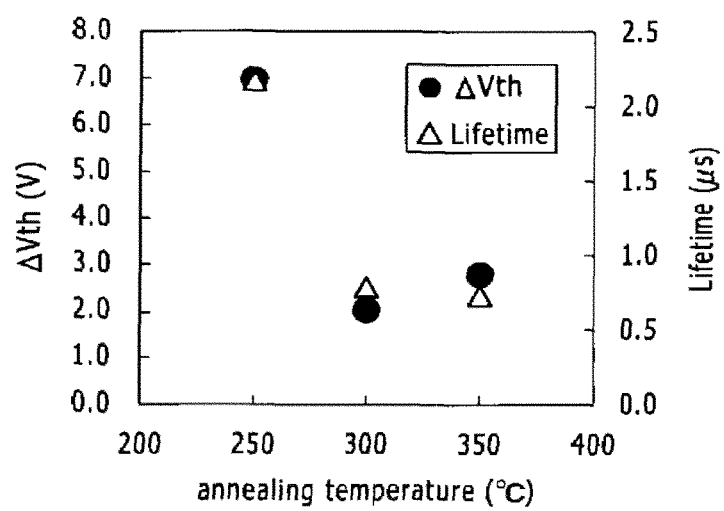
FIG. 22B is a graph illustrating a relationship between pre-annealing temperature and $\Delta V_{th}$ or lifetime in Example 1-5, showing the measurement results at an added amount of oxygen of 8%.

FIGS. 22A and 22B each illustrate a relationship between pre-annealing time and $\Delta V_{th}$ (● in the drawing) and a relationship between pre-annealing time and a lifetime value (Δ in the drawing). FIG. 22A shows a relationship for an added amount of oxygen of 4%, and FIG. 22B shows a relationship for an added amount of oxygen of 8%.

FIGS. 22A and 22B reveal that such relationships show similar profiles, and thus behaviors of $\Delta V_{th}$ and the lifetime value are equivalent to each other. In other words, it has been proved that using the evaluation method based on the lifetime value of the invention allows the stress resistance of TFT to be indirectly and accurately evaluated.

Example 1-6

In Example 1-6, the following experiment was conducted to evaluate a correlation between the lifetime value and the stress resistance $\Delta V_{th}$ for an oxide semiconductor film including a protective film on a surface of an oxide semiconductor thin film.

(1) Preparation of Sample for Measurement of Lifetime Value

An oxide semiconductor thin film was formed on a glass substrate as in the sample of (1) of Example 1-1.

Subsequently, the oxide semiconductor thin film was subjected to pre-annealing for 1 hr at 350° C. in the atmosphere.

Furthermore, $SiO_2$ was deposited as a protective film on the oxide semiconductor thin film. The $SiO_2$ was deposited by a plasma CVD process using "PD-220NL" from Samco Inc. A deposition condition is as follows. Deposition was performed with different deposition temperatures, and three types of samples were produced.

Carrier gas: $N_2O$=100 sccm, $SiH_4$=4 sccm, and $N_2$=36 sccm
Gas pressure: 133 Pa
Deposition power: 100 W
Deposition temperature: 150° C., 200° C., 230° C.
Thickness: 100 nm Each of the samples produced in this way was subjected to lifetime measurement by the μ-PCD method as in Example 1-1.

Figure 23:
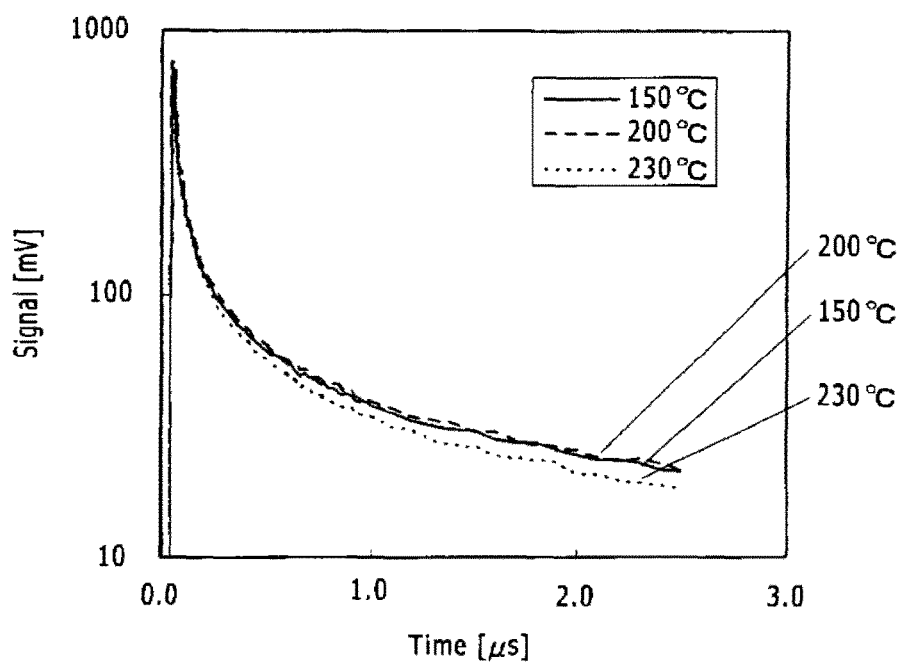
FIG. 23 is a graph illustrating measurement results by the μ-PCD method in Example 1-6.

FIG. 23 shows the results of the measurement based on the μ-PCD method. As the deposition temperature of $SiO_2$ increases, the lifetime value decreases.

(2) Preparation of TFT Sample for Measuring TFT Characteristics and Stress Resistance TFT as illustrated in FIG. 4 was manufactured with the same deposition temperature of the protective film as each of those in (1) and by the same method as that for the sample of (2) of Example 1-1 to check the TFT characteristics of each sample prepared in (1), and the TFT characteristics and the stress resistance were evaluated.

Figure 24:
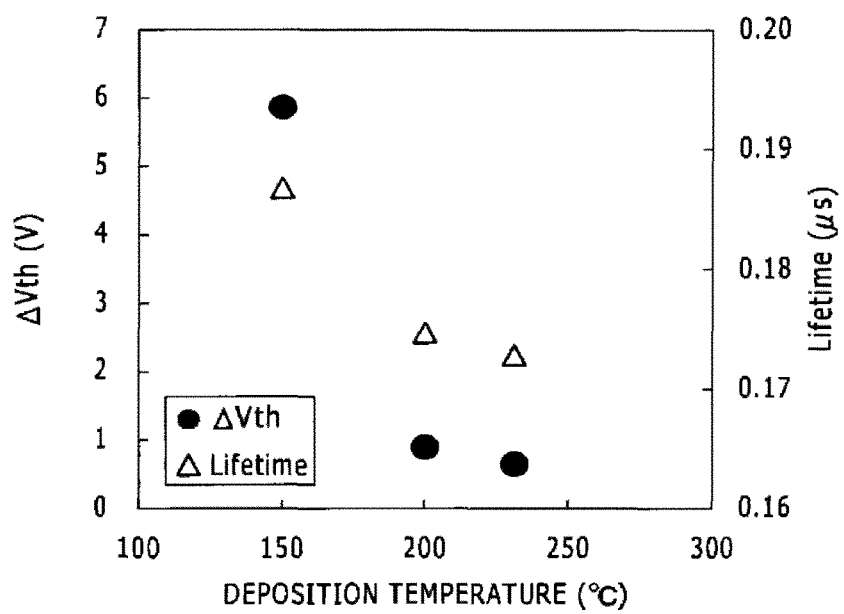
FIG. 24 is a graph illustrating a relationship between deposition temperature and $\Delta V_{th}$ or lifetime in Example 1-6.

FIG. 24 illustrates a relationship between deposition temperature and $\Delta V_{th}$ (● in the drawing) and a relationship between deposition temperature and a lifetime value (Δ in the drawing).

FIG. 24 reveals that such relationships show similar profiles, and thus behaviors of the $\Delta V_{th}$ and the lifetime value are equivalent to each other. In other words, it has been proved that using the evaluation method based on the lifetime value of the invention allows the stress resistance of TFT to be indirectly and accurately evaluated even for a sample with the protective film.

Example 1-7

In Example 1-7, samples as described below were prepared, and the following experiment was conducted to evaluate a correlation between the lifetime value, the peak value, and the stress resistance $\Delta V_{th}$.
(1) Preparation of Sample for Measurement of Lifetime Value A sample with deposition temperature of $SiO_2$ of 250° C. was added to the samples of Example 1-6, and the following four samples were produced. Any condition other than the deposition temperature of $SiO_2$ was the same as in Example 1-3.

Deposition temperature: 150° C., 200° C., 230° C., 250° C.

Figure 25:
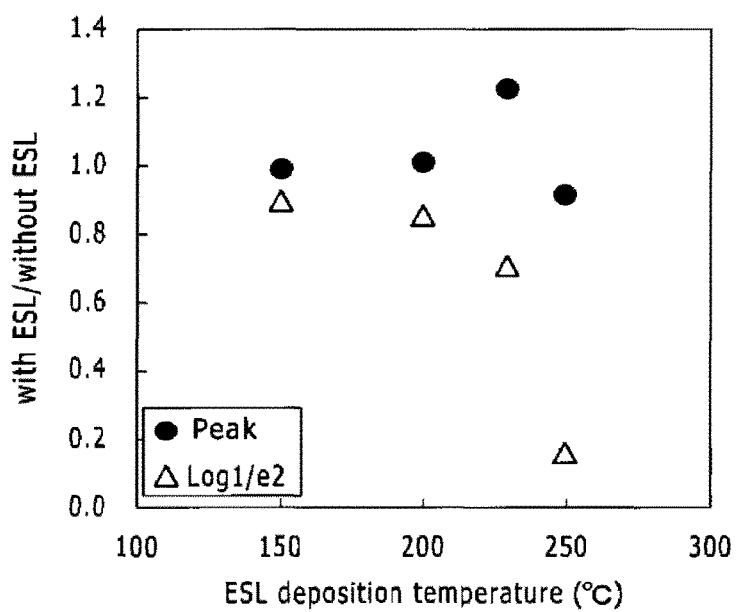
FIG. 25 is a graph illustrating results in Example 1-7, where abscissa represents a peak ratio and a lifetime ratio at presence or absence of a protective film.

The samples after formation of $SiO_2$ and the samples before formation of $SiO_2$ were subjected to lifetime measurement by the μ-PCD method as in Example 1-1. FIG. 25 shows results of the measurement. In FIG. 25, abscissa represents a peak ratio and a lifetime ratio between presence and absence of $SiO_2$.

FIG. 25 reveals that as the deposition temperature of $SiO_2$ increases, the lifetime ratio decreases. The peak ratio is maximized at 230° C., but is decreased at 250° C.
(2) Preparation of TFT Sample for Measuring TFT Characteristics and Stress Resistance TFT as illustrated in FIG. 4 was manufactured by the same method as that for the sample of (2) of Example 1-1 to check the TFT characteristics of each sample prepared in (1), and the TFT characteristics and the stress resistance were evaluated by the same method as that in Example 1-1.

Table 5 shows results of the deposition temperature of $SiO_2$, the peak value, the lifetime ratio, transistor operation, and $\Delta V_{th}$.

TABLE 5

| Deposition temperature (° C.) | Peak ratio | Lifetime value | Judgment | Transistor operation | $\Delta V_{th}(V)$ |
|---|---|---|---|---|---|
| 150 | 0.99 | 0.90 | F | P | 6.00 |
| 200 | 1.01 | 0.86 | P | P | 1.00 |
| 230 | 1.23 | 0.71 | P | P | 0.75 |
| 250 | 0.91 | 0.16 | F | F | — |

As shown in Table 5, at the deposition temperature of 250° C., carriers excessively increase, and resistance is reduced; hence, the transistor does not operate. Consequently, $\Delta V_{th}$ was not able to be evaluated (in Table 5, indicated as "-").

Criterion: In Table 5, "judgement" is made as follows: A sample having a peak ratio of 1.00 or more and a lifetime ratio of 0.90 or less is defined as pass (P). For a sample with judgement P, transistor operation meets acceptance criterion, and $\Delta V_{th}$ is 1.00 V or less. Any other sample is judged to be failure (F).

In other words, it has been proved that using the evaluation method based on the peak value and the lifetime value of the invention allows operation and the stress resistance of TFT to be indirectly and accurately evaluated.

Example 1-8

In Example 1-8, the same samples as the samples of (1) of Example 1-1 were used to investigate a correlation between lifetime values calculated by the following evaluations 1 to 3 and threshold shift.

Evaluation 1: A slope obtained by logarithmic conversion of reflected-wave intensity ranging from 1/e to $1/e^2$ of the maximum of the microwave reflection intensity as in Example 1-1

Evaluation 2: A lifetime value $\tau_2$ in the case where microwave reflection intensity is represented by Formula (3), and parameter fitting is performed Numerical Formula 3

$$n_1 \exp(-t/\tau_1) + n_2 \exp(-t/\tau_2) \quad (3)$$

In Formula (3), t is measurement time (s), $n_1$ and $n_2$ are each a constant, $\tau_1$ is lifetime of a carrier having a short time constant, and $\tau_2$ is lifetime of a carrier having a long time constant.

Evaluation 3: A lifetime value $\tau_2$ in the case where microwave reflection intensity is represented by Formula (4), and parameter fitting is performed.

Numerical Formula 4

$$n_1 \exp(-t/\tau_1) + n_2 \exp(-t/\tau_2)^\beta \quad (4)$$

In Formula (4), t is measurement time (s), $n_1$ and $n_2$ are each a constant, $\tau_1$ is lifetime of a carrier having a short time constant, $\tau_2$ is lifetime of a carrier having a long time constant, and $\beta$ is relaxation factor.

The above-described "the case where parameter fitting is performed" means the case where fitting is performed by inputting an appropriate value based on previous knowledge to each of $n_1$, $n_2$, $\tau_1$, and $\tau_2$ for Formula (3) or to each of $n_1$, $n_2$, $\tau_1$, $\tau_2$ and $\beta$ for Formula (4), and repeating calculation such that a correlation coefficient of Formula (3) as a whole or a correlation coefficient of Formula (4) as a whole is minimized. The same holds true in Example 1-9 as described later.

FIGS. 26A and 26B illustrate a relationship between pre-annealing time and $\Delta V_{th}$ (● in the drawing) and a relationship between pre-annealing time and $\tau_2$ (△ in the drawing). FIG. 26A shows $\tau_2$ obtained by the evaluation 2, and FIG. 26B shows $\tau_2$ obtained by the evaluation 3.

FIGS. 26A and 26B reveal that $\Delta V_{th}$ and $\tau_2$ show similar profiles as in Example 1-1, and thus behaviors of $\Delta V_{th}$ and $\tau_2$ are equivalent to each other. In other words, it has been proved that use of any one of the methods of the evaluations 1 to 3 allows the stress resistance of TFT to be evaluated.

Example 1-9

In Example 1-9, the same samples as the samples of Example 1 were used to investigate a correlation between lifetime values calculated by the following evaluations 1 to 3 and threshold shift.

Evaluation 1: A slope obtained by logarithmic conversion of reflected-wave intensity ranging from 1/e to $1/e^2$ of the maximum of the microwave reflection intensity as in Example 1-1

Evaluation 2: A lifetime value in the case where microwave reflectance is represented by Formula (5), and parameter fitting is performed: Parameter B Numerical Formula 5

$$y = A \times \exp^{(x/B)} (x\text{:measurement time}, y\text{:reflectance}) \quad (5)$$

Evaluation 3: A lifetime value in the case where microwave reflectance is represented by Formula (6), and parameter fitting is performed: Parameter C Numerical Formula 6

$$y = A \times x^C (x\text{:measurement time}, y\text{:reflectance}) \quad (6)$$

Figure 27B:
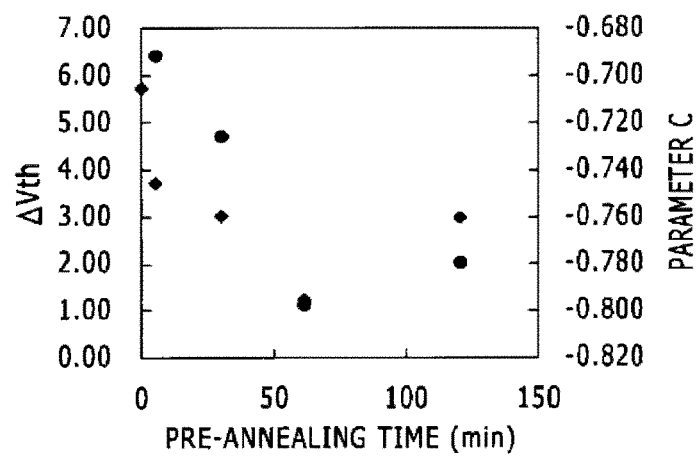
FIG. 27B is a graph illustrating results of Example 1-9, showing a relationship between pre-annealing time and $\Delta V_{th}$ (● in the drawing) and a relationship between pre-annealing time and parameter C (♦ in the drawing).

FIG. 27A illustrates a relationship between pre-annealing time and $\Delta V_{th}$ (● in the drawing) and a relationship between pre-annealing time and the parameter B (■ in the drawing) obtained by the pre-annealing time and the evaluation 2. FIG. 27B illustrates a relationship between pre-annealing time and $\Delta V_{th}$ (● in the drawing) and a relationship between pre-annealing time and the parameter C (♦ in the drawing) obtained by the pre-annealing time and the evaluation 3. In this Example, the measurement time in Formula (5) or (6) was 1 to 2 μs, in which deep-level recombination or apparatus noise is less likely to affect a microwave decay waveform.

Such drawings reveal that $\Delta V_{th}$, the parameter B, and the parameter C show similar profiles as in Example 1-1, and thus behaviors of $\Delta V_{th}$, the parameter B, and the parameter C are equivalent to one another. In other words, it has been proved that use of either of the methods of the evaluation 1 and the evaluation 2 allows the stress resistance of TFT to be evaluated. The results of the experiment also reveal that according to the invention, not only the lifetime value described in the above-described Examples but also the parameter B as the lifetime value calculated from the exponential function formula of Formula (5) and parameter (c) represented by the power-law shoulder of Formula (6) are each useful as a parameter for evaluating stress resistance of the oxide semiconductor thin film.

Example 1-10

As described in the Examples, the failure caused by the in-film defect in the oxide semiconductor thin film can be evaluated by the first step. An oxide semiconductor thin film having good quality, in which the in-film defects are decreased, can be selected from among a plurality of oxide semiconductor thin films based on the results of such evaluation. In this Example, it is confirmed that film quality of the oxide semiconductor thin film is affected by a manufacturing step. To maintain the good quality of the oxide semiconductor thin film after each manufacturing step, ΔP (PX1–PXn) was obtained with the parameter PX1 of the oxide semiconductor thin film, which was determined based on the evaluation of the first step, as a reference value, and thus the optimum manufacturing condition was investigated. Specifically, experiments were performed using samples prepared while the added amount of oxygen during formation of the oxide semiconductor thin film was varied to vary the parameter P.

(1) Preparation of Sample for Measurement of Lifetime Value $SiO_2$ 200 nm thick corresponding to the gate insulating film was deposited on the same glass substrate as that of the sample of (1) of Example 1-1. The gate insulating film was formed by a plasma CVD process with a carrier gas including a mixed gas of $SiH_4$ and $N_2O$, where $N_2O$ was 100 sccm and $SiH_4$ was 4 sccm, and $N_2$ was 36 sccm, pressure of 200 Pa, deposition power of 300 W, and deposition temperature of 320° C.

Oxide Semiconductor Thin Film Formation Step: (Also Mentioned as ASDEPO)

Subsequently, IGZO was deposited as the oxide semiconductor thin film by a sputtering process at the same condition as in Example 1-1 except for the added amount of oxygen. In this Example, a plurality of samples were prepared while the added amount of oxygen was varied as follows.

Added amount of oxygen: $O_2/(Ar+O_2)$=0%, 4%, 8%, 12%, 20% (volume ratio).

Pre-Annealing Step (Also Mentioned as PRE)

Subsequently, pre-annealing was performed. A pre-annealing condition was set to 1 hr at 350° C. in the atmosphere, which was extracted as the optimum condition from the evaluation in Example 1-1.

Etch Stop Layer Formation Step: (Also Mentioned as ESL)

Subsequently, an etch stop layer was formed on the oxide semiconductor thin film at the same condition as that for the evaluation element 2 in Example 1-3.

Passivation Film Formation Step: (Also Mentioned as PV)

Furthermore, a passivation film including a stacked film of a first layer $SiO_2$ and a second layer SiN was formed at the same condition as that for the evaluation element 3 in Example 1-3.

Post-Annealing Step: (Also Mentioned as PA)

After the passivation film was formed, heat treatment was performed as final annealing for 30 min at 250° C. in nitrogen atmosphere.

The μ-PCD method was performed as in Example 1-1 for the sample after each of the steps PRE, ESL, PV, and PA, and change in reflectance was measured. The results were analyzed, and the B value corresponding to a slope from 0.3 to 1 μs was calculated and defined as the parameter P corresponding to the slow decay of the parameter calculation step. PRE as parameter PX1, ESL as parameter PX2, PV as parameter PX3, and PA as parameter PX4 were plotted in FIG. 39A in correspondence to the respective steps.

Figure 39A:
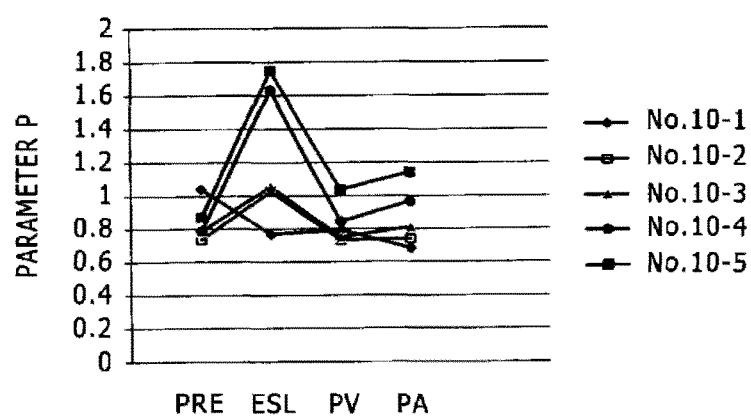
FIG. 39A is a graph, in which parameters corresponding to slow decays in various steps in Example 1-10 are plotted.
Figure 39B:
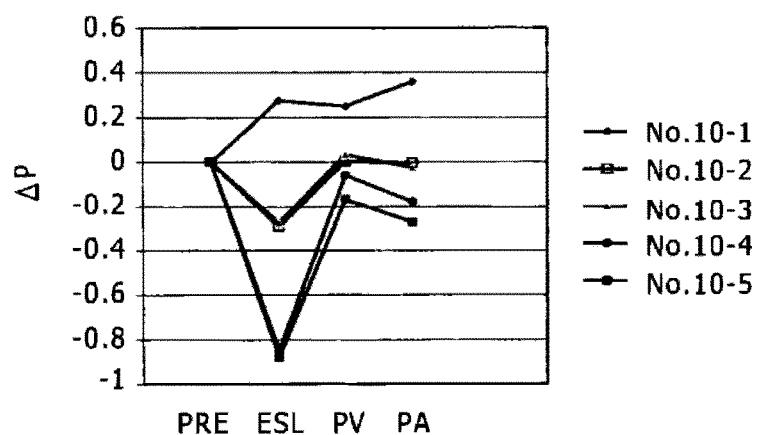
FIG. 39B is a graph, in which differences ΔP between the parameters corresponding to the slow decays in the steps in Example 1-10 are plotted.

The parameter PX1 was set as a reference value, i.e., ΔP1=0 was set, and a difference between the parameter PX1 and each of the parameters PX2 to PX4 (PX1–(PXn: n=2, 3, 4) was plotted as ΔPn (n=2, 3, 4) in FIG. 39B.

As shown in FIG. 39A, any of the oxide semiconductor thin films of PRE can be evaluated as an oxide semiconductor thin film having few in-film defects regardless of the added amount of oxygen. While each of the steps of ESL, PV, and PA was performed at the same manufacturing condition except for the added amount of oxygen, a variation range of the parameter P was varied depending on the added amount of oxygen. This reveals that quality of the oxide semiconductor thin film is affected by the added amount of oxygen.

(2) Preparation of TFT Sample for Measuring TFT Characteristics and Stress Resistance TFT as illustrated in FIG. 4 was manufactured as in Example 1-1 to check the TFT characteristics of each sample manufactured in (1), and the TFT characteristics and the stress resistance were evaluated. A plurality of samples were prepared while the added amount of oxygen during formation of the oxide semiconductor thin film was varied as in (1), and after the passivation film was formed, heat treatment was performed as final annealing for 30 min at 250° C. in nitrogen atmosphere.

Figure 39C:
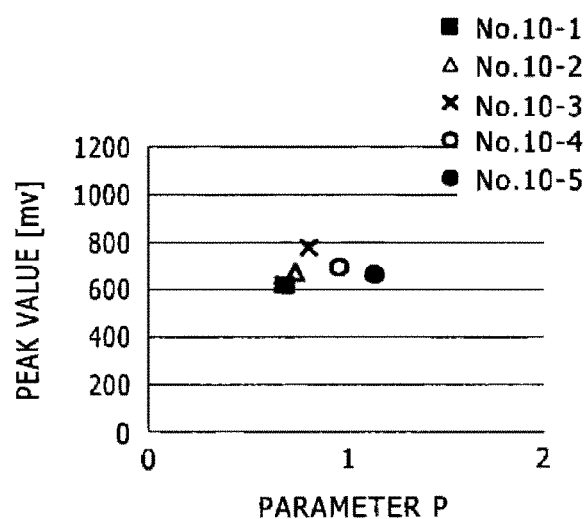
FIG. 39C is a graph, in which TFT characteristics of samples in Example 1-10 are plotted.

The samples were subjected to a stress application test as in Example 1-1 to investigate negative-bias stress resistance. Table 6 shows results of such investigation. In FIG. 39C, a relationship between the parameter Q and the parameter P measured by the μ-PCD method was plotted for the samples provided to the stress application test with the parameter Q corresponding to the maximum of reflectance of the reflectance measuring step as ordinate and the parameter P corresponding to slow decay of the parameter calculation step as abscissa.

TABLE 6

| No. | Oxygen concentration | Stress application test |
| --- | --- | --- |
| 10-1 | 0% | 3.0 V |
| 10-2 | 4% | 2.5 V |
| 10-3 | 8% | 2.5 V |
| 10-4 | 12% | 3.0 V |
| 10-5 | 20% | 3.5 V |

As illustrated in FIG. 39C, Nos. 10-2 and 10-3 each show a good negative-bias stress resistance. FIGS. 39B and 39C reveal that as deviation of ΔP4 (PX1−PX4) is smaller, better negative-bias stress resistance is shown, and thus ΔP correlates with quality of the oxide semiconductor thin film. Hence, ΔP4 (PX1−PX4) of the oxide semiconductor thin film is evaluated, thereby even if a TFT sample with the oxide semiconductor thin film is not actually prepared, quality of the oxide semiconductor thin film can be evaluated. In this Example, quality of the oxide semiconductor thin film is evaluated from the difference ΔP4 (PX1−PX4) between the parameter PX1 and the parameter PX4. As a result, when the added amount of oxygen is adjusted to 4% or 8%, the value of ΔP is small, and the oxide semiconductor thin film of PA maintains the good quality of the oxide semiconductor thin film as assumed in PRE.

Example 1-11

(1) Preparation of Sample for Measurement of Lifetime Value

A gate insulating film was formed on a glass substrate as in Example 1-10.
Oxide Semiconductor Thin Film Formation Step: ASDEPO Subsequently, an oxide semiconductor thin film was formed by a sputtering process at the same condition as in the sample of (1) of Example 1-1 except that the added amount of oxygen and a composition of a sputtering target were each modified.

Sputtering target: "KOS-B02" from Kobelco Research Institute Inc.

Added amount of oxygen: $O_2/(Ar+O_2)$=0%, 3.8%, 7.7%, 10.0%, 11.5% 15.4%, 19.2% (volume ratio)
Pre-Annealing Step: PRE Pre-annealing was performed at the same condition as in Example 1-10.
Etch Stop Layer Formation Step: ESL Subsequently, an etch stop layer was formed on the oxide semiconductor thin film at the same condition as that for the evaluation element 2 in Example 1-3.
Passivation Film Formation Step: PV Furthermore, a passivation film including a stacked film of a first layer $SiO_2$ and a second layer SiN was formed at the same condition as that for the evaluation element 3 in Example 1-3.
Post-Annealing Step: PA After the passivation film was formed, heat treatment was performed as final annealing for 30 min at 250° C. in nitrogen atmosphere.

The B value was defined as the parameter P corresponding to the slow decay of the parameter calculation step as in Example 1-10 for each of the samples after the steps ASDEPO, PRE, ESL, PV, and PA. ASDEPO as parameter PX0, PRE as parameter PX1, ESL as parameter PX2, PV as parameter PX3, and PA as parameter PX4 were represented as parameters of the respective steps. The parameter PX1 was set as a reference value, and a difference between the parameter PX1 and each of the parameters PX2 to PX4 (PX1−(PXn: n=2, 3, 4) was plotted as ΔPn (n=2, 3, 4) in FIG. 40.

Figure 40:
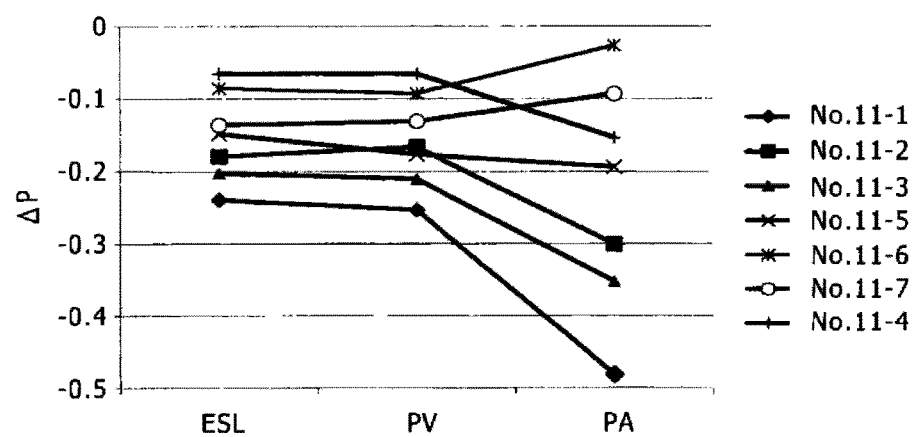
FIG. 40 is a graph, in which parameters corresponding to slow decays in various steps in Example 1-11 are plotted.

Quality of the oxide semiconductor thin film was evaluated from the difference ΔP4 (PX1−PX4) between the parameter PX1 and the parameter PX4. FIG. 40 shows that deviation of the parameter P4 is smaller in order of the added amount of oxygen of 15.4%, 19.2%, 10%, and 11.5%, and each of such samples has a value of ΔP of 0.2 or less. On the other hand, Nos. 11-1 to 11-3 having the added amount of oxygen of 3.8%, 7.7%, and 0%, respectively, each have ΔP of more than 0.2, i.e., each have a large deviation of the parameter P4.

(2) Preparation of TFT Sample for Measuring TFT Characteristics and Stress Resistance TFT as illustrated in FIG. 4 was manufactured as in Example 1-10, and was subjected to a stress application test as in the sample of (2) of Example 1-1 to investigate negative-bias stress resistance. A manufacturing condition such as the added amount of oxygen was modified as in (1). Table 7 shows results of such investigation.

TABLE 7

| No. | Oxygen concentration | Stress application test |
| --- | --- | --- |
| 11-1 | 0% | 12.5 V |
| 11-2 | 3.8% | 6.5 V |
| 11-3 | 7.7% | 3.25 V |
| 11-4 | 10.0% | 2.75 V |
| 11-5 | 11.5% | 2.75 V |
| 11-6 | 15.4% | 0.75 V |
| 11-7 | 19.2% | 1.25 V |

As shown in Table 7, Nos. 11-4 to 11-7 each have a negative-bias stress resistance of 3 V or less, i.e., each show a good negative-bias stress resistance. On the other hand, Nos. 11-1 to 11-3 each have a negative-bias stress resistance of more than 3 V, i.e., each show a poor negative-bias stress resistance. FIG. 40 shows that each of Nos. 11-4 to 11-7 having a ΔP4 (PX1−PX4) of less than 0.2 has a good negative-bias stress resistance. Such results reveal that ΔP correlates with quality of the oxide semiconductor thin film. In particular, as ΔP is smaller, better negative-bias stress resistance is given, and the electronic state optimized by pre-annealing is maintained even after the TFT manufacturing process is finished. Hence, quality of the oxide semiconductor thin film can be evaluated by evaluating ΔP regardless of a composition of the oxide semiconductor thin film.

Figure 41:
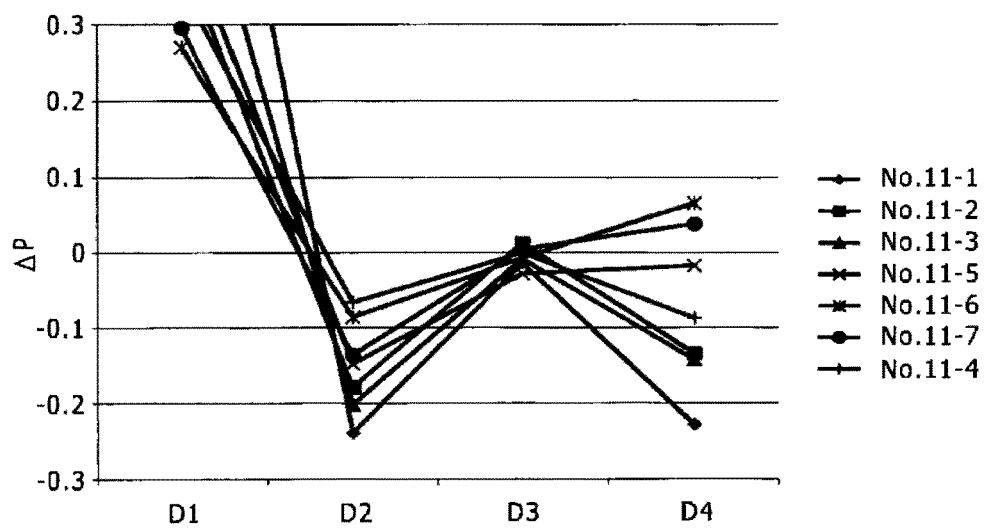
FIG. 41 is a graph, in which differences ΔP between the parameters corresponding to the slow decays in the steps in Example 1-11 are plotted.

For the parameters of Example 1-11, parameters PXn (n=0 to 4) of two successive steps were compared to each other to calculate ΔPn (n=0 to 4), and the values of ΔPn were plotted in FIG. 41.

To compare with the negative-bias stress resistance measured in Example 1-11, when the parameters P are compared between appropriate steps, each of Nos. 11-4 to 11-7, in which deviation of ΔP4 of POST is finally within a range of 0±0.1, has a good negative-bias stress resistance. As ΔP between steps is smaller, a better negative-bias stress resistance is given, showing that the electronic state optimized by pre-annealing is maintained.

Example 1-12

In this Example, quality of the oxide semiconductor thin film was evaluated based on the parameter Q corresponding to the maximum of the reflected wave of the reflectance measuring step, the maximum being measured by the µ-PCD method, and on the parameter P corresponding to slow decay of the parameter calculation step.

(1) Preparation of Sample for Measurement of Lifetime Value

A gate insulating film was formed on a glass substrate as in Example 1-10.

Oxide Semiconductor Thin Film Formation Step: ASDEPO

Subsequently, an oxide semiconductor thin film was formed by a sputtering process at the same condition as in the sample of (1) of Example 1-1 except that the added amount of oxygen and a composition of a sputtering target were each modified.

Sputtering target: "KOS-B02" from Kobelco Research Institute Inc.

Added amount of oxygen: $O_2/(Ar+O_2)$=0%, 5%, 10%, 20% (volume ratio)

Pre-Annealing Step: PRE

Pre-annealing was performed on the samples prepared with the various added amounts of oxygen at the same condition as in Example 1-10 except that a temperature condition is modified as follows. For example, six samples having an added amount of oxygen of 0% were prepared, and were subjected to pre-annealing at different temperatures. No pre-annealing temperature refers to a case where the pre-annealing is not performed.

Pre-annealing temperature: none, 250° C., 300° C., 350° C., 400° C., and 450° C.

Etch Stop Layer Formation Step: ESL

Subsequently, an etch stop layer was formed on the oxide semiconductor thin film at the same condition as that for the evaluation element 2 in Example 1-3.

Passivation Film Formation Step: PV

Furthermore, a passivation film including a stacked film of a first layer $SiO_2$ and a second layer SiN was formed at the same condition as that for the evaluation element 3 in Example 1-3. The first layer may be represented as PV1, and the second layer may be represented as PV2.

Post-Annealing Step: PA

After the passivation film was formed, heat treatment was performed as final annealing for 30 min at 250° C. in nitrogen atmosphere The µ-PCD method was performed as in Example 1-1 for the respective samples after the steps PRE, ESL, PV1, PV2, and PA. The results were analyzed, and the parameter Q, which corresponds to the maximum of the reflected wave from a portion irradiated with a microwave, was calculated, the maximum being varied by excitation light irradiation. The B value was calculated as in Example 1-10, and was defined as the parameter P corresponding to the slow decay of the parameter calculation step. Parameters of the samples corresponding to the respective steps are as follows.

(A) PRE=parameter QX1, parameter PX1
(B) ESL=parameter QX2, parameter PX2
(C) PV1=parameter QX3, parameter PX3
(D) PV2=parameter QX4, parameter PX4
(E) PA=parameter QX5, parameter PX5

FIGS. 42A to 42E or FIGS. 43A to 43E are graphs corresponding to the steps of PRE, ESL, PV1, PV2, and PA, respectively. In Table 8 or FIGS. 42A to 42E, parameters are plotted for each pre-annealing temperature. In Table 9 or FIGS. 43A to 43E, parameters for the same sample are plotted for each added-amount of oxygen. In the graph, ordinate shows the parameter Q (mV) corresponding to the maximum of the reflected wave, and abscissa shows the parameter P corresponding to the slow decay.

Quality of the oxide semiconductor thin film was evaluated from a difference ΔQ between parameters of two successive step and a difference ΔP between the parameters P.

TABLE 8

| | | No. | | | | | | | | | | |
|---|---|---|---|---|---|---|---|---|---|---|---|---|
| | | 13-1 | | 13-2 | | 13-3 | | 13-4 | | 13-5 | | 13-6 |
| | | Pre-annealing temperature | | | | | | | | | | |
| | Added amount | Not performed | | 250° C. | | 300° C. | | 350° C. | | 400° C. | | 450° C. |
| | of oxygen | P | Q | P | Q | P | Q | P | Q | P | Q | P | Q |
| PRE | 0% | — | — | 0.6 | 193.2 | 0.6 | 693.9 | 0.8 | 793.8 | 1.0 | 793.1 | 1.2 | 813.8 |
| (PX1, QX1) | 5% | — | — | 0.6 | 549.3 | 0.7 | 572.0 | 0.8 | 706.1 | 0.8 | 803.1 | 1.0 | 866.8 |
| | 10% | — | — | 0.6 | 574.5 | 0.7 | 591.9 | 0.8 | 729.1 | 0.9 | 842.8 | 1.0 | 884.0 |
| | 20% | — | — | 0.7 | 475.5 | 0.7 | 570.9 | 0.8 | 667.2 | 0.8 | 784.2 | 1.0 | 851.1 |
| ESL | 0% | 0.3 | 24.2 | 0.6 | 195.0 | 0.6 | 708.8 | 1.1 | 779.7 | 1.0 | 790.8 | 0.9 | 834.9 |
| (PX2, QX2) | 5% | 1.0 | 529.1 | 1.4 | 519.8 | 1.0 | 560.9 | 2.4 | 637.1 | 2.0 | 773.3 | 1.0 | 867.4 |
| | 10% | 10.3 | 474.3 | 0.9 | 565.5 | 1.0 | 569.1 | 1.0 | 769.6 | 1.8 | 805.9 | 0.9 | 845.2 |
| | 20% | 3.9 | 105.1 | 3.1 | 388.5 | 0.8 | 560.4 | 1.1 | 669.9 | 1.0 | 779.8 | 0.9 | 860.9 |
| PV1 | 0% | 0.2 | 28.8 | 0.6 | 308.6 | 0.8 | 810.0 | 0.9 | 800.3 | 0.9 | 872.0 | 0.8 | 885.7 |
| (PX3, QX3) | 5% | 1.1 | 594.2 | 0.9 | 568.7 | 0.8 | 616.0 | 1.0 | 754.1 | 1.0 | 879.3 | 0.8 | 941.6 |
| | 10% | 5.4 | 502.9 | 0.7 | 625.2 | 0.8 | 669.0 | 0.9 | 788.3 | 1.0 | 867.2 | 0.8 | 944.2 |
| | 20% | 0.7 | 116.5 | 1.8 | 480.9 | 0.7 | 629.1 | 0.9 | 670.6 | 0.9 | 872.3 | 0.8 | 960.2 |
| PV2 | 0% | 0.2 | 31.4 | 0.6 | 315.0 | 0.8 | 823.1 | 0.8 | 918.3 | 0.9 | 921.2 | 0.8 | 923.2 |
| (PX4, QX4) | 5% | 1.0 | 633.7 | 0.8 | 619.6 | 0.8 | 632.7 | 1.0 | 835.9 | 1.0 | 969.7 | 0.8 | 1062.2 |
| | 10% | 3.5 | 539.8 | 0.7 | 623.2 | 0.7 | 663.5 | 0.8 | 857.9 | 1.0 | 975.9 | 0.8 | 1017.7 |
| | 20% | 1.9 | 144.5 | 1.5 | 494.4 | 0.7 | 664.3 | 0.8 | 810.2 | 0.8 | 949.4 | 0.8 | 1032.8 |
| PA | 0% | 0.3 | 36.4 | 0.6 | 360.8 | 1.3 | 737.8 | 0.9 | 974.2 | 1.0 | 958.4 | 0.8 | 967.0 |
| (PX5, QX5) | 5% | 1.5 | 608.9 | 1.5 | 595.8 | 1.5 | 603.3 | 1.5 | 827.7 | 1.3 | 1032.0 | 0.9 | 1082.4 |
| | 10% | 8.1 | 569.8 | 1.3 | 597.0 | 1.4 | 665.6 | 1.3 | 875.4 | 1.2 | 1014.4 | 0.8 | 1115.9 |
| | 20% | −0.5 | 187.3 | 6.8 | 492.6 | 1.3 | 621.5 | 1.5 | 807.0 | 1.2 | 953.2 | 0.8 | 1037.4 |

TABLE 9

| | | No. | | | | | | | |
|---|---|---|---|---|---|---|---|---|---|
| | | 14-1 | | 14-2 | | 14-3 | | 14-4 | |
| | | Added amount of oxygen | | | | | | | |
| | Pre-annealing | 0% | | 5% | | 10% | | 20% | |
| | temperature | P | Q | P | Q | P | Q | P | Q |
| PRE (PX1, QX1) | Not performed | 0 | — | 0 | — | 0 | — | 0 | — |
| | 250° C. | 0.6 | 193.2 | 0.6 | 549.3 | 0.6 | 574.5 | 0.7 | 475.5 |
| | 300° C. | 0.6 | 693.9 | 0.7 | 572.0 | 0.7 | 591.9 | 0.7 | 570.9 |
| | 350° C. | 0.8 | 793.8 | 0.8 | 706.1 | 0.8 | 729.1 | 0.8 | 667.2 |
| | 400° C. | 1.0 | 793.1 | 0.8 | 803.1 | 0.9 | 842.8 | 0.8 | 784.2 |
| | 450° C. | 1.2 | 813.8 | 1.0 | 866.8 | 1.0 | 884.0 | 1.0 | 851.1 |
| ESL (PX2, QX2) | Not performed | 0.3 | 24.2 | 1.0 | 529.1 | 10.3 | 474.3 | 3.9 | 105.1 |
| | 250° C. | 0.6 | 195.0 | 1.4 | 519.8 | 0.9 | 565.5 | 3.1 | 388.5 |
| | 300° C. | 0.6 | 708.8 | 1.0 | 560.9 | 1.0 | 569.1 | 0.8 | 560.4 |
| | 350° C. | 1.1 | 779.7 | 2.4 | 637.1 | 1.0 | 769.6 | 1.1 | 669.9 |
| | 400° C. | 1.0 | 790.8 | 2.0 | 773.3 | 1.8 | 805.9 | 1.0 | 779.8 |
| | 450° C. | 0.9 | 834.9 | 1.0 | 867.4 | 0.9 | 845.2 | 0.9 | 860.9 |
| PV1 (PX3, QX3) | Not performed | 0.2 | 28.8 | 1.1 | 594.2 | 5.4 | 502.9 | 0.7 | 116.5 |
| | 250° C. | 0.6 | 308.6 | 0.9 | 568.7 | 0.7 | 625.2 | 1.8 | 480.9 |
| | 300° C. | 0.8 | 810.0 | 0.8 | 616.0 | 0.8 | 669.0 | 0.7 | 629.1 |
| | 350° C. | 0.9 | 800.3 | 1.0 | 754.1 | 0.9 | 788.3 | 0.9 | 670.6 |
| | 400° C. | 0.9 | 872.0 | 1.0 | 879.3 | 1.0 | 867.2 | 0.9 | 872.3 |
| | 450° C. | 0.8 | 885.7 | 0.8 | 941.6 | 0.8 | 944.2 | 0.8 | 960.2 |
| PV2 (PX4, QX4) | Not performed | 0.2 | 31.4 | 1.0 | 633.7 | 3.5 | 539.8 | 1.9 | 144.5 |
| | 250° C. | 0.6 | 315.0 | 0.8 | 619.6 | 0.7 | 623.2 | 1.5 | 494.4 |
| | 300° C. | 0.8 | 823.1 | 0.8 | 632.7 | 0.7 | 663.5 | 0.7 | 664.3 |
| | 350° C. | 0.8 | 918.3 | 1.0 | 835.9 | 0.8 | 857.9 | 0.8 | 810.2 |
| | 400° C. | 0.9 | 921.2 | 1.0 | 969.7 | 1.0 | 975.9 | 0.8 | 949.4 |
| | 450° C. | 0.8 | 923.2 | 0.8 | 1062.2 | 0.8 | 1017.7 | 0.8 | 1032.8 |
| PA (PX5, QX5) | Not performed | 0.3 | 36.4 | 1.5 | 608.9 | 8.1 | 569.8 | −0.5 | 187.3 |
| | 250° C. | 0.6 | 360.8 | 1.5 | 595.8 | 1.3 | 597.0 | 6.8 | 492.6 |
| | 300° C. | 1.3 | 737.8 | 1.5 | 603.3 | 1.4 | 665.6 | 1.3 | 621.5 |
| | 350° C. | 0.9 | 974.2 | 1.5 | 827.7 | 1.3 | 875.4 | 1.5 | 807.0 |
| | 400° C. | 1.0 | 958.4 | 1.3 | 1032.0 | 1.2 | 1014.4 | 1.2 | 953.2 |
| | 450° C. | 0.8 | 967.0 | 0.9 | 1082.4 | 0.8 | 1115.9 | 0.8 | 1037.4 |

FIGS. 42A to 42E, Table 8, FIGS. 43A to 43E, and Table 9 reveal the following.

Comparison between PRE and ESL

Figure 42A:
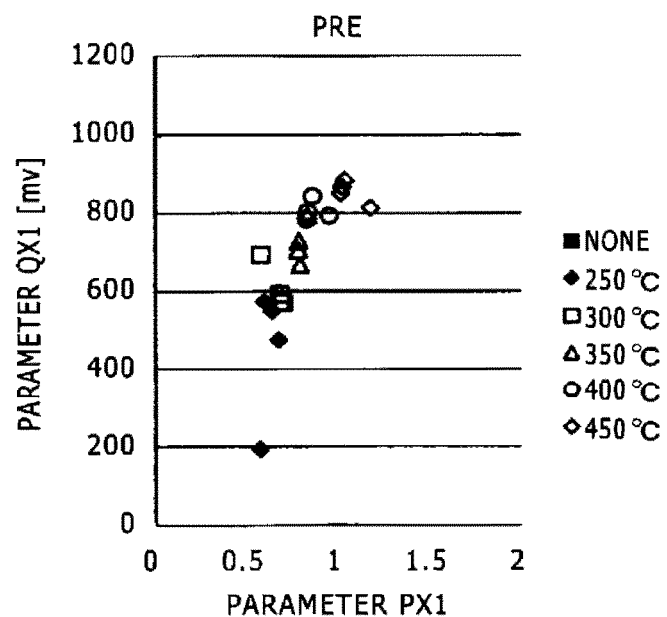
FIG. 42A is a graph, in which parameters after pre-annealing in Example 1-12 are plotted.
Figure 42B:
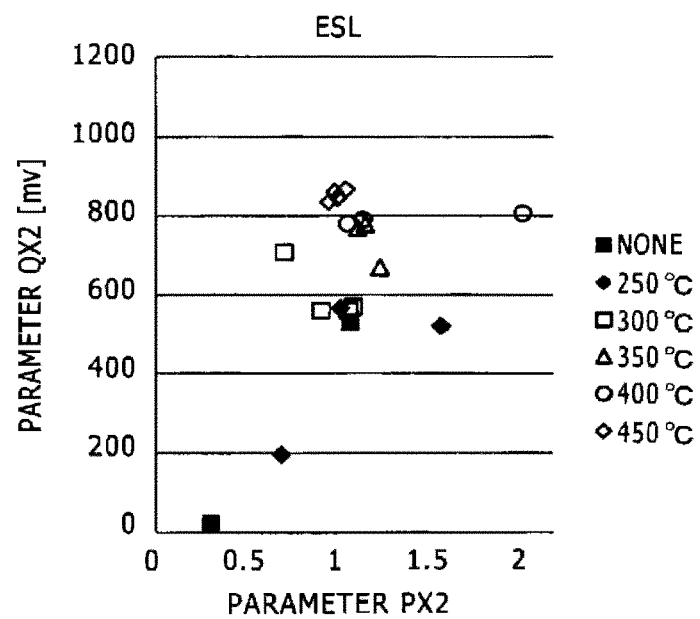
FIG. 42B is a graph, in which parameters after forming an etch stop layer in Example 1-12 are plotted.
Figure 43A:
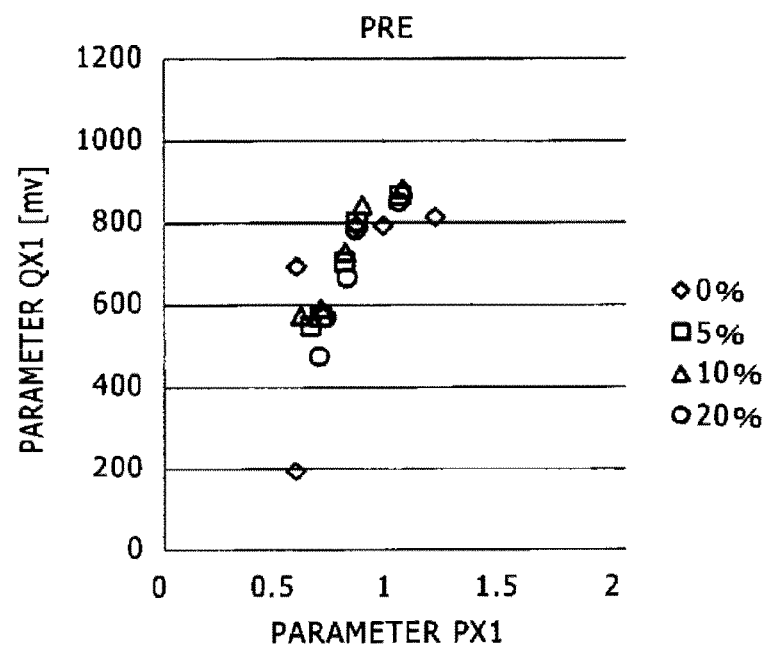
FIG. 43A is a graph, in which parameters after pre-annealing in Example 1-12 are plotted.
Figure 43B:
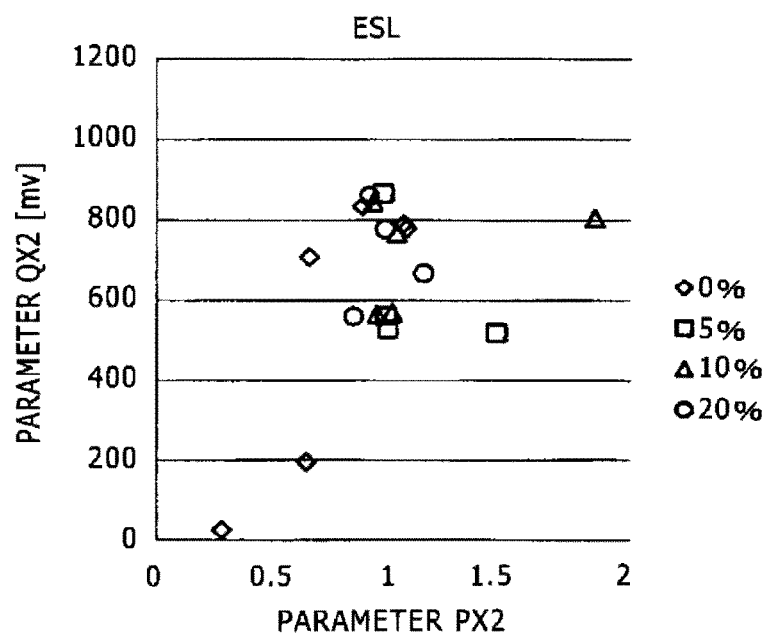
FIG. 43B is a graph, in which parameters after forming an etch stop layer in Example 1-12 are plotted.

A variation in parameter Q tends to increase as the pre-annealing temperature is lower as shown in FIGS. 42A and 42B, or as the added amount of oxygen is smaller as shown in FIGS. 43A and 43B.

Comparison between ESL and PV1

Figure 42C:
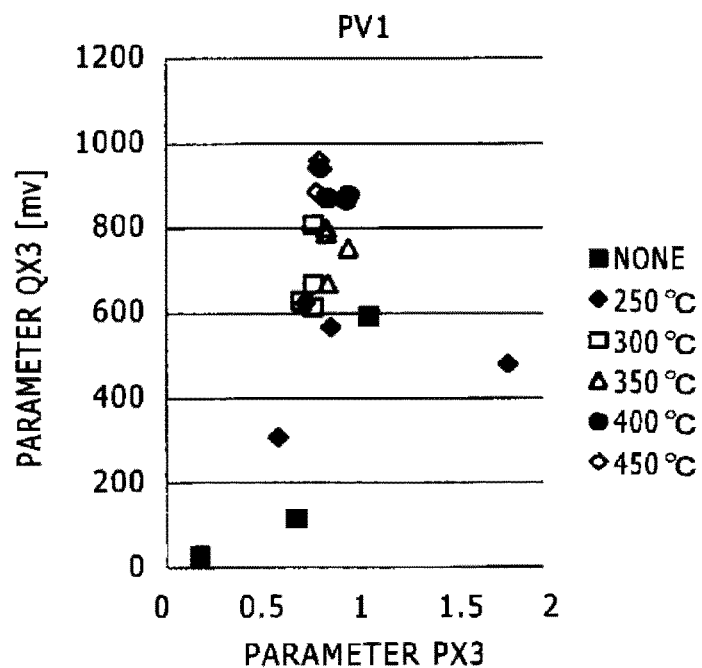
FIG. 42C is a graph, in which parameters after forming a first protective film in Example 1-12 are plotted.
Figure 43C:
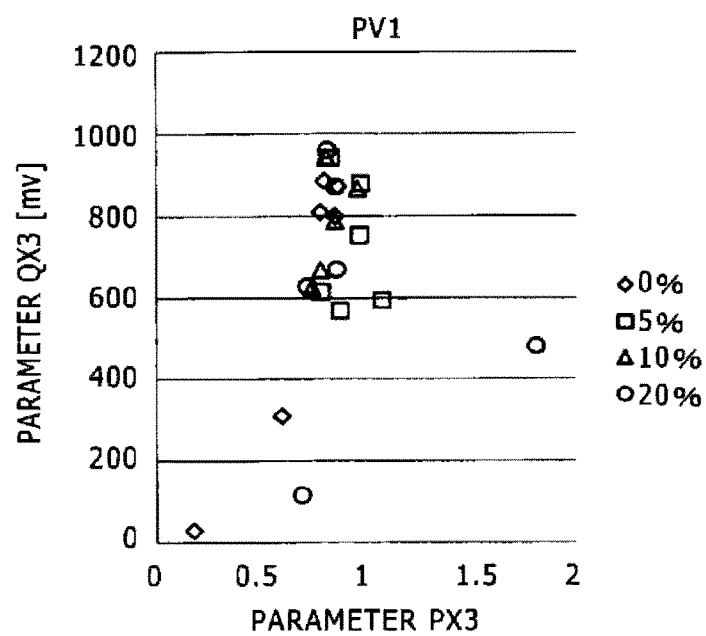
FIG. 43C is a graph, in which parameters after forming a first protective film in Example 1-12 are plotted.

FIGS. 42B and 42C show that when the pre-annealing temperature is 300° C. or higher, the parameter P tends to be concentrated into a range from 0.7 to 1.0. FIGS. 43B and 43C show that when the added amount of oxygen is 5% or 10%, the parameter P also tends to be concentrated.

Comparison between PV1 and PV2

Figure 42D:
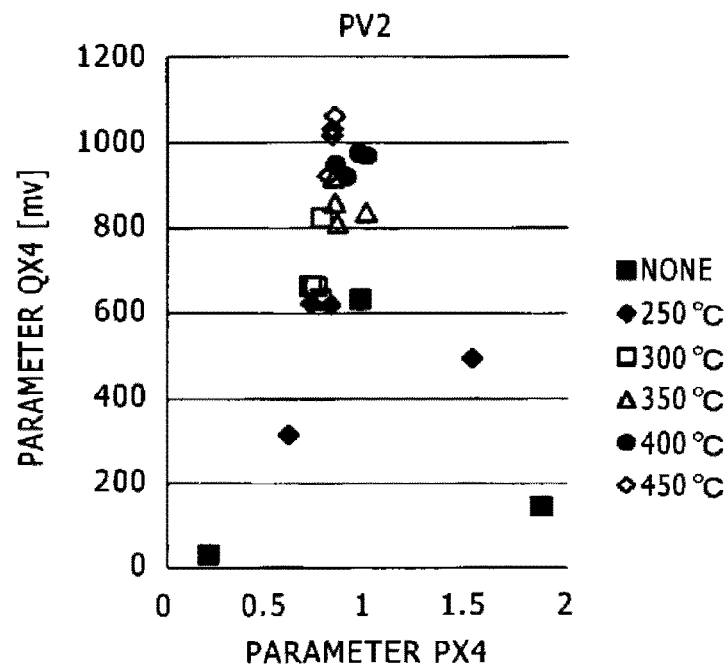
FIG. 42D is a graph, in which parameters after forming a second protective film in Example 1-12 are plotted.
Figure 43D:
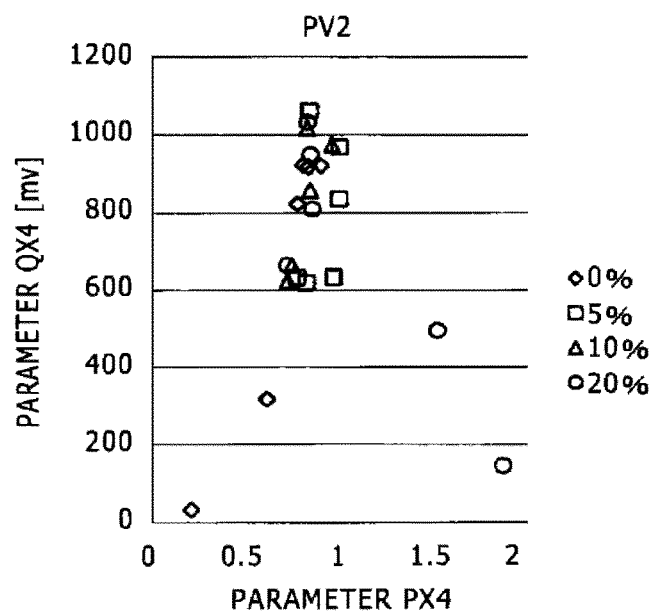
FIG. 43D is a graph, in which parameters after forming a second protective film in Example 1-12 are plotted.

FIGS. 42C and 42D show that although the parameter P substantially does not vary, the parameter Q tends to slightly increase. FIGS. 43C and 43D also show that the parameter Q tends to increase.

Comparison between PV2 and PA

Figure 42E:
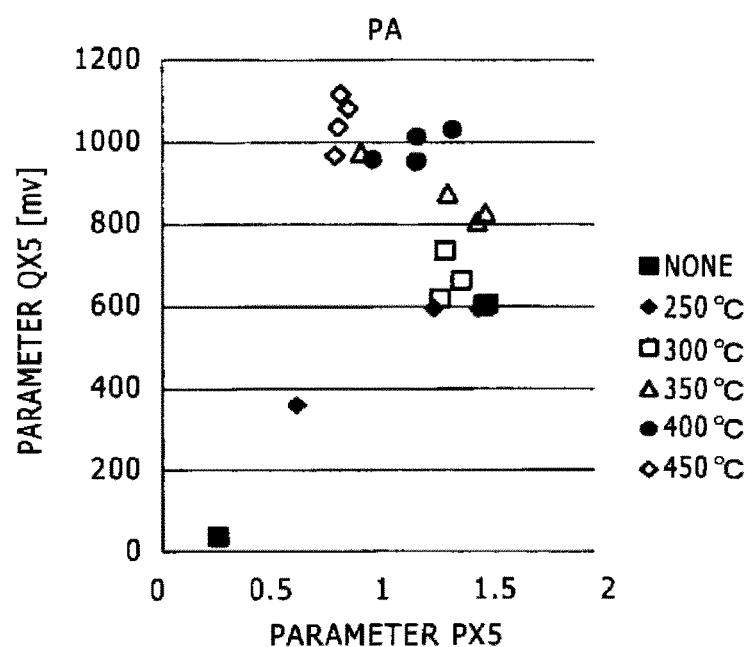
FIG. 42E is a graph, in which parameters after post-annealing in Example 1-12 are plotted.
Figure 43E:
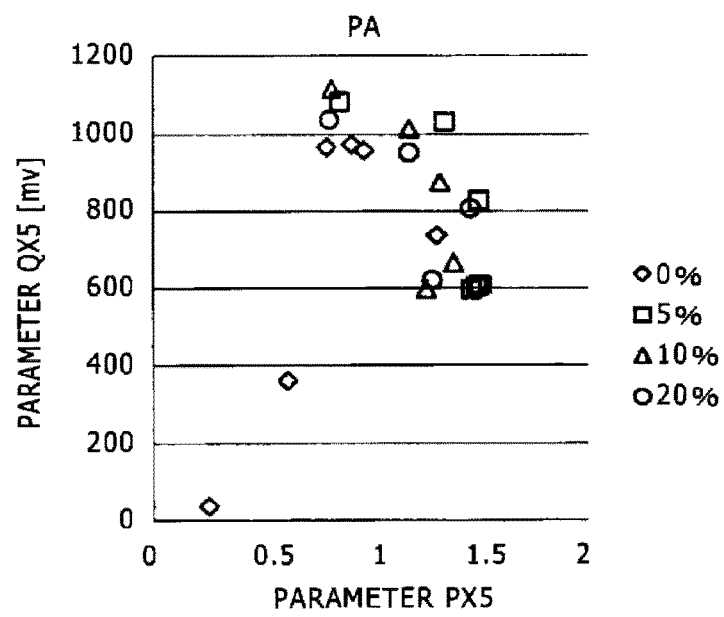
FIG. 43E is a graph, in which parameters after post-annealing in Example 1-12 are plotted.

FIGS. 42D and 42E show that although the parameter P varies at a pre-annealing temperature of 300° C. or higher, the parameter P or the parameter Q tends to be concentrated to substantially one parameter P or one parameter Q regardless of the added amount of oxygen. FIGS. 43D and 43E show that the parameter Q generally tends to increase, and as oxygen concentration is higher, or as the pre-annealing temperature is lower, the parameter P tends to vary more significantly.

Using a graph makes it possible to measure the parameter P and the parameter Q of each step and trace a variation in value of each step, and visually grasp a variation in quality of the oxide semiconductor thin film for each step. In addition, a variation between steps is analyzed as ΔQ and ΔP, thereby influence of the in-film defect or influence of distribution of in-film hydrogen can be grasped. Compared with a case of evaluation only with ΔP, therefore, evaluation with ΔQ and ΔP together makes it possible to more minutely evaluate quality of the oxide semiconductor thin film, and adjust a manufacturing condition to reduce influence on the oxide semiconductor thin film during a manufacturing process. Hence, good quality control of the oxide semiconductor thin film can be accurately performed.

Example 2-1

In this Example, the following experiment was conducted to evaluate a correlation between a parameter and a sheet resistance value of each of oxide semiconductor thin films, InGaZnO or IGZO herein, the parameter being calculated based on the μ-PCD method.

(1) Sample Preparation

IGZO was deposited as an oxide semiconductor thin film on a glass substrate as in the sample of (1) of Example 1-1 except that the added amount of oxygen and thickness of the oxide semiconductor thin film are each modified.

Thickness of oxide semiconductor thin film: 200 nm

Added amount of oxygen: $O_2/(Ar+O_2)$=0%, 4%, 8%, 12%, 16%, 20% in volume ratio Subsequently, various samples were prepared while a pre-annealing condition, specifically pre-annealing time, was varied to improve quality of the oxide semiconductor thin film, i.e., to improve TFT characteristics such as mobility, switching performance, and stability of characteristics during operation. Specifically, the pre-annealing condition was fixed except for pre-annealing time, i.e., fixed to a pre-annealing temperature of 350° C. in the atmosphere, and pre-annealing time was varied: 0 min, 5 min, 30 min, 60 min, and 120 min, so that various samples were produced. The 0 min represents a case where pre-annealing is not performed.

The samples produced in this way were subjected to the μ-PCD method as in Example 1-1, and change in reflectance was measured.

The samples were separately subjected to measurement of sheet resistance using Hiresta from Mitsubishi Chemical Analytech Co., Ltd. The sheet resistance was measured to evaluate a correlation between the electrical resistivity evaluated by the μ-PCD method and actually measured values of the sheet resistance.

FIG. 28 shows results of the measurement based on the μ-PCD method. In the drawing, ordinate represents sheet resistance, and abscissa represents a parameter calculated based on a relationship between reflectance and measurement time obtained by the μ-PCD method, i.e., a parameter corresponding to "slow decay" defined in the invention. In detail, the parameter is "B" value in Formula (7) representing the relationship between reflectance and measurement time, and the B value corresponds to a slope. In this Example, a slope (−B) within the above-described measurement time span was calculated with measurement time x of 0.5 to 2.5 μs.

Numerical Formula 7

$$y = Ax^{-B} \quad (x\text{:measurement time}, y\text{:reflectance}) \quad (7)$$

FIG. 28 reveals that the sheet resistance correlates with the B value. In detail, as the sheet resistance increases from $10^2$ to $10^7$, the B value as an absolute value also increases. For the sheet resistance of more than $10^7$, however, the B value decreases with a further increase in the sheet resistance. FIG. 28 further reveals that the B value is affected by the added amount of oxygen during sputtering and by the pre-annealing time.

Through the basic experiment, the inventors have found that when the B value is maximized, good TFT characteristics are given. Hence, when conditions such as the added amount of oxygen during sputtering and the pre-annealing time are each properly adjusted such that the B value is maximized, good TFT characteristics are expected to be exhibited.

Example 2-2

In this Example, the following experiment was conducted to evaluate a correlation between a parameter of IGZO as an oxide semiconductor thin film, the parameter being calculated based on the μ-PCD method, and a specific resistance value.

(1) Sample Preparation

IGZO as the oxide semiconductor thin film was deposited by a sputtering process as in Example 1-1 except that "SMD-450" from ULVAC, Inc. was used as a sputtering apparatus.

Subsequently, samples were heat-treated in the atmosphere for a pre-annealing time of 60 min at a pre-annealing temperature of 350° C. Each of the samples produced in this way was subjected to determination of "parameter corresponding to slow decay observed after irradiation of excitation light" of the μ-PCD method at appropriate measurement points on the substrate, specifically 21 measurement points in total disposed at equal intervals. The measurement condition of the μ-PCD method was the same as that in Example 1-1, and the B value was used as the parameter. In this Example, however, the slope, i.e., the B value was determined while the measurement time x in Formula (5) is varied as follows: 0.5 to 1.5 μs, 0.5 to 1 μs, 1 to 1.5 μs, and 1.5 to 2 μs.

Such samples were separately subjected to measurement of specific resistance using Hiresta from Mitsubishi Chemical Analytech Co., Ltd. The specific resistance was measured to evaluate a correlation between the electrical resistivity evaluated by the μ-PCD method and actually measured values of the specific resistance.

Figure 29A:
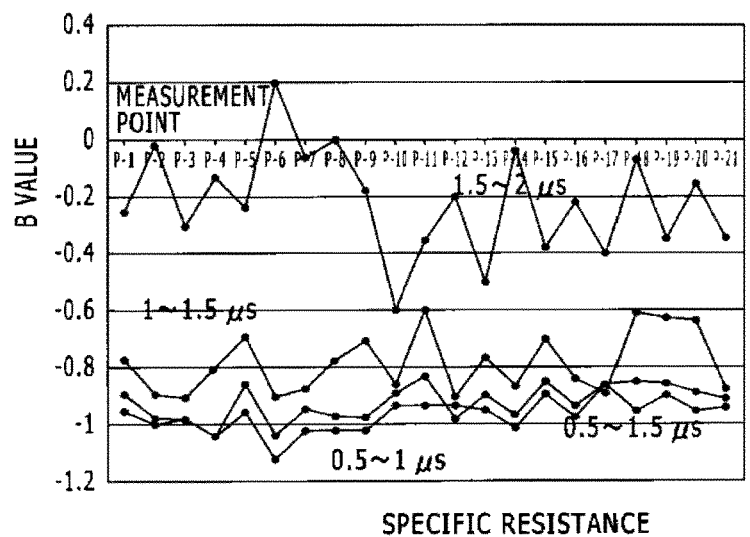
FIG. 29A is a graph illustrating results in Example 2-2, showing a relationship between specific resistance at each measurement point on a substrate and a B value in Formula (5).

FIG. 29A shows results of the measurement. In the drawing, abscissa represents specific resistance at each measurement point, and ordinate represents the B value at each measurement point.

As shown in FIG. 29A, while a variation in the B value with respect to the specific resistance at each measurement point is small for the measurement time x=0.5 to 1 μs or 0.5 to 1.5 μs, the variation is significant for the measurement time x=1 to 1.5 μs, and more significant for the measurement time x=1.5 to 2 μs.

Figure 29B:
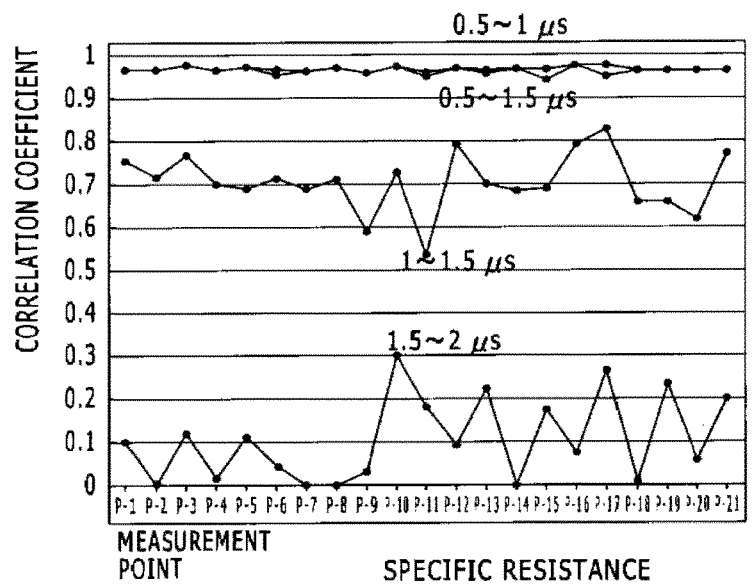
FIG. 29B is a graph illustrating results in Example 2-2, showing a relationship between specific resistance at each measurement point on the substrate and a correlation coefficient.

Furthermore, a correlation coefficient between Formula (5) and a measured decay waveform of the reflectance of the microwave was obtained as a virtual function for calculation of the B value obtained in the above. As a value of the correlation coefficient is closer to 1, a correlation between Formula (5) and a measured value of the decay waveform is stronger, specifically fitting is more accurate. In other words, the calculated B value is more appropriate as a characterization parameter of the oxide semiconductor thin film. On the other hand, as the value is closer to zero (0), the correlation between Formula (5) and the measured value of the decay waveform is weaker, specifically fitting is less accurate. In other words, the calculated B value is improper as a characterization parameter of the oxide semiconductor thin film. FIG. 29B shows a relationship of the correlation coefficient (ordinate) to specific resistance (abscissa) at each measurement point.

As shown in FIG. 29B, while the correlation coefficient at each measurement point is roughly 1 for the measurement time x=0.5 to 1 μs or 0.5 to 1.5 μs, the correlation coefficient decreases to the neighborhood of about 0.5 to 0.8 for the measurement time x=1 to 1.5 μs, and further decreases to roughly 0 for the measurement time x=1.5 to 2 μs. This means that the correlation deviates from a linear relationship due to noise during the measurement. Such results agree with the results shown in FIG. 29A. Specifically, while the correlation coefficient in FIG. 29B is roughly 1 in the small variation region of x=0.5 to 1.5 μs in FIG. 29A, the correlation coefficient in FIG. 29B is roughly 0 in the large variation region of x=1.5 to 2 μs in FIG. 29A.

These results prove that under the condition of this experiment, if the B value as a slope for the measurement time x=0.5 to 1.5 μs is used as "parameter corresponding to slow decay" defined in the invention, the specific resistance of the oxide semiconductor thin film can be evaluated indirectly and accurately.

In this way, the slow decay calculated based on the μ-PCD method correlates with the sheet resistance or the specific resistance of the oxide semiconductor thin film.

Example 2-3

B-value analysis was performed by a measurement method with the μ-PCD method using an apparatus including the µ-PCD-method evaluator (LTA-1820SP from Kobelco Research Institute, Inc.) incorporating the electrical resistance meter (Hiresta from Mitsubishi Chemical Analytech Co., Ltd.) as with Example 2-2, and the specific resistance was measured by the electrical resistance meter.

Specifically, an apparatus having a configuration illustrated in FIG. 14 was used, and besides a µ-PCD-method evaluator (LTA-1820SP from Kobelco Research Institute, Inc.) configured outside the electrical resistivity measurement means 30 was used to perform the µ-PCD method at the same condition as that in Example 2-2, so that change in reflectance was measured. Subsequently, the specific resistance was measured at the same condition as that in Example 2-2 using the configuration of the electrical resistivity measurement means 30 in FIG. 14, i.e., the electrical resistivity meter (Hiresta from Mitsubishi Chemical Analytech Co., Ltd.) including the electrical resistivity measuring head 31 provided with the up-and-down means 32 for vertically moving the measuring head. For measuring the specific resistance, the electrical resistivity measuring head 31 was lowered by the up-and-down means 32 so as to be brought into contact with the oxide semiconductor thin film 20b to measure the specific resistance, and then the electrical resistivity measuring head 31 was raised by the up-and-down means 32 so as to be separated from the oxide semiconductor thin film 20b for sample change. As a result, the correlation was found as with Example 2-2. In particular, the correlation was able to be more accurately evaluated in the case of using the apparatus of Example 3 than in the case of separately measuring the specific resistance as in Example 2-2. Although the B value is shown such that the absolute value of the B value is maximized at the best point as shown in FIG. 28, a resistance higher or lower than the resistance at that point may not be determined only by the B value. In such a case, change in reflectance is measured by the microwave decay method at the same point on the sample, and resistance is measured using the electrical resistivity meter, and results of such two types of measurement are compared to each other, thereby the absolute value can be more accurately evaluated.

Example 3-1

In this Example, characteristics caused by stress after positive-bias application were evaluated by directly measuring electrical resistivity of the oxide semiconductor thin film.

Specifically, a stacked structure sample for measurement of electrical resistivity was prepared as in (1) below, and TFT for measurement of TFT characteristics was manufactured as in (2) below. The stacked structure sample of (1) has the same sectional structure as that of the TFT of (2) in that a gate insulating film, an oxide semiconductor thin film, and a protective film are provided on a substrate.

(1) Preparation of Sample for Measurement of Electrical Resistivity

A gate insulating film $SiO_2$ 200 nm thick was formed on the same glass substrate as that of Example 1-2 as in Example 1-10.

Subsequently, IGZO 40 nm in thickness was deposited as the oxide semiconductor thin film by a sputtering process as in Example 1-5.

The oxide semiconductor thin film was formed in the above manner, and was then patterned by photolithography and wet etching. "ITO-07N" from Kanto Chemical Co., Ltd was used as the etchant solution.

The oxide semiconductor thin film was patterned in this way, and was then subjected to pre-annealing. The pre-annealing was performed for 60 min at 350° C. under atmospheric pressure in 100% oxygen atmosphere. Subsequently, an etch stop layer for protecting the oxide semiconductor thin film was formed. The protective film was formed through deposition of $SiO_2$ 100 nm thick by a plasma CVD process. The gas used for the deposition was a mixed gas of $SiH_4/N_2O$, and a flow rate (sccm/sccm) of the mixed gas was varied in a range including 2/50, 4/100, 6/150, 8/200, and 10/250. Deposition temperature was 230° C.

Subsequently, ohmic electrodes were formed. Specifically, pure Mo was deposited (100 nm in thickness) by a DC sputtering process, and was then patterned.

Finally, a stacked film of $SiO_2$ 200 nm thick and SiN 200 nm thick was formed as a protective film for blocking the external atmosphere. Such $SiO_2$ and SiN were each deposited in the same condition as that of the sample of (2) of Example 1-1.

Subsequently, a connection contact hole for measuring electrical resistance was formed in the protective film by photolithography and dry etching, and thus electrical resistivity measuring samples were produced.

The samples were subjected to measurement of sheet resistance by applying a voltage between the electrodes. Specifically, a semiconductor parameter analyzer "4156C" from National Instruments Corporation was used to measure current-voltage characteristics.

(2) Preparation of Sample for TFT Measurement

A Mo thin film 100 nm thick as a gate electrode was formed on a glass substrate as in the sample of (2) of Example 1-1.

A gate insulating film of $SiO_2$ 200 nm in thickness and an oxide semiconductor thin film 40 nm in thickness were sequentially formed on the gate electrode produced in this way as in (1) and were patterned, and then subjected to pre-annealing. Subsequently, a protective film for protecting the oxide semiconductor thin film was formed. A stacked film of $SiO_2$ 200 nm thick and SiN 200 nm thick was used as the protective film. A Mo thin film was formed for source and drain electrodes in place of forming the ohmic electrodes described in (1). The formation method and the patterning method of the pure Mo film were the same as those for the gate electrode. Channel length and channel width of the TFT were adjusted to 10 µm and 200 µm, respectively.

The source and drain electrodes were thus formed, and then the protective film for protecting the oxide semiconductor thin film was formed as in (1), and the contact hole was formed to produce TFT measurement samples.

The TFTs were thus produced, and were subjected to investigation of TFT characteristics in the following manner. Specifically, (I) transistor characteristics, in detail (i) an absolute value of a threshold voltage and (ii) an initial repetition characteristic were investigated. In addition, (II) a variation $\Delta V_{th}$ in threshold voltage Vth was investigated when a stress application test applying a positive bias was performed.

(I) Measurement of Transistor Characteristics

The transistor characteristics were measured with a semiconductor parameter analyzer "4156C" from National Instruments Corporation. Detailed measurement conditions were as follows.

Source voltage: 0.1 V
Drain voltage: 10 V
Gate voltage: −30 to 30 V (measurement interval: 0.25 V)

From results of the measurement, (i) an absolute value of a threshold voltage in a static characteristic was determined. In addition, (ii) the initial repetition characteristic was evaluated in such a manner that (I) transistor characteristics evaluation tests were performed three times, and a difference between an absolute value of the threshold voltage in the first test and an absolute value of the threshold voltage in the third test, i.e., a threshold shift amount in repetitive sweep was calculated.

(II) $\Delta V_{th}$ at Application of a Positive Bias was Evaluated as Stress Resistance.

In this Example, a stress application test was performed while a positive bias is applied to the gate electrode to simulate stress environment during actual panel drive. A stress application condition was as follows.

Figure 30:
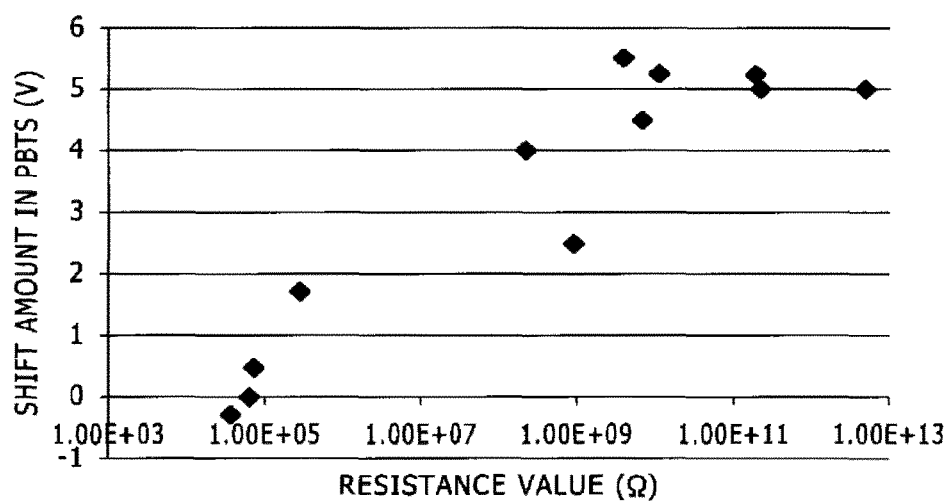
FIG. 30 is a graph illustrating a relationship between $\Delta V_{th}$ and electrical resistance in Example 3-1.

Gate voltage: +20 V
Substrate temperature: 60° C.
Stress application time: Two hours FIG. 30 illustrates a relationship between $\Delta V_{th}$ (ordinate) and electrical resistance between the electrodes (abscissa) in the positive bias stress application test. FIG. 30 reveals that behaviors of $\Delta V_{th}$ and electrical resistivity are substantially equivalent to each other.

Figure 31:
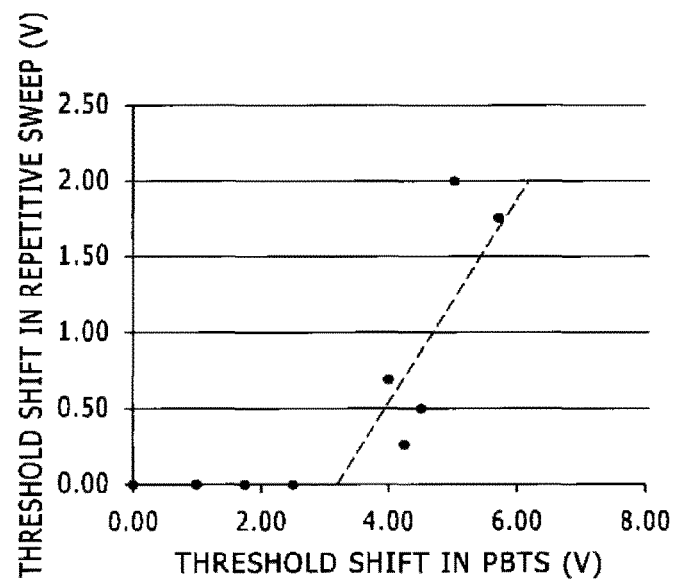
FIG. 31 is a graph illustrating a relationship between $\Delta V_{th}$ and a threshold shift amount in repetitive sweep in Example 3-1.
Figure 32:
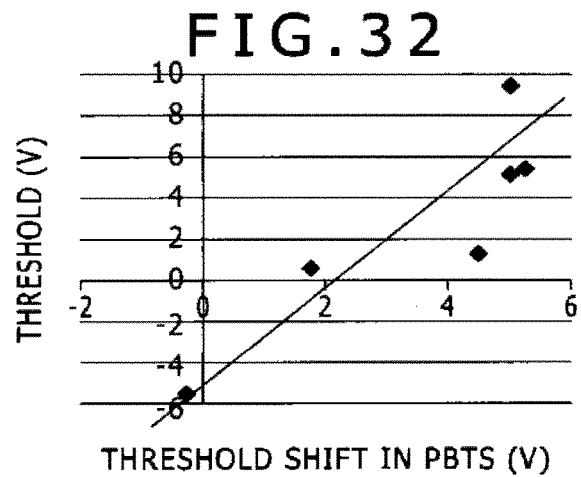
FIG. 32 is a graph illustrating a relationship between $\Delta V_{th}$ and an absolute value of a threshold voltage in a static characteristic in Example 3-1.

FIG. 31 illustrates a relationship between the threshold shift amount in repetitive sweep (ordinate) and $\Delta V_{th}$ measured by the method of (ii) (abscissa). FIG. 32 illustrates a relationship between the absolute value of the threshold voltage in the static characteristic (ordinate) and $\Delta V_{th}$ (abscissa). From such drawings, $\Delta V_{th}$, the absolute value of the threshold voltage in the static characteristic, and the threshold shift amount in repetitive sweep have a good correlation with one another.

The results of FIGS. 30 to 32 prove that use of the evaluation method based on electrical resistivity of the invention allows the above-described items caused by stress of positive-bias application to be indirectly and accurately evaluated.

Example 3-2

In this Example, characteristics caused by stress after positive-bias application were evaluated by indirectly measuring electrical resistivity of the oxide semiconductor thin film by the μ-PCD method.

Specifically, various characteristics were evaluated using the TFTs manufactured in Example 3-1. Table 10 shows results of the evaluation. TFTs 1 to 5 were produced by forming ESLs while a flow rate (sccm/sccm) of $SiH_4/N_2O$ was varied in a range including 2/50, 4/100, 6/150, 8/200, and 10/250, and $\Delta V_{th}$ of each TFT after the lapse of time of two hours is as follows.

TFT-1: 5V
TFT-2: 5.25 V
TFT-3: 4.5 V
TFT-4: 1.75 V
TFT-5: −0.25 V

TABLE 10

| Sample No | $SiH_4/N_2O$ flow rate (sccm) | Deposition rate (nm/min) | Mobility ($cm^2/Vs$) | Subthreshold swing (V/dec) | $V_{th}$ (V) |
| --- | --- | --- | --- | --- | --- |
| TFT-1 | 2/50 | 10.3 | 7.2 | 0.27 | 9.25 |
| TFT-2 | 4/100 | 27.4 | 8.5 | 0.48 | 5.00 |
| TFT-3 | 6/150 | 41.8 | 7.8 | 0.34 | 1.25 |
| TFT-4 | 8/200 | 56.8 | 6.2 | 0.19 | 0.50 |
| TFT-5 | 10/250 | 70.0 | 12.3 | 0.28 | −5.50 |

Furthermore, the TFTs were used to measure "parameter corresponding to slow decay observed after irradiation of excitation light" in the μ-PCD method. Specifically, an apparatus having a configuration as shown in FIGS. 1 and 13 of PTL 1 as described before, specifically LTA-1820SP from Kobelco Research Institute, Inc., was used to perform the μ-PCD method at the same condition as in Example 1-1, and change in reflectance was measured.

In this Example, a slope obtained when a relationship between reflectance and measurement time is represented by Formula (7) was calculated as the B value to calculate a parameter that is calculated based on the relationship between reflectance and measurement time, the relationship being obtained by the μ-PCD method, i.e., to calculate "parameter corresponding to slow decay" defined in the invention. Here, measurement time x=0.3 to 1.0 μs was assumed, and a slope (−B) in such a measurement time span was calculated.

Figure 33:
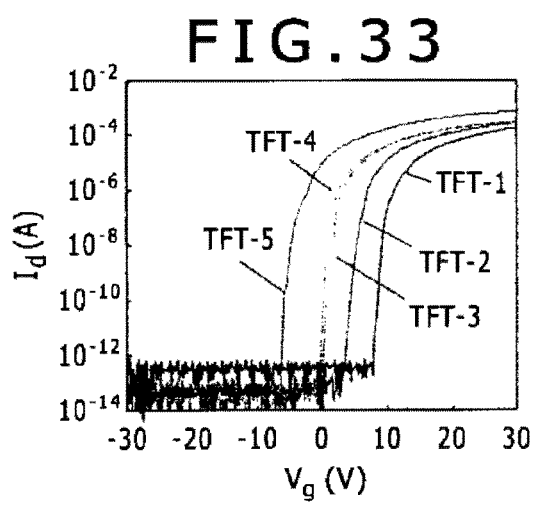
FIG. 33 is a graph illustrating resultant I-V characteristics in Example 3-2.

FIG. 33 illustrates I-V characteristics of the TFTs 1 to 5. FIG. 33 reveals that TFT operation is varied by a flow ratio of $SiH_4/N_2O$.

Figure 34:
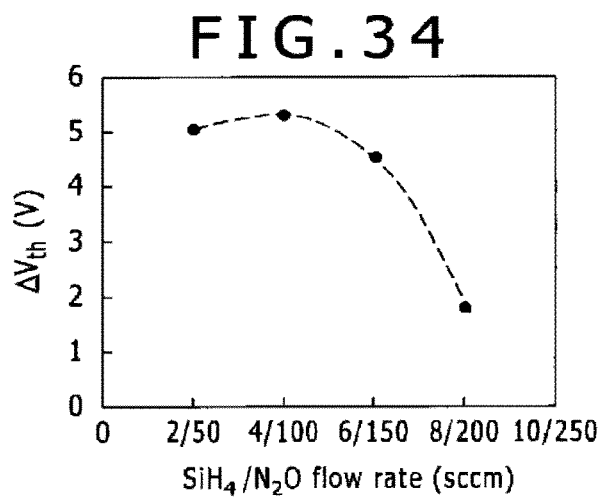
FIG. 34 is a graph illustrating a relationship between a flow ratio of $SiH_4/N_2O$ and $\Delta V_{th}$ in Example 3-2.

FIG. 34 is a graph illustrating a relationship between the flow ratio of $SiH_4/N_2O$ and $\Delta V_{th}$. FIG. 34 reveals that increasing the flow rate of $SiH_4/N_2O$ decreases $\Delta V_{th}$ in the positive-bias stress application test.

Figure 35A:
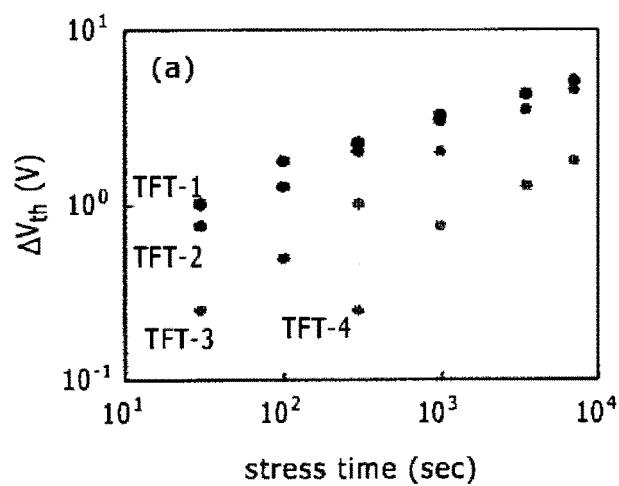
FIG. 35A is a graph illustrating a relationship between stress application time and $\Delta V_{th}$ in Example 3-2.

FIG. 35A is a double logarithmic chart, in which a value of $\Delta V_{th}$ is plotted with respect to stress application time for each TFT. FIG. 35A reveals that each TFT shows good linearity, and $\Delta V_{th}$ has a relationship described by power-law with stress application time.

Based on such results, temporal variation of threshold is fitted in a relationship of $A \times t^n$, and each parameter was plotted with respect to the flow rate of $SiH_4/N_2O$.

Figure 35B:
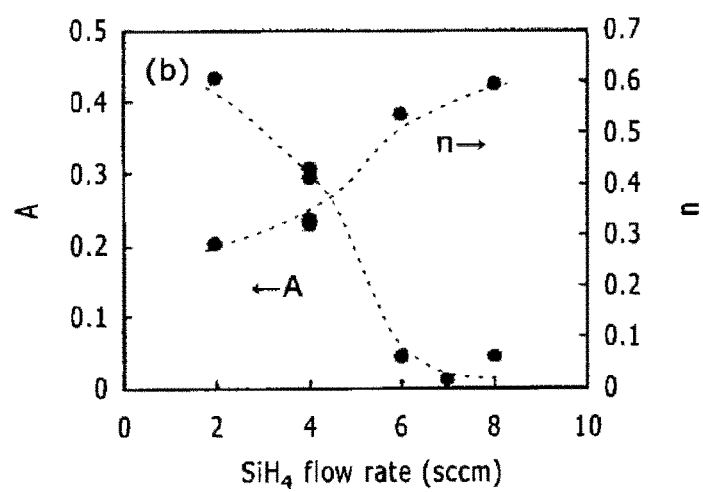
FIG. 35B is a graph illustrating a relationship between flow rate of $SiH_4$ and each of A value and n value defining a slope B in Example 3-2.

FIG. 35B shows results of such plotting. As shown in FIG. 35B, although the above-described A that determines an initial value decreases with an increase in flow rate of $SiH_4$, the value of n is changed from 0.25, i.e., a flow rate of $SiH_4 \approx 2$ sccm/$N_2O$ to 0.5, i.e., a flow rate of $SiH_4 \approx 6$ sccm/$N_2O$. With the behavior where n has a value of around 0.25 in this way, Saito et al. have noted that hydrogen existing in an interface between the oxide semiconductor thin film, IGZO in this Example, and the protective film, ESL in this Example, is released from a bond to the interface and is diffused away from the interface, thereby a trap level in the interface is formed (Paper title: S. Nakano, N. Saito, K. Miura, T. Sakano, T. Ueda, K. Sugi, H. Yamaguchi, I. Amemiya, M. Hiramatsu, A. Ishida, K. Kanamaru, and M. Sawada, IDW' 11, 1271(2011)). The results of FIG. 35B therefore show that interface states between ESL and IGZO decrease by increasing the flow ratio of $SiH_4/N_2O$.

Figure 36:
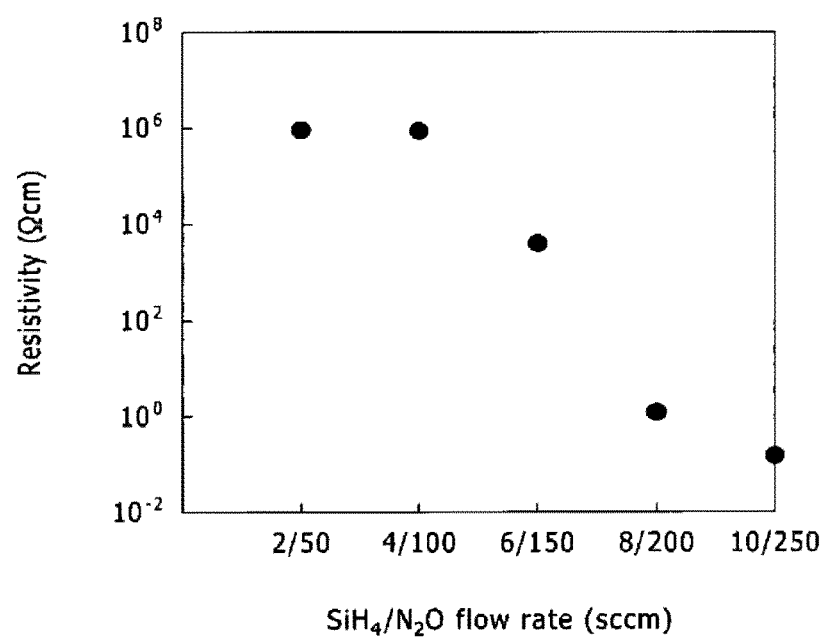
FIG. 36 is a graph illustrating a relationship between a flow ratio of $SiH_4/N_2O$ and sheet resistance in Example 3-2.

FIG. 36 illustrates a relationship between sheet resistance and a flow rate of $SiH_4/N_2O$. FIG. 36 reveals that the sheet resistance decreases with an increase in flow rate of $SiH_4$. Considering this result together with the result of FIG. 37 reveals that $\Delta V_{th}$ correlates with the sheet resistance. From a result of capacitance—voltage (CV) measurement performed using a MOS diode, it has been known that donor density is about $1 \times 10^{18}$ cm$^{-3}$ for each sample. An a-IGZO film under the same condition is estimated to have a specific resistance of 2.7Ω·cm from a Hall effect measurement result of thick IGZO, and thus the above-described sheet resistance is larger than a value expected from such an estimation result. It is therefore strongly suggested that the above-described drastic increase in sheet resistance is caused by band bending due to the increased interface states.

The threshold voltage in the repetitive sweep characteristic or the static characteristic is found to have a good correlation with $\Delta V_{th}$ in the positive-bias stress application test as shown in FIGS. 31 and 32. This result strongly suggests that the threshold voltage in the repetitive sweep characteristic or the static characteristic is caused by the interface states at the interface between ESL and IGZO as with the $\Delta V_{th}$. Although the cause of the increase in the interface states is not clear in detail, plasma damage during ESL formation is estimated to be a cause of formation of the interface states in light of the fact that deposition time for ESL formation is greatly different.

Figure 37:
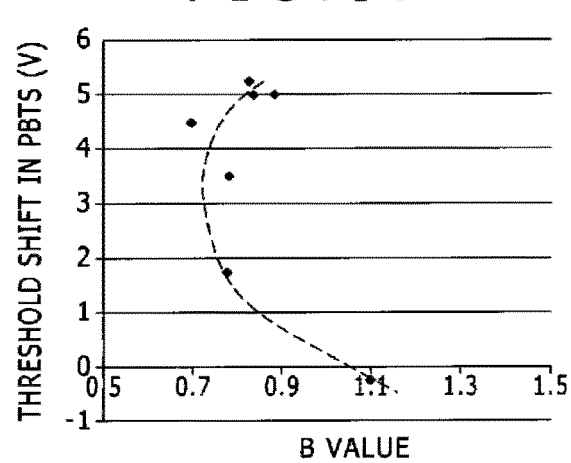
FIG. 37 is a graph illustrating a relationship between $V_{th}$ and the slope B value in Example 3-2.

FIG. 37 illustrates a relationship between $\Delta V_{th}$ obtained by the method of Example 1 (ordinate) and the "B" value obtained by the μ-PCD method (abscissa). FIG. 37 reveals that $\Delta V_{th}$ and the B value draw a U curve, and thus do not correlate with each other. In detail, it is found that when $\Delta V_{th}$ is equal to or smaller than the apex $\Delta V_{th} \approx 3.5$ V of the U curve, the B value as the absolute value becomes larger with smaller $\Delta V_{th}$. FIG. 37 further reveals that the B value is affected by a rate of silane amount during formation of the protective film.

The results of FIGS. 34, 36, and 37 reveal that since the B value is useful as an index of each of sheet resistance and $\Delta V_{th}$, use of the B value resultantly allows the sheet resistance of the oxide semiconductor thin film to be evaluated.

Furthermore, a basic experiment of the inventors teaches that when the B value is maximized, $\Delta V_{th}$ is minimized, and good TFT characteristics are exhibited. Consequently, the formation condition of the protective film is properly adjusted, thereby good TFT characteristics are expected to be exhibited.

LIST OF REFERENCE SIGNS

1 Excitation light irradiation means
3 Microwave irradiation means
4 Directional coupler
4a Phase regulator
5 Magic T
6a First waveguide
6b Second waveguide
6d, 6e Opening
7 Reflected-microwave intensity detection means
8 Signal processor
9 Evaluation means
10 Stage controller
11 X-Y stage
12 Optical-path change means
16a Output adjustment power monitor
16b Output adjustment means
20 Sample
20a Substrate
20b Oxide semiconductor thin film
21 Excitation light irradiation region
30 Electrical resistivity measurement means
31 Electrical resistivity measuring head
32 Up-and-down means
33 Measured-value transmission line
42 Gate electrode
43 Gate insulating film
45 Etch stop layer
46a Source electrode
46b Drain electrode
47 Passivation film
48 Contact hole
49 Evaluation element
50 Display
51 Mother glass

The invention claimed is:

1. A quality evaluation method of a laminate including an oxide semiconductor thin film and a protective film on a surface of the oxide semiconductor thin film, the method comprising:
    a first step of evaluating a failure caused by an in-film defect in the oxide semiconductor thin film by measuring an electronic state of the oxide semiconductor thin film by one of a contact method and a noncontact method after the oxide semiconductor thin film is formed on a substrate; and
    a second step of evaluating a failure caused by an interfacial defect between the oxide semiconductor thin film and the protective film by measuring the electronic state of the oxide semiconductor thin film by one of a contact method and a noncontact method after the protective film is formed on a surface of the oxide semiconductor thin film processed at a condition determined based on the evaluation.

2. The evaluation method according to claim 1, wherein the electronic state of the oxide semiconductor thin film is measured based on electrical resistivity of the oxide semiconductor thin film.

3. The evaluation method according to claim 1, wherein the failure caused by the in-film defect is evaluated in the first step, thereby when a negative bias is applied to a thin film transistor together with light irradiation, a difference in threshold voltage $\Delta V_{th}$ between before and after application of the negative bias is indirectly evaluated.

4. The evaluation method according to claim 1, wherein one of the following (1) to (3) is evaluated by evaluating the failure caused by the interfacial defect in the second step,
    (1) threshold voltage $V_{th}$ of a thin film transistor,
    (2) a difference in threshold voltage $\Delta V_{th}$ between before and after application of a positive bias to the thin film transistor, and
    (3) a difference between a threshold voltage at first measurement and a threshold voltage after multiple times of measurement when the threshold voltage of the thin film transistor is measured multiple times.

5. The evaluation method according to claim 1, wherein when the failure caused by the in-film defect is measured by the contact method in the first step, a first electrode and a second electrode are provided on the surface of the oxide semiconductor thin film, and the failure is evaluated based on one of a measured current value and a measured voltage.

6. The evaluation method according to claim 1, wherein when the failure caused by the interfacial defect is measured by the contact method in the second step, a first electrode and a second electrode are provided so as to be in contact with two sides of the protective film, and the failure is evaluated based on one of a measured current value and a measured voltage.

7. The evaluation method according to claim 2, wherein when the electrical resistivity of the oxide semiconductor thin film is measured by the contact method, a measuring terminal having at least two electrodes is brought into contact with the oxide semiconductor thin film to measure a current value.

8. The evaluation method according to claim 1, wherein when the electronic state of the oxide semiconductor thin film is measured by the noncontact method,
    the electronic state of the oxide semiconductor thin film is measured based on a reflectance measuring step of irradiating the oxide semiconductor thin film with excitation light and a microwave, measuring maximum of a reflected wave of the microwave from a portion subjected to the irradiation, the maximum being varied by irradiation of the excitation light, and then stopping irradiation of the excitation light, and measuring temporal change in reflectance of the reflected wave of the microwave from the portion subjected to the irradiation after stopping the irradiation of the excitation light, and a parameter calculation step of calculating a parameter corresponding to slow decay, the slow decay being observed after stopping the irradiation of the excitation light, from the temporal change in reflectance.

9. The evaluation method according to claim 8, wherein in the parameter calculation step, a parameter corresponding to slow decay observed at 0.1 to 10 µs after stopping the irradiation of the excitation light is calculated from the change in reflectance to evaluate the electronic state of the oxide semiconductor thin film.

10. A quality control method of an oxide semiconductor thin film, wherein a reflectance measurement step of irradiating the oxide semiconductor thin film with excitation light and a microwave, measuring maximum of a reflected wave of the microwave from a portion subjected to the irradiation, the maximum being varied by irradiation of the excitation light, and then stopping the irradiation of the excitation light, and measuring temporal change in reflectance of the reflected wave of the microwave from the portion subjected to the irradiation after stopping the irradiation of the excitation light, and a parameter calculation step of calculating a parameter corresponding to slow decay, the slow decay being observed after stopping the irradiation of the excitation light, from the temporal change in reflectance, are applied to each of two appropriate steps of a manufacturing process of a laminate including an oxide semiconductor thin film and a protective film on a surface of the oxide semiconductor thin film, and wherein the parameters corresponding to slow decay of the parameter calculation step are calculated as a parameter PX1 and a parameter PX2, and an electronic state of the oxide semiconductor thin film is evaluated based on a difference ΔP between the parameters (PX1−PX2, where PX2 is a parameter of a manufacturing step later than PX1).

11. The quality control method according to claim 10, wherein the parameters corresponding to the maximum of the reflected wave of the reflectance measurement step are calculated as a parameter QX1 and a parameter QX2, and the electronic state of the oxide semiconductor thin film is evaluated based on a difference ΔQ between QX1 and QX2 (QX1−QX2) and the difference ΔP between the parameters PX1 and PX2 (PX1−PX2).

12. The quality control method according to claim 11, wherein the parameter corresponding to the maximum of the reflected wave of the reflectance measurement step is represented as parameter Q in ordinate of a graph, and the parameter corresponding to slow decay of the parameter calculation step is represented as parameter P in abscissa of the graph, and the parameters (QX1, PX1) and the parameters (QX2, PX2) are plotted on the graph and thus the electronic state of the oxide semiconductor thin film is evaluated.

13. The quality control method according to claim 10, wherein the oxide semiconductor thin film is provided on a surface of an insulating film.

14. The quality control method according to claim 10, wherein the oxide semiconductor thin film is subjected to a heat treatment.

* * * * *